(12) United States Patent
Iguchi

(10) Patent No.: US 11,563,026 B2
(45) Date of Patent: Jan. 24, 2023

(54) SEMICONDUCTOR STORAGE DEVICE

(71) Applicant: Kioxia Corporation, Tokyo (JP)

(72) Inventor: Tadashi Iguchi, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 136 days.

(21) Appl. No.: 17/010,454

(22) Filed: Sep. 2, 2020

(65) Prior Publication Data

US 2021/0280600 A1    Sep. 9, 2021

(30) Foreign Application Priority Data

Mar. 9, 2020 (JP) .............................. JP2020-039886

(51) Int. Cl.
| | |
|---|---|
| *H01L 27/11582* | (2017.01) |
| *H01L 23/522* | (2006.01) |
| *H01L 27/11556* | (2017.01) |

(52) U.S. Cl.
CPC .... *H01L 27/11582* (2013.01); *H01L 23/5226* (2013.01); *H01L 27/11556* (2013.01)

(58) Field of Classification Search
None
See application file for complete search history.

(56) References Cited

U.S. PATENT DOCUMENTS

| | | | |
|---|---|---|---|
| 9,768,233 B1 | 9/2017 | Fukuda et al. | |
| 2021/0066316 A1* | 3/2021 | Ota | H01L 27/11556 |
| 2021/0167176 A1* | 6/2021 | Inden | H01L 27/11582 |

* cited by examiner

*Primary Examiner* — Hsien Ming Lee
(74) *Attorney, Agent, or Firm* — Foley & Lardner LLP

(57) ABSTRACT

A semiconductor storage device includes: a substrate having a front surface; a plurality of conductive layers arranged in a first direction, the first direction intersecting the front surface of the substrate; a plurality of memory cells connected to the plurality of conductive layers; a contact electrode extending in the first direction and connected to one of the plurality of conductive layers; and an insulating structure extending in the first direction, the insulating structure connected to an end portion of the contact electrode on one side of the contact electrode in the first direction, and penetrating the plurality of conductive layers.

14 Claims, 59 Drawing Sheets

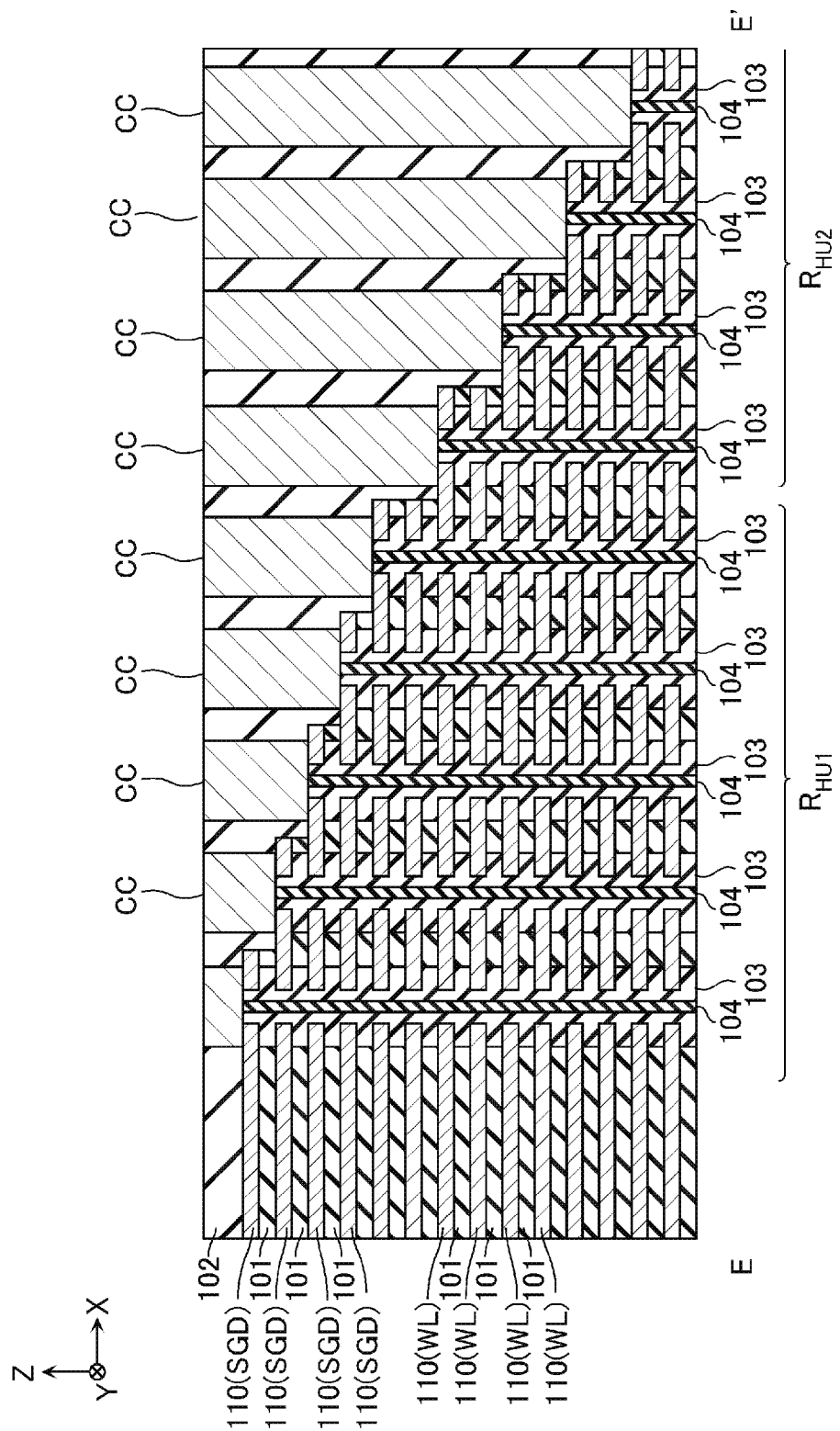

US 11,563,026 B2

SEMICONDUCTOR STORAGE DEVICE

CROSS-REFERENCE TO RELATED APPLICATION

This application is based upon and claims the benefit of priority from Japanese Patent Application No. 2020-039886, filed Mar. 9, 2020, the entire contents of which are incorporated herein by reference.

FIELD

Embodiments described herein relate generally to a semiconductor storage device.

BACKGROUND

A semiconductor storage device is known, including: a substrate; a plurality of conductive layers arranged in a first direction intersecting a front surface of the substrate; a plurality of memory cells connected to the plurality of conductive layers; and a contact electrode extending in the first direction and connected to one of the plurality of conductive layers.

DESCRIPTION OF THE DRAWINGS

FIG. 10C is a schematic cross-sectional view of a structure illustrated in FIG. 8 taken along the line E-E' and viewed in a direction of an arrow according to at least one embodiment.

DETAILED DESCRIPTION

Figure 1:
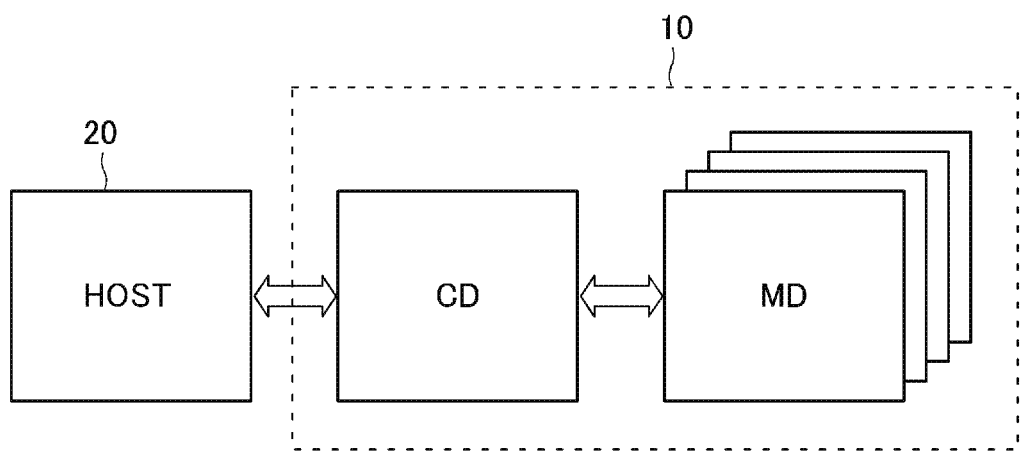
FIG. 1 is a schematic block diagram illustrating a configuration of a memory system 10 according to a first embodiment.

At least one embodiment provides a semiconductor storage device that can be desirably manufactured.

In general, according to at least one embodiment, a semiconductor storage device includes: a substrate having a front surface; a plurality of conductive layers arranged in a first direction, the first direction intersecting the front surface of the substrate; a plurality of memory cells connected to the plurality of conductive layers; a contact electrode extending in the first direction and connected to one of the plurality of conductive layers; and an insulating structure extending in the first direction, the insulating structure connected to an end portion of the contact electrode on one side of the contact electrode in the first direction, the insulating structure connected to the plurality of conductive layers.

Next, a semiconductor storage device according to at least one embodiment will be described in detail with reference to the drawings. The following embodiments are merely examples and are not intended to limit the present disclosure. The following drawings are schematic, and for the convenience of description, a part of the configuration may be omitted. Common portions in a plurality of embodiments will be denoted by the same reference signs, and the description thereof may be omitted.

When a "semiconductor storage device" is described in the specification, the "semiconductor storage device" may indicate a memory die, or may indicate a memory system including a control die such as a memory chip, a memory card, and an SSD. The "semiconductor storage device" may indicate a configuration including a host computer such as a smart phone, a tablet terminal, and a personal computer.

In the specification, when it is described that a first configuration is "electrically connected" to a second configuration, the first configuration may be directly connected to the second configuration, or the first configuration may be connected to the second configuration via a wiring, a semiconductor member, or a transistor. For example, when three transistors are connected in series, a first transistor is "electrically connected" to a third transistor even though a second transistor is an OFF state.

In the specification, when it is described that the first configuration is "connected between" the second configuration and the third configuration, the aforementioned description may indicate that the first configuration, the second configuration, and the third configuration are connected in series, and the first configuration is provided in a current path of the second configuration and the third configuration.

In the specification, when it is described that a circuit "electrically connects" two wirings, the aforementioned description may indicate that, for example, this circuit includes a transistor, and this transistor is provided in a current path between the two wirings, such that the transistor goes into an ON state.

In the specification, a predetermined direction parallel to an upper surface of the substrate is referred to as an X direction, a direction parallel to the upper surface of the substrate and perpendicular to the X direction is referred to a Y direction, and a direction perpendicular to the upper surface of the substrate is referred to as a Z direction.

In the specification, a direction along a predetermined surface may be referred to as a first direction, a direction intersecting the first direction along the predetermined surface may be referred to as a second direction, and a direction intersecting the predetermined surface may be referred to as a third direction. The first direction, the second direction, and the third direction may or may not correspond to any one of the X direction, the Y direction, and the Z direction.

In the specification, descriptions such as "up" and "down" are based upon the substrate. For example, a direction away from the substrate along the Z direction is referred to as "up", and a direction approaching the substrate along the Z direction is referred to as "down". When a lower surface and a lower end are described in a certain configuration, the lower surface and the lower end respectively indicate a surface and an end portion on the substrate side of this configuration, and when an upper surface and an upper end are described, the upper surface and the upper end respectively indicate a surface and an end portion on the side opposite to the substrate of this configuration. A surface intersecting the X direction or the Y direction is referred to as a side surface.

In the specification, when a "width" or a "thickness" in a predetermined direction is described for a configuration and a member, the "width" or the "thickness" may respectively indicate a width or a thickness in a cross section observed by scanning electron microscopy (SEM) and transmission electron microscopy (TEM).

In the specification, when a "radial direction" is described with respect to a cylindrical or annular member or a through via hole, the "radial direction" indicates a direction approaching a central axis or a direction away from the central axis in a plane perpendicular to the central axis of the cylindrical or annular member. When a "thickness in the radial direction" is described, the "thickness in the radial direction" indicates a difference between a distance from the central axis to an inner peripheral surface and a distance from the central axis to an outer peripheral surface in such a plane.

First Embodiment

[Memory System 10]

FIG. 1 is a schematic block diagram illustrating a configuration of a memory system 10 according to a first embodiment.

The memory system 10 reads, writes, and erases user data according to a signal transmitted from a host computer 20. The memory system 10 is, for example, a memory chip, a memory card, an SSD, or any other systems capable of storing the user data. The memory system 10 includes a plurality of memory dies MD for storing the user data; and a control die CD connected to the plurality of memory dies MD and the host computer 20. The control die CD includes, for example, a processor and a RAM, and performs processes such as conversion between a logical address and a physical address, bit error detection and correction, garbage collection (also referred to as compaction), and wear leveling.

Figure 2:
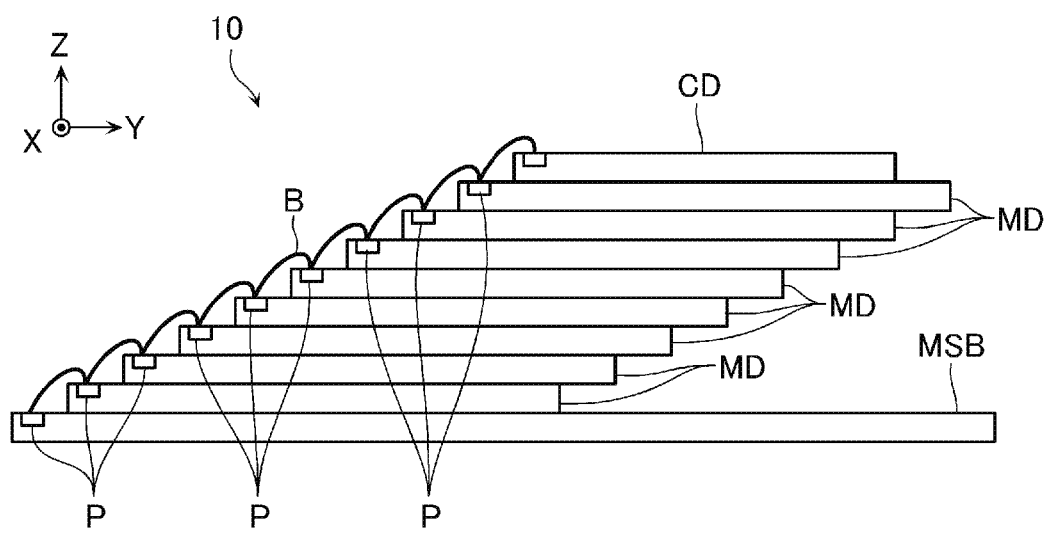
FIG. 2 is a schematic side surface view illustrating a configuration example of the memory system 10 according to at least one embodiment.
Figure 3:
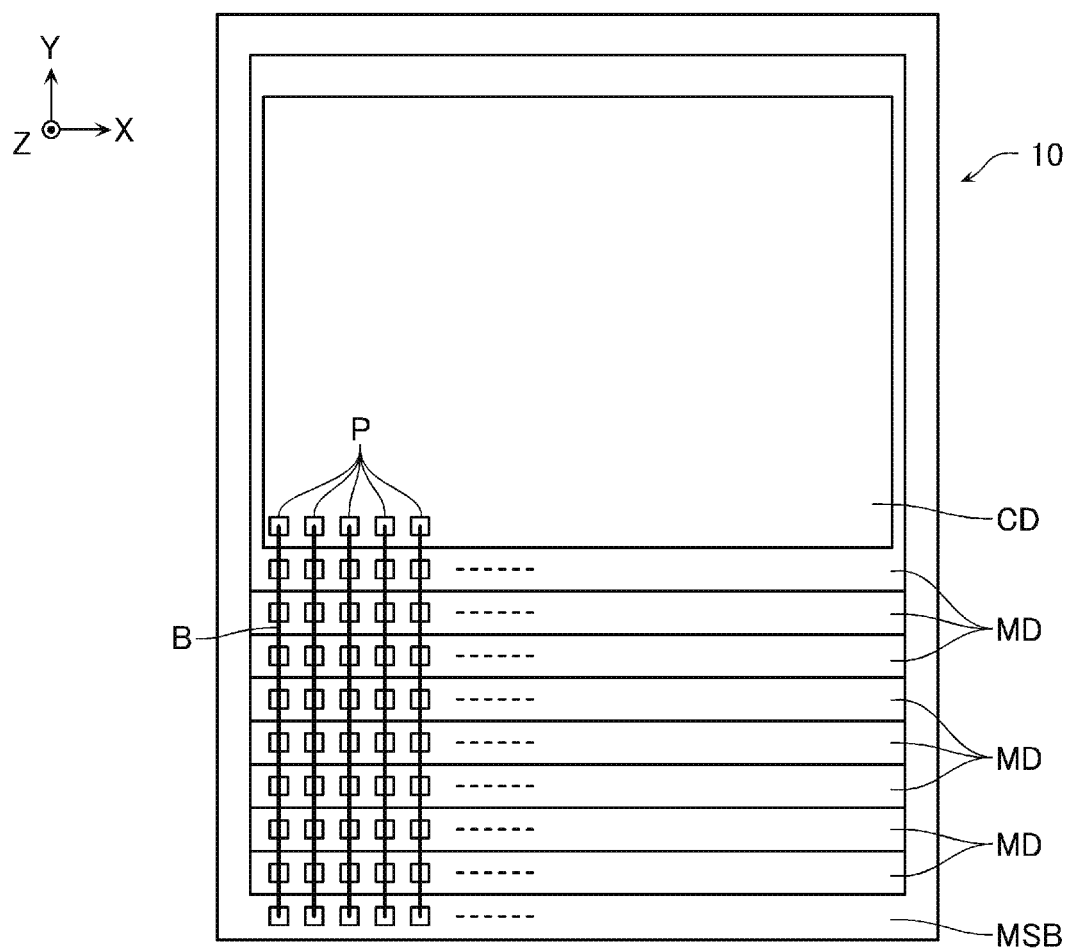
FIG. 3 is a schematic plan view illustrating the configuration example according to at least one embodiment.

FIG. 2 is a schematic side surface view illustrating a configuration example of the memory system 10 according to the embodiment. FIG. 3 is a schematic plan view illustrating the configuration example. For the convenience of description, a part of the configuration will be omitted in FIGS. 2 and 3.

As illustrated in FIG. 2, the memory system 10 according to at least one embodiment includes a mounting substrate MSB; the plurality of memory dies MD stacked on the mounting substrate MSB; and the control die CD stacked on the memory die MD. A pad electrode P is provided in a region of an end portion in the Y direction on an upper surface of the mounting substrate MSB, and another partial region is connected to a lower surface of the memory die MD via an adhesive. The pad electrode P is provided in a region of an end portion in the Y direction on an upper surface of the memory die MD, and another region is connected to a lower surface of another memory die MD or the control die CD via an adhesive. The pad electrode P is provided in a region of an end portion in the Y direction on an upper surface of the control die CD.

As illustrated in FIG. 3, the mounting substrate MSB, the plurality of memory dies MD, and the control die CD respectively include a plurality of pad electrodes P arranged in the X direction. The plurality of pad electrodes P provided on the mounting substrate MSB, the plurality of memory dies MD, and the control die CD are respectively connected to each other via a bonding wire B.

[Circuit Configuration of Memory Die MD]

Figure 4:
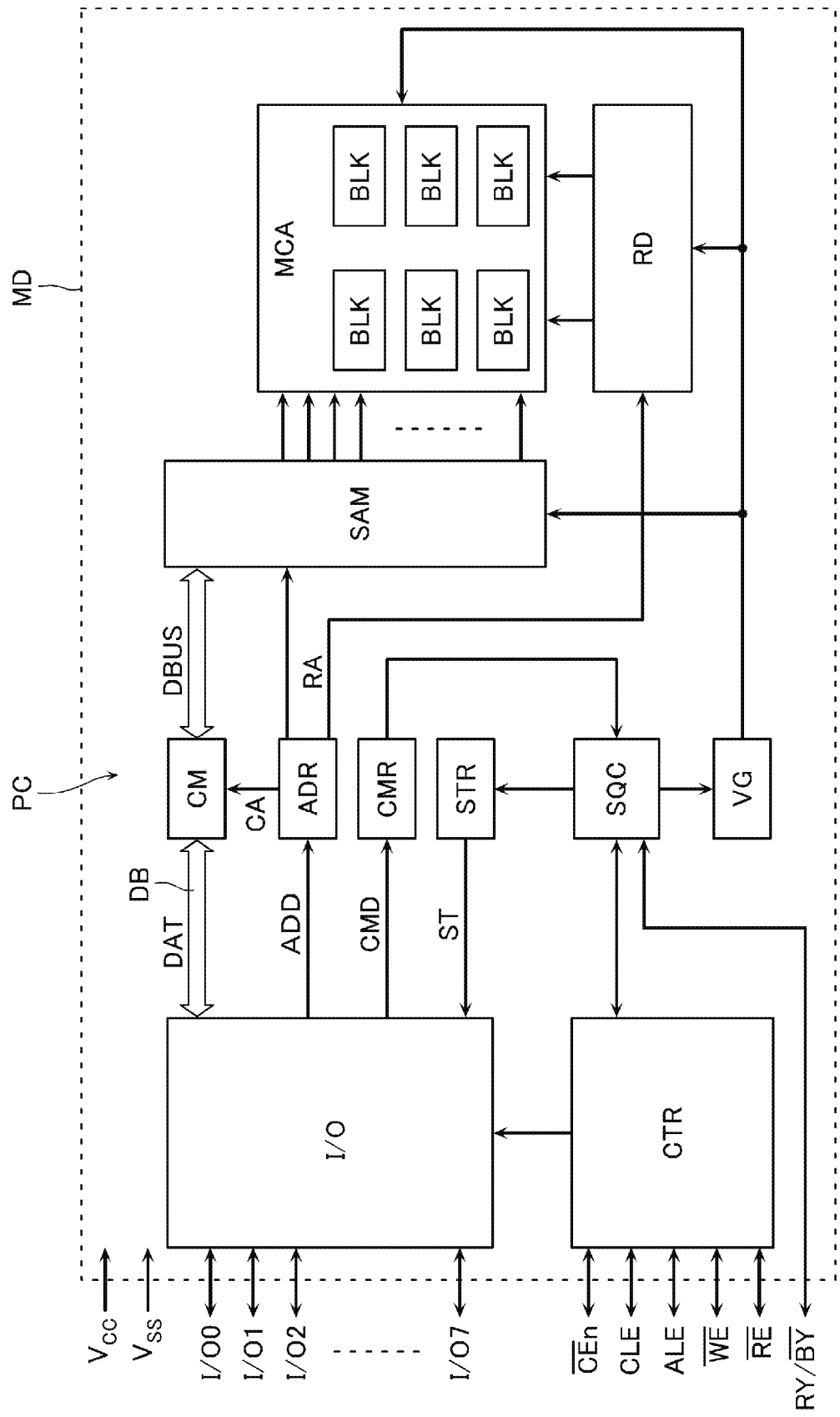
FIG. 4 is a schematic block diagram illustrating a configuration of a memory die MD according to the first embodiment.
Figure 5:
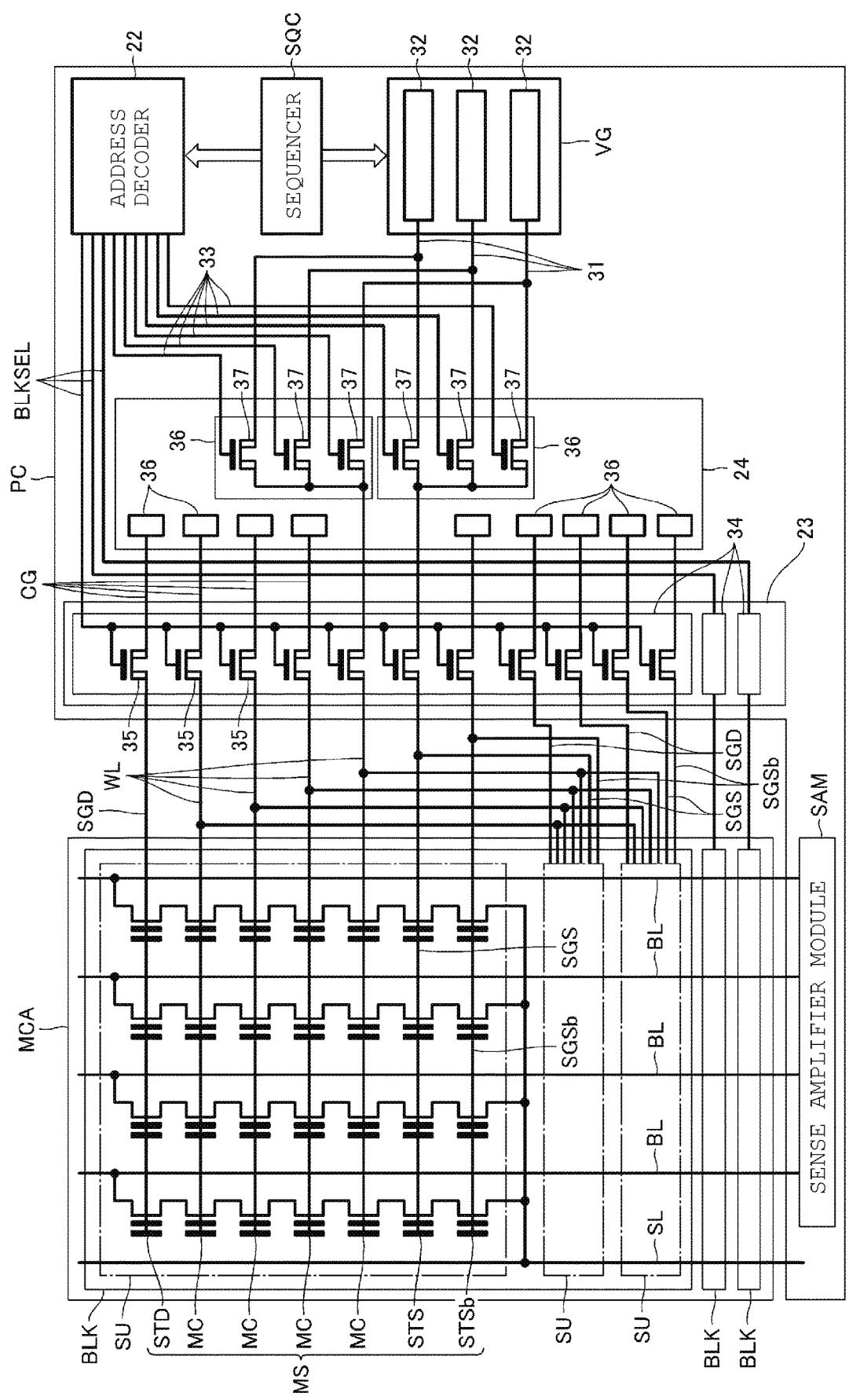
FIG. 5 is a schematic circuit diagram illustrating a configuration of a part of the memory die MD.

FIG. 4 is a schematic block diagram illustrating a configuration of the memory die MD according to the first embodiment. FIG. 5 is a schematic circuit diagram illustrating a configuration of a part of the memory die MD.

As illustrated in FIG. 4, the memory die MD includes a memory cell array MCA for storing data; and a peripheral circuit PC connected to the memory cell array MCA. The peripheral circuit PC includes a voltage generating circuit VG, a row decoder RD, a sense amplifier module SAM, and a sequencer SQC. The peripheral circuit PC includes a cache memory CM, an address register ADR, a command register CMR, and a status register STR. The peripheral circuit PC further includes an input and output control circuit I/O and a logical circuit CTR.

The memory cell array MCA includes a plurality of memory blocks BLK as illustrated in FIG. 5. The plurality of memory blocks BLK respectively include a plurality of string units SU. The plurality of string units SU respectively include a plurality of memory strings MS. One ends of the plurality of memory strings MS are respectively connected to the peripheral circuit PC via a bit line BL. The other ends of the plurality of memory strings MS are respectively connected to the peripheral circuit PC via a common source line SL.

The memory string MS includes a drain-side select transistor STD connected in series between the bit line BL and the source line SL; a plurality of memory cells MC (memory transistors); a source-side select transistor STS; and a source-side select transistor STSb. Hereinafter, the drain-side select transistor STD, the source-side select transistor STS, and the source-side select transistor STSb may be simply referred to as select transistors (STD, STS, and STSb).

The memory cell MC is a field effect type transistor including a semiconductor layer functioning as a channel region, a gate insulating film including a charge storage film, and a gate electrode. A threshold voltage of the memory cell MC changes depending on an amount of charges in the charge storage film. The memory cell MC stores data of one bit or data of a plurality of bits. A word line WL is connected to each of the plurality of memory cells MC corresponding to one memory string MS. Each of these word lines WL functions as the gate electrode of the memory cell MC in all the memory strings MS in one memory block BLK.

The select transistors (STD, STS, and STSb) are field effect type transistors including a semiconductor layer functioning as a channel region, a gate insulating film, and a gate electrode. Select gate lines (SGD, SGS, and SGSb) are respectively connected to the gate electrodes of the select transistors (STD, STS, and STSb). The drain-side select gate line SGD is provided corresponding to the string unit SU, and functions as the gate electrode of the drain-side select transistor STD in all the memory strings MS in one string unit SU. The source-side select gate line SGS functions as the gate electrode of the source-side select transistor STS in all the memory strings MS in the plurality of string units SU. The source-side select gate line SGSb functions as the gate electrode of the source-side select transistor STSb in all the memory strings MS in the plurality of string units SU.

For example, as illustrated in FIG. 5, the voltage generating circuit VG (FIG. 4) is connected to a plurality of voltage supply lines 31. The voltage generating circuit VG includes, for example, a step-down circuit such as a regulator and a step-up circuit such as a charge pump circuit 32. These step-down circuit and step-up circuit are respectively connected to voltage supply lines to which a power voltage $V_{CC}$ and a ground voltage $V_{SS}$ (FIG. 4) are supplied. For example, these voltage supply lines are connected to the pad electrode P illustrated with reference to FIGS. 2 and 3. For example, the voltage generating circuit VG, according to a control signal from a sequencer SQC, generates a plurality of operating voltages applied to the bit line BL, the source line SL, the word line WL, and the select gate lines (SGD, SGS, and SGSb) during a read operation, a write operation, and an erasing operation with respect to the memory cell array MCA, and outputs the generated plurality of operating voltages to the plurality of voltage supply lines 31 at the same time. The operating voltage outputted from the voltage supply line 31 is appropriately adjusted according to the control signal from the sequencer SQC.

For example, as illustrated in FIG. 5, the row decoder RD (FIG. 4) includes an address decoder 22 for decoding address data ADD; and a block selection circuit 23 and a voltage selection circuit 24 that transfer the operating voltage to the memory cell array MCA according to an output signal of the address decoder 22.

The address decoder 22 includes a plurality of block selection lines BLKSEL and a plurality of voltage selection lines 33. For example, the address decoder 22 sequentially refers to a row address RA of the address register ADR (FIG. 4) according to the control signal from the sequencer SQC, decodes the row address RA to set a predetermined block select transistor 35 and a voltage select transistor 37 corresponding to the row address RA into an ON state, and sets the rest of the block select transistor 35 and the voltage select transistor 37 into an OFF state. For example, the voltages of the predetermined block selection line BLKSEL and the voltage selection line 33 are set to an "H" state, and the rest of voltages are set to an "L" state. When a P-channel type transistor is used instead of an N-channel type transistor, an inverse voltage is applied to these wirings.

In the illustrated example, the address decoder 22 is provided with the block selection line BLKSEL one by one for one memory block BLK. However, this arrangement can be appropriately changed. For example, the block selection line BLKSEL may be provided one by one for two or more memory blocks BLK.

The block selection circuit 23 includes a plurality of block selection units 34 corresponding to the memory blocks BLK. Each of the plurality of block selection units 34 includes the plurality of block select transistors 35 corresponding to the word line WL and the select gate lines (SGD, SGS, and SGSb). The block select transistor 35 is, for example, a field effect type breakdown voltage transistor. The drain electrodes of the block select transistors 35 are electrically connected to the corresponding word lines WL or select gate lines (SGD, SGS, and SGSb), respectively. The source electrodes are electrically connected to the voltage supply lines 31 via wirings CG and the voltage selection circuit 24, respectively. The gate electrode is commonly connected to the corresponding block selection line BLKSEL.

The block selection circuit 23 further includes a plurality of transistors which are not illustrated. The plurality of transistors are field effect type breakdown voltage transistors connected between the select gate lines (SGD, SGS, and SGSb) and the voltage supply line to which the ground voltage $V_{SS}$ is supplied. The plurality of transistors supply the ground voltage $V_{SS}$ to the select gate lines (SGD, SGS, and SGSb) in a non-selected memory block BLK. The plurality of word lines WL in the non-selected memory block BLK go into a floating state.

The voltage selection circuit 24 includes a plurality of voltage selection units 36 corresponding to the word lines WL and the select gate lines (SGD, SGS, and SGSb). Each of the plurality of voltage selection units 36 includes the plurality of voltage select transistors 37. The voltage select transistor 37 is, for example, a field effect type breakdown voltage transistor. The drain terminals of the voltage select transistors 37 are electrically connected to the corresponding word lines WL or select gate lines (SGD, SGS, and SGSb) via the wirings CG and the block selection circuit 23, respectively. The source terminals are electrically connected to the corresponding voltage supply lines 31, respectively. The gate electrodes are respectively connected to the corresponding voltage selection lines 33.

The sense amplifier module SAM (FIG. 4) includes a plurality of sense amplifier units corresponding to a plurality of bit lines BL. Each of the plurality of sense amplifier units includes a sense amplifier connected to the bit line BL; and a plurality of latch circuits connected to the sense amplifier. The sense amplifier includes a sense transistor that discharges the charge of the wiring according to a current flowing through the bit line BL; and a voltage transfer circuit that causes the bit line BL to be selectively and electrically connected to a predetermined voltage supply line according to data latched by a latch circuit SDL.

The cache memory CM (FIG. 4) includes a plurality of latch circuits. The data in the latch circuit are sequentially transferred to the sense amplifier module SAM or the input and output control circuit I/O. A decode circuit and a switch circuit are connected to the cache memory CM. The decode circuit decodes a column address CA stored in the address register ADR (FIG. 4). The switch circuit causes the latch circuit corresponding to the column address CA to be electrically connected to a bus DB (FIG. 4) according to an output signal of the decode circuit.

The sequencer SQC (FIG. 4) sequentially decodes command data CMD stored in the command register CMR, and outputs an internal control signal to the row decoder RD, the sense amplifier module SAM, and the voltage generating circuit VG. The sequencer SQC appropriately outputs status data indicating its own state to the status register STR. The sequencer SQC generates a ready and busy signal and outputs the read and busy signal to a terminal RY//BY. For example, the terminal RY//BY is implemented by the pad electrode P illustrated with reference to FIGS. 2 and 3.

The input and output control circuit I/O (FIG. 4) includes data input and output terminals I/O0 to I/O7; an input circuit such as a comparator connected to the data input and output terminals I/O0 to I/O7; and an output circuit such as an OCD circuit. The input and output circuit I/O further includes a shift register connected to the input circuit and the output circuit, and a buffer circuit. For example, the data input and output terminals I/O0 to I/O7 are implemented by the pad electrode P illustrated with reference to FIGS. 2 and 3. The data inputted via the data input and output terminals I/O0 to I/O7 are outputted from the buffer circuit to the cache memory CM, the address register ADR, or the command register CMR according to an internal control signal from the logical circuit CTR. The data outputted via the data input and output terminals I/O0 to I/O7 are inputted to the buffer circuit from the cache memory CM or the status register STR according to the internal control signal from the logical circuit CTR.

The logical circuit CTR (FIG. 4) receives an external control signal from the control die CD via external control terminals /CEn, CLE, ALE, /WE, and /RE, and outputs, in response thereto, the internal control signal to the input and output control circuit I/O. For example, the external control terminals /CEn, CLE, ALE, /WE, and /RE are implemented by the pad electrode P illustrated with reference to FIGS. 2 and 3.

[Structure of Memory Die MD]

Figure 6:
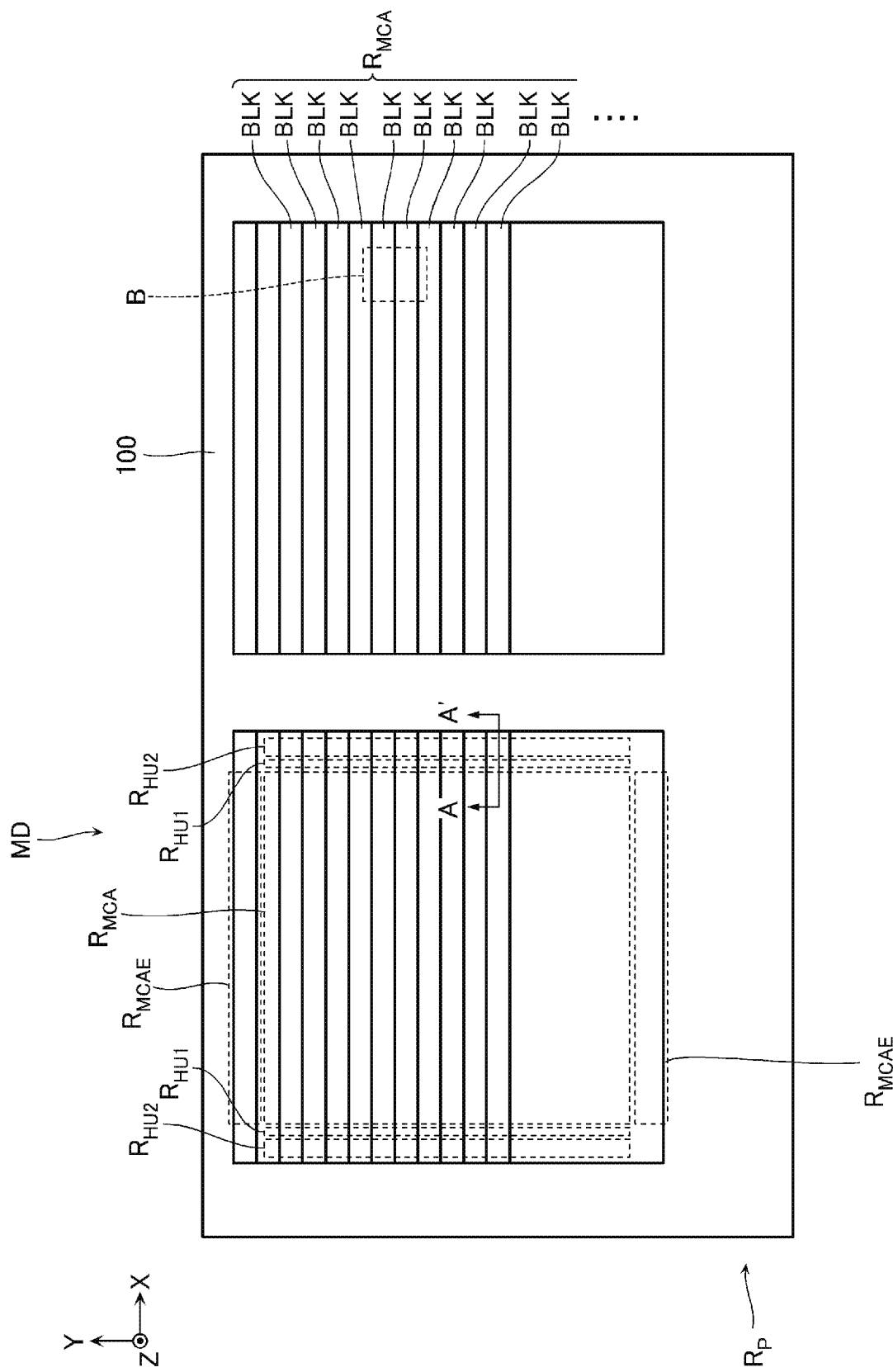
FIG. 6 is a schematic plan view of the memory die MD.
Figure 7:
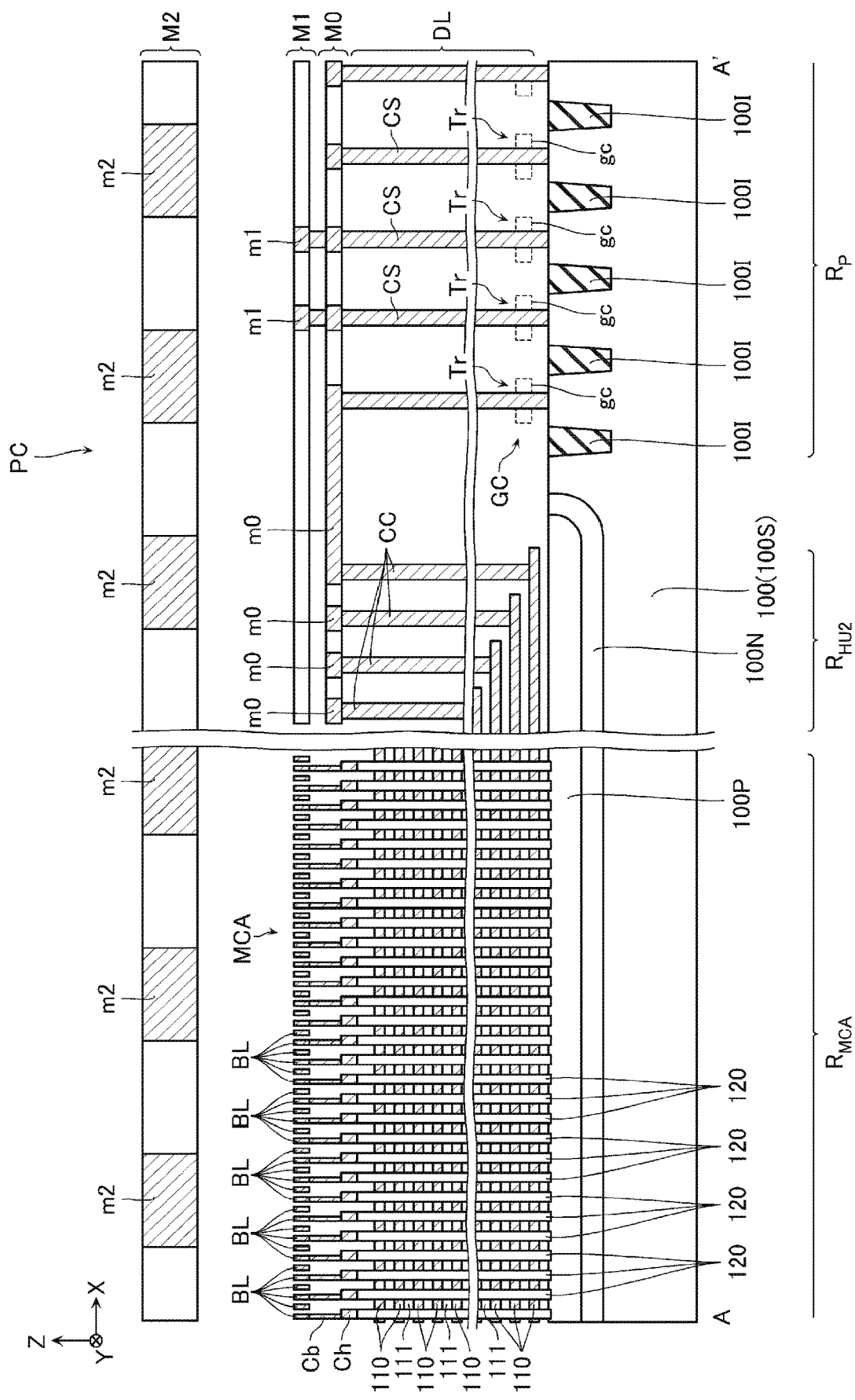
FIG. 7 is a schematic cross-sectional view of a structure illustrated in FIG. 6 taken along the line A-A' and viewed in a direction of an arrow according to at least one embodiment.
Figure 8:
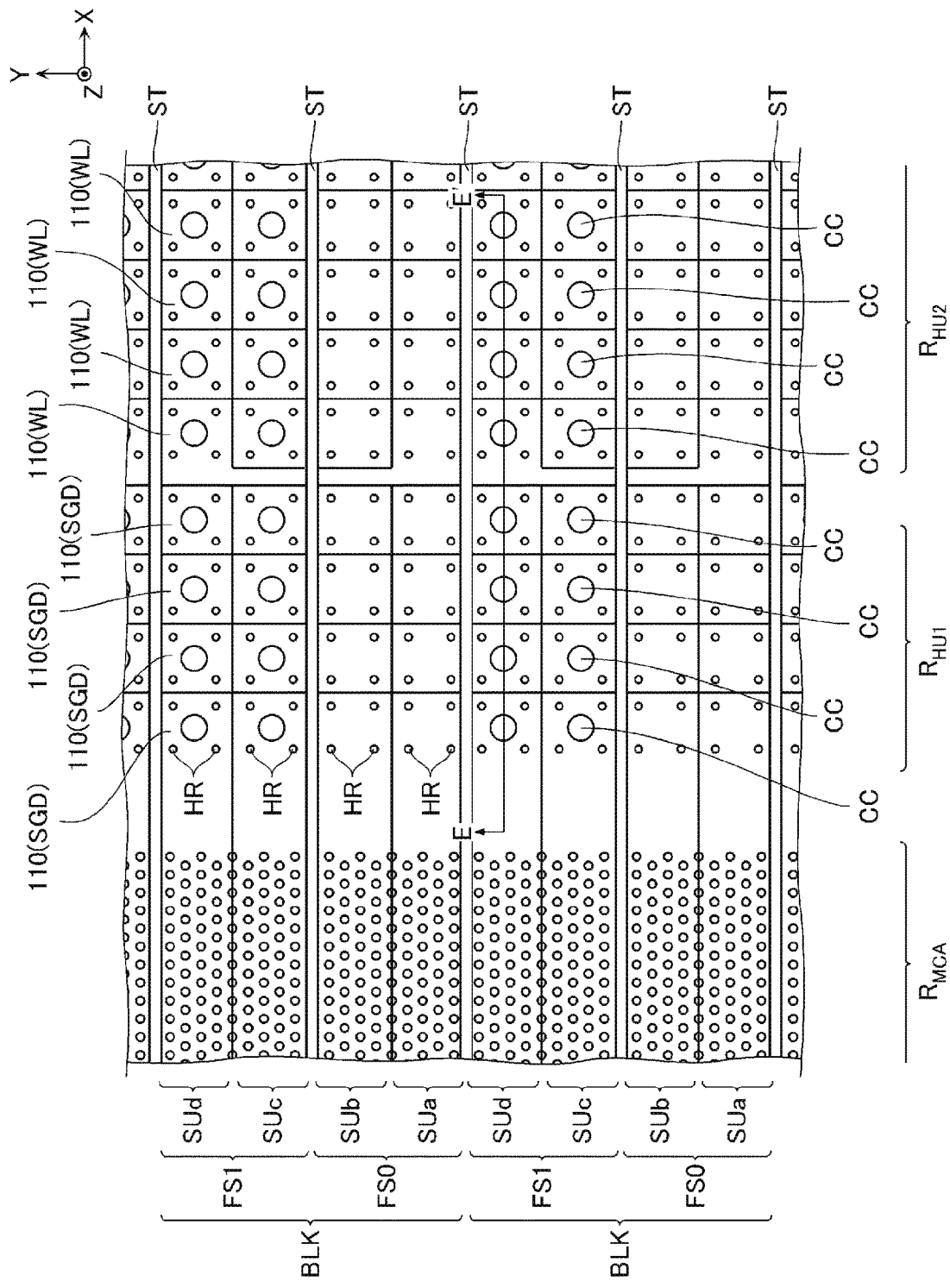
FIG. 8 is a schematic enlarged view of a portion indicated by B of FIG. 6 according to at least one embodiment.
Figure 9:
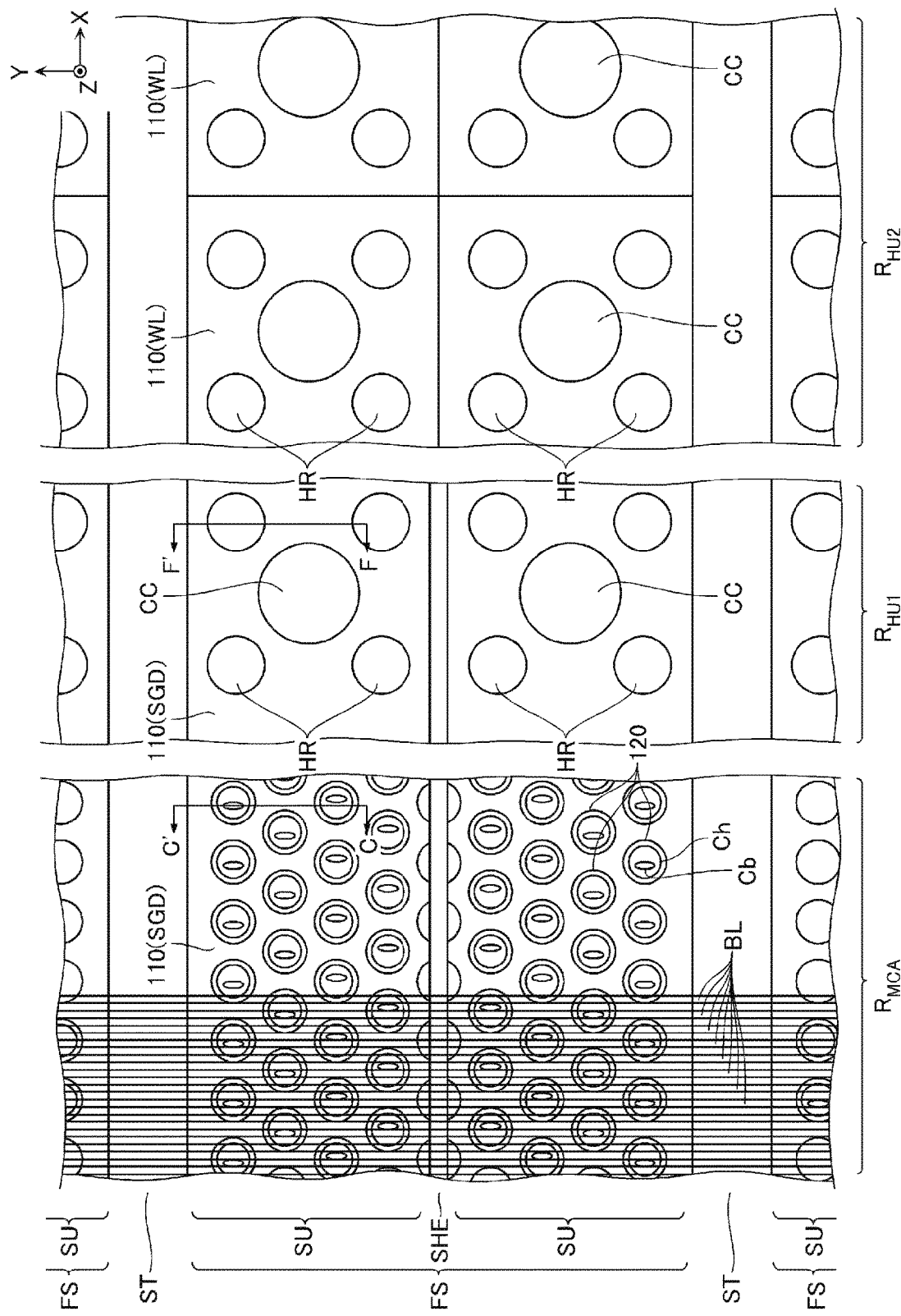
FIG. 9 is a schematic enlarged view of each region illustrated in FIG. 8 according to at least one embodiment.
Figure 10A:
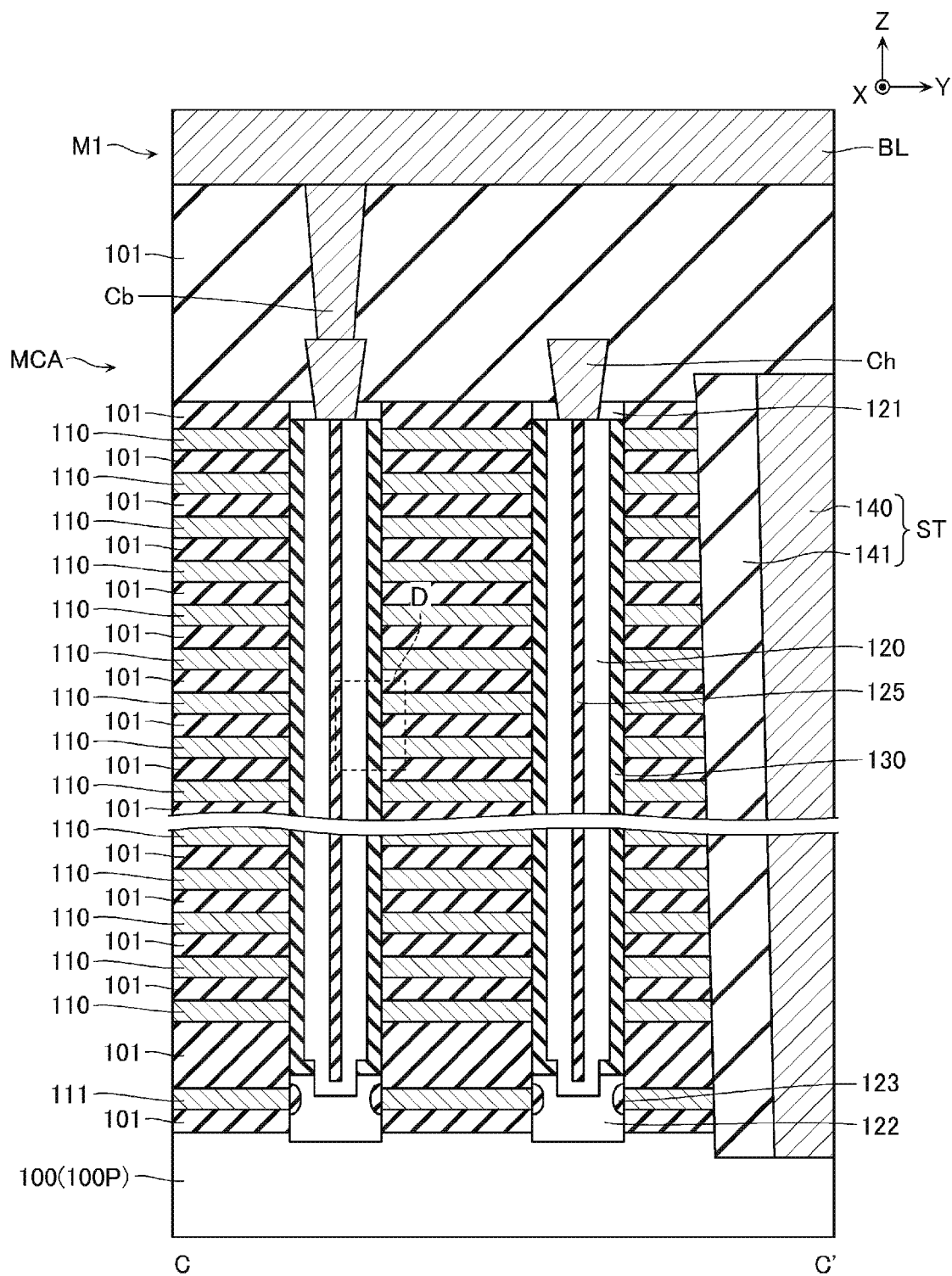
FIG. 10A is a schematic cross-sectional view of a structure illustrated in FIG. 9 taken along the line C-C' and viewed in a direction of an arrow according to at least one embodiment.
Figure 10B:
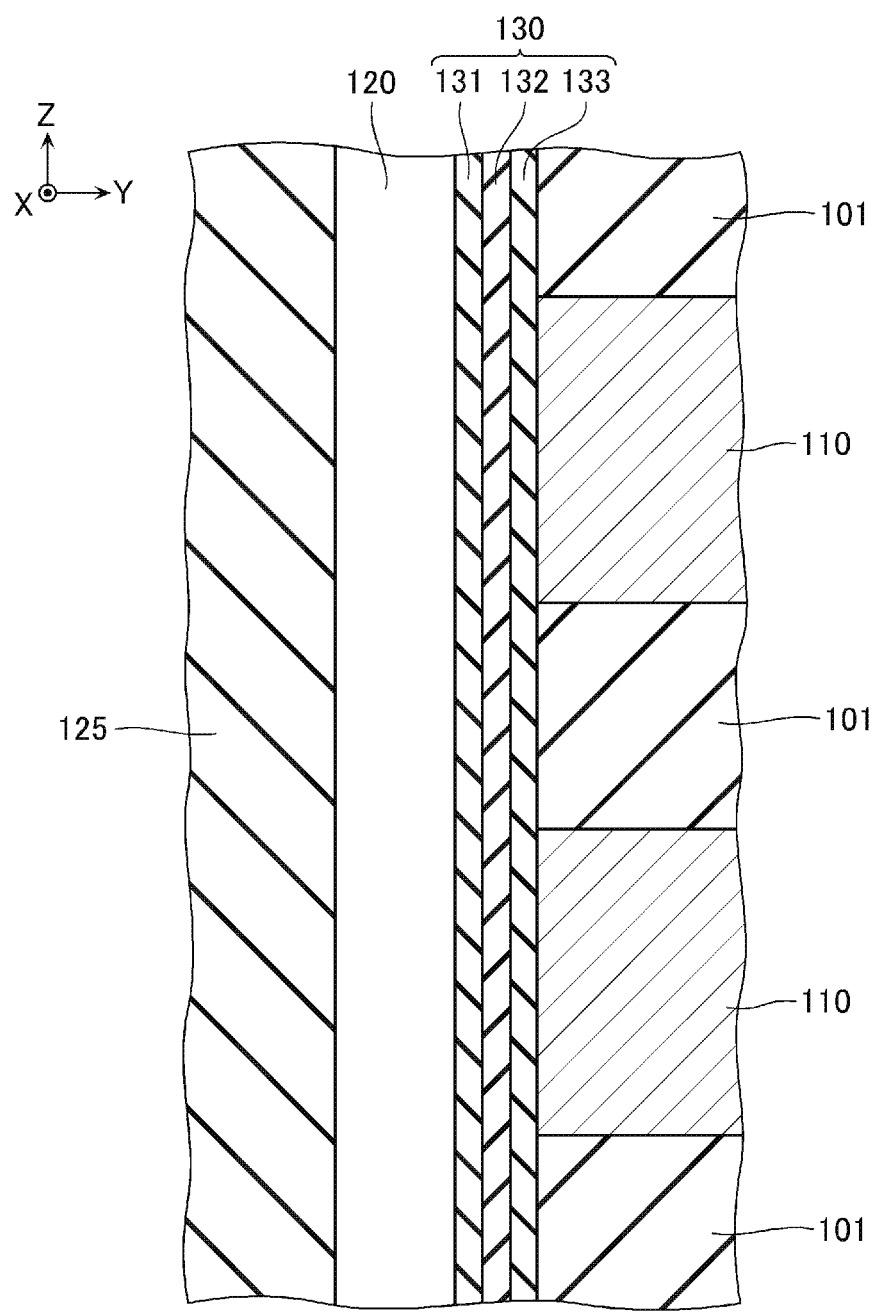
FIG. 10B is a schematic enlarged view of a portion indicated by D of FIG. 10A according to at least one embodiment.
Figure 10D:
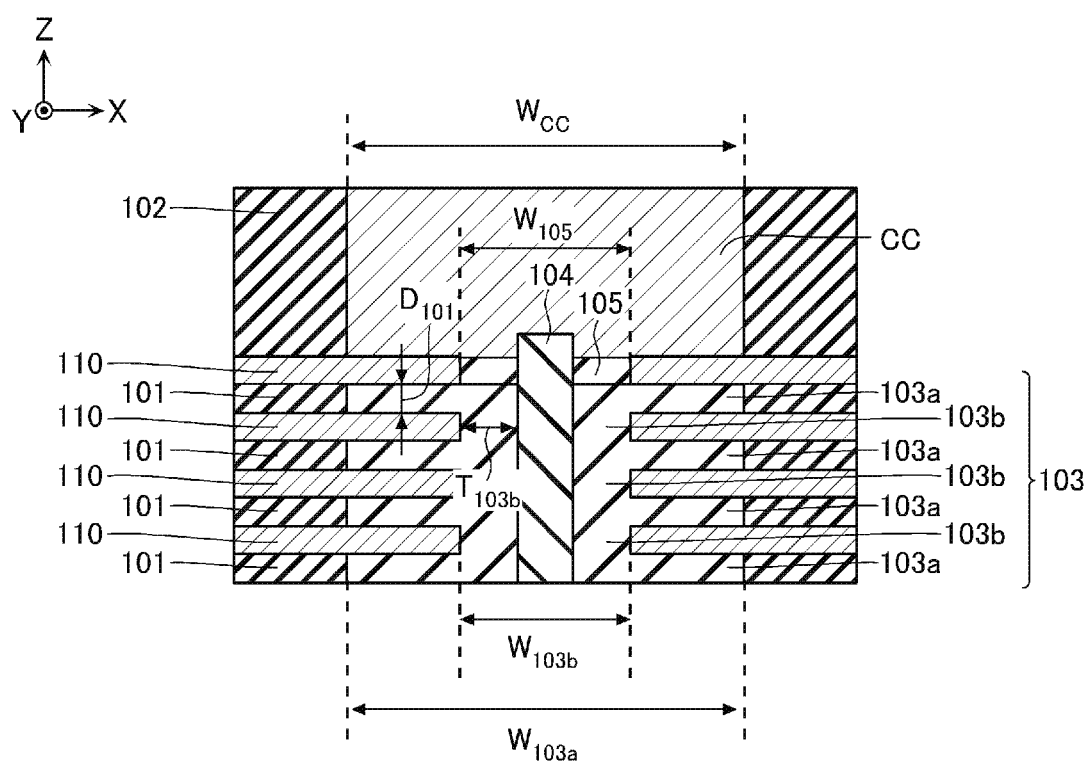
FIG. 10D is a schematic enlarged view of a part of FIG. 10C according to at least one embodiment.
Figure 10E:
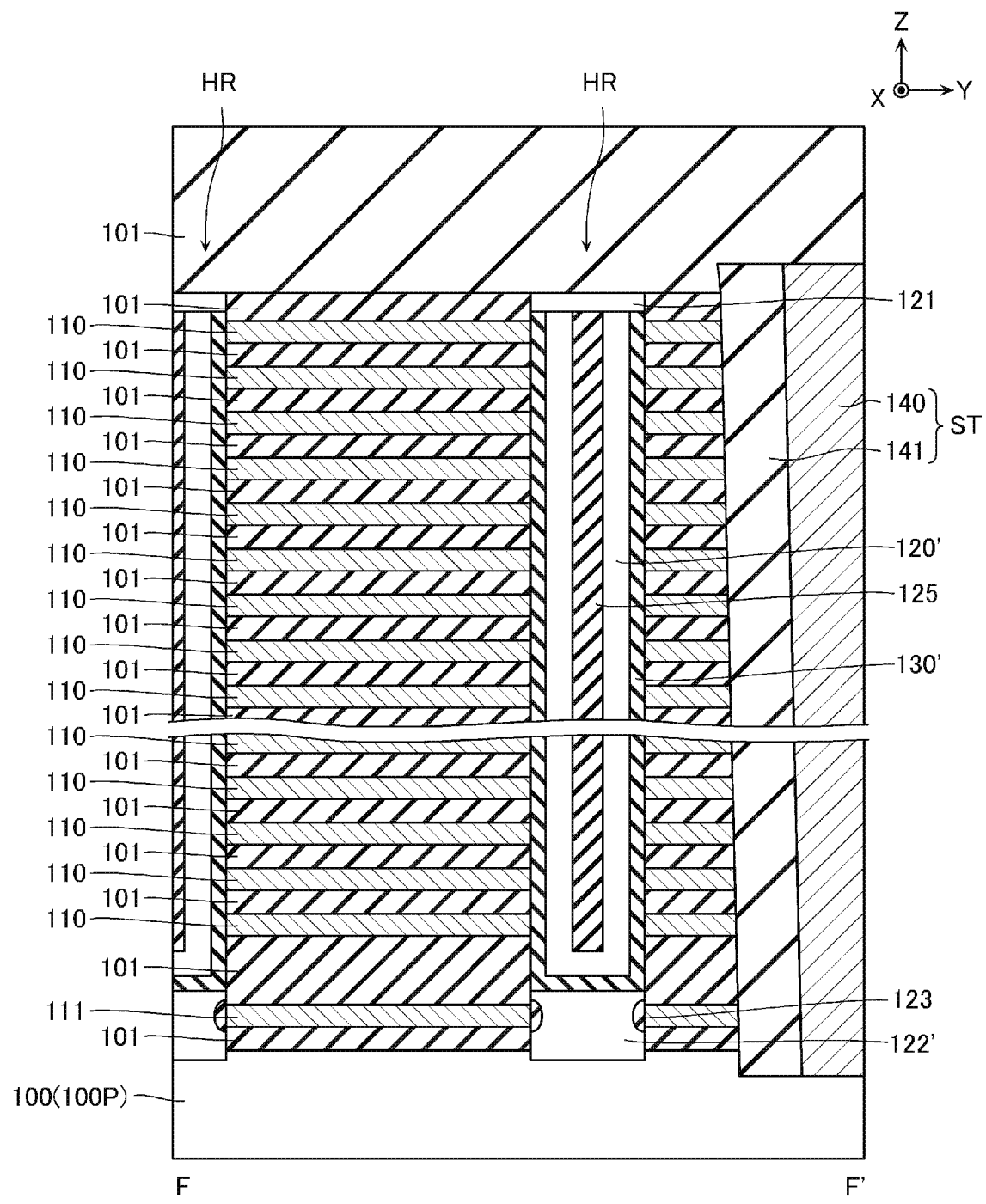
FIG. 10E is a schematic cross-sectional view of a structure illustrated in FIG. 9 taken along the line F-F' and viewed in a direction of an arrow according to at least one embodiment.
Figure 11:
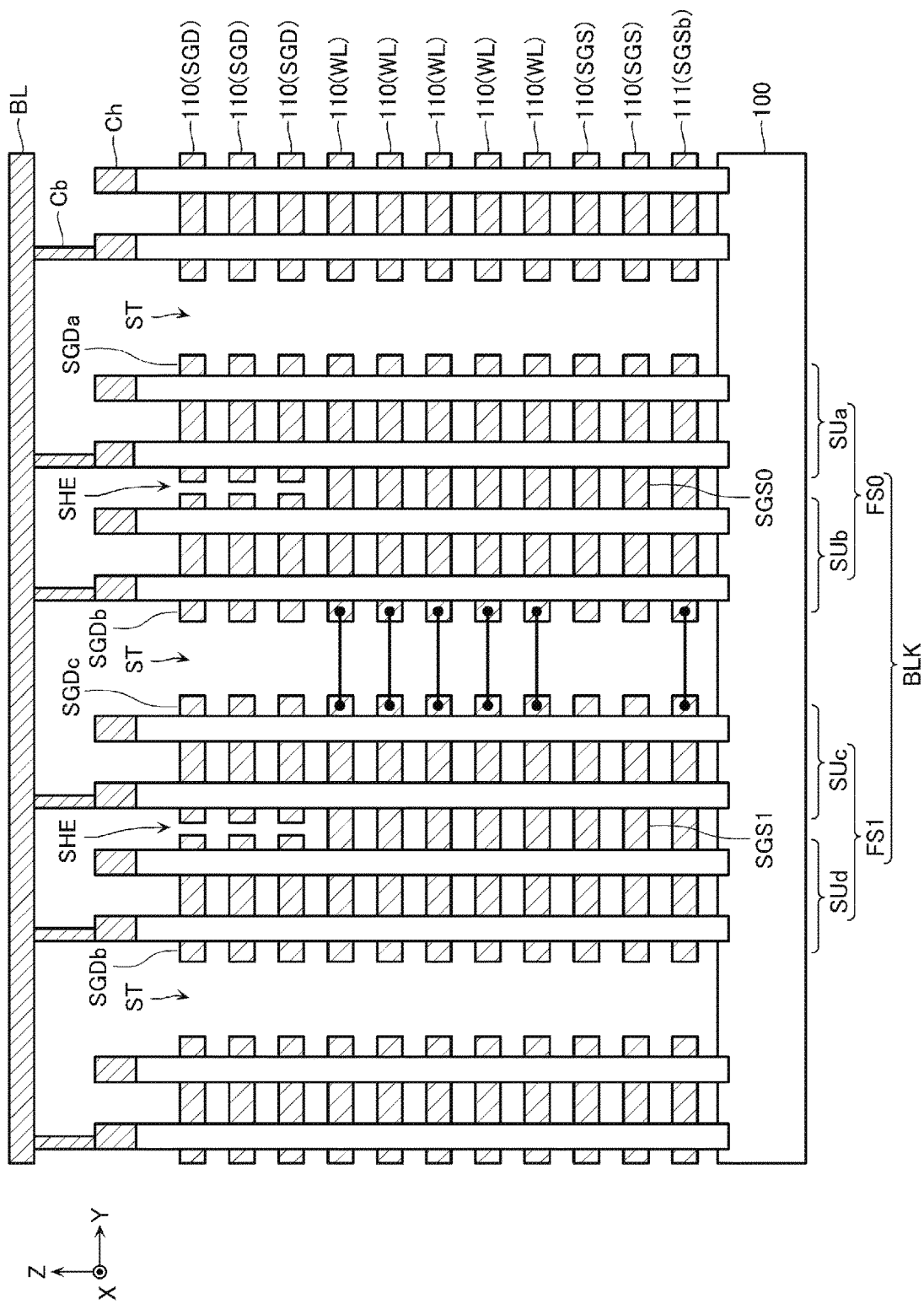
FIG. 11 is a schematic cross-sectional view of the memory die MD according to at least one embodiment.
Figure 12:
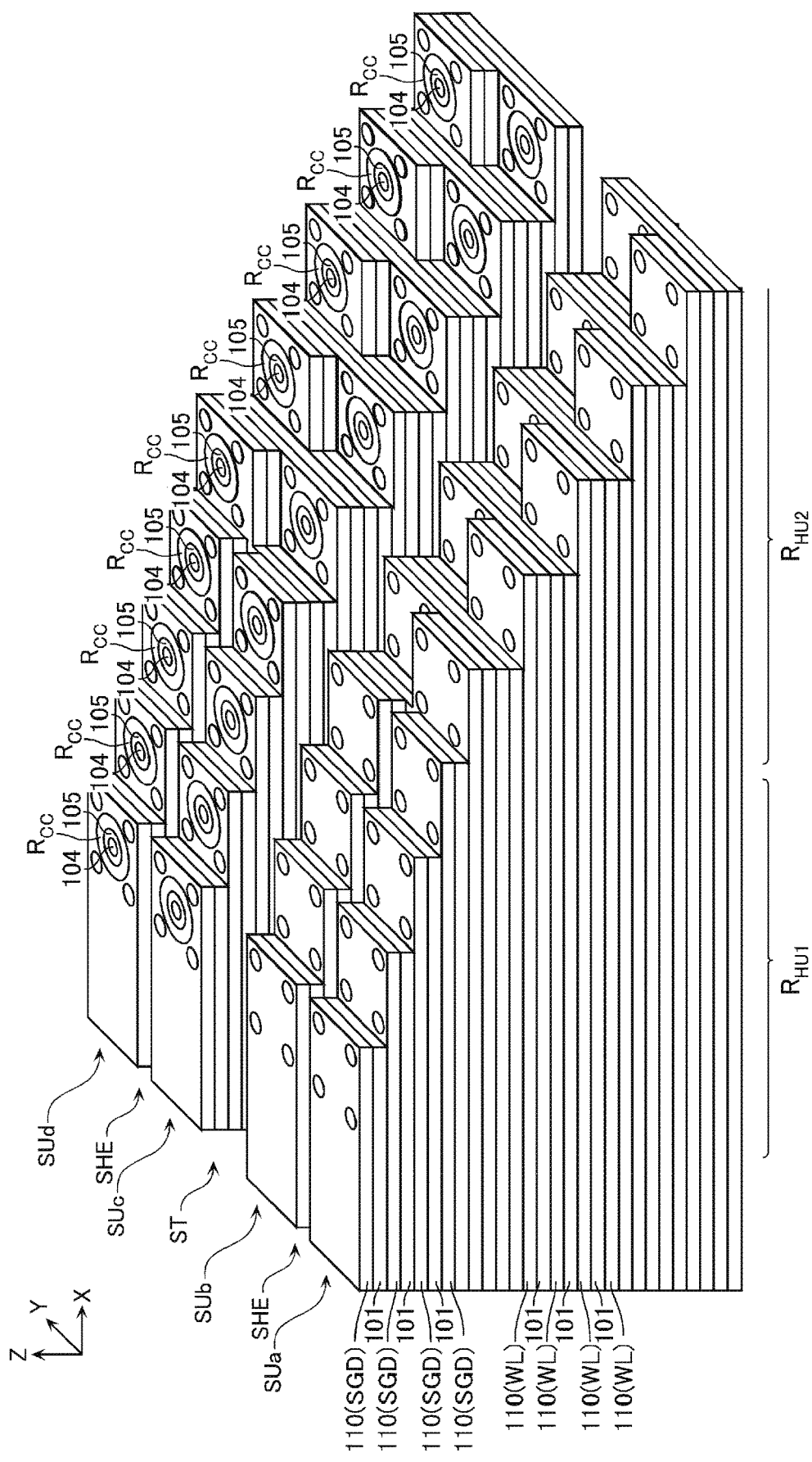
FIG. 12 is a schematic perspective view illustrating a configuration of a part of the memory die MD according to at least one embodiment.
Figure 13:
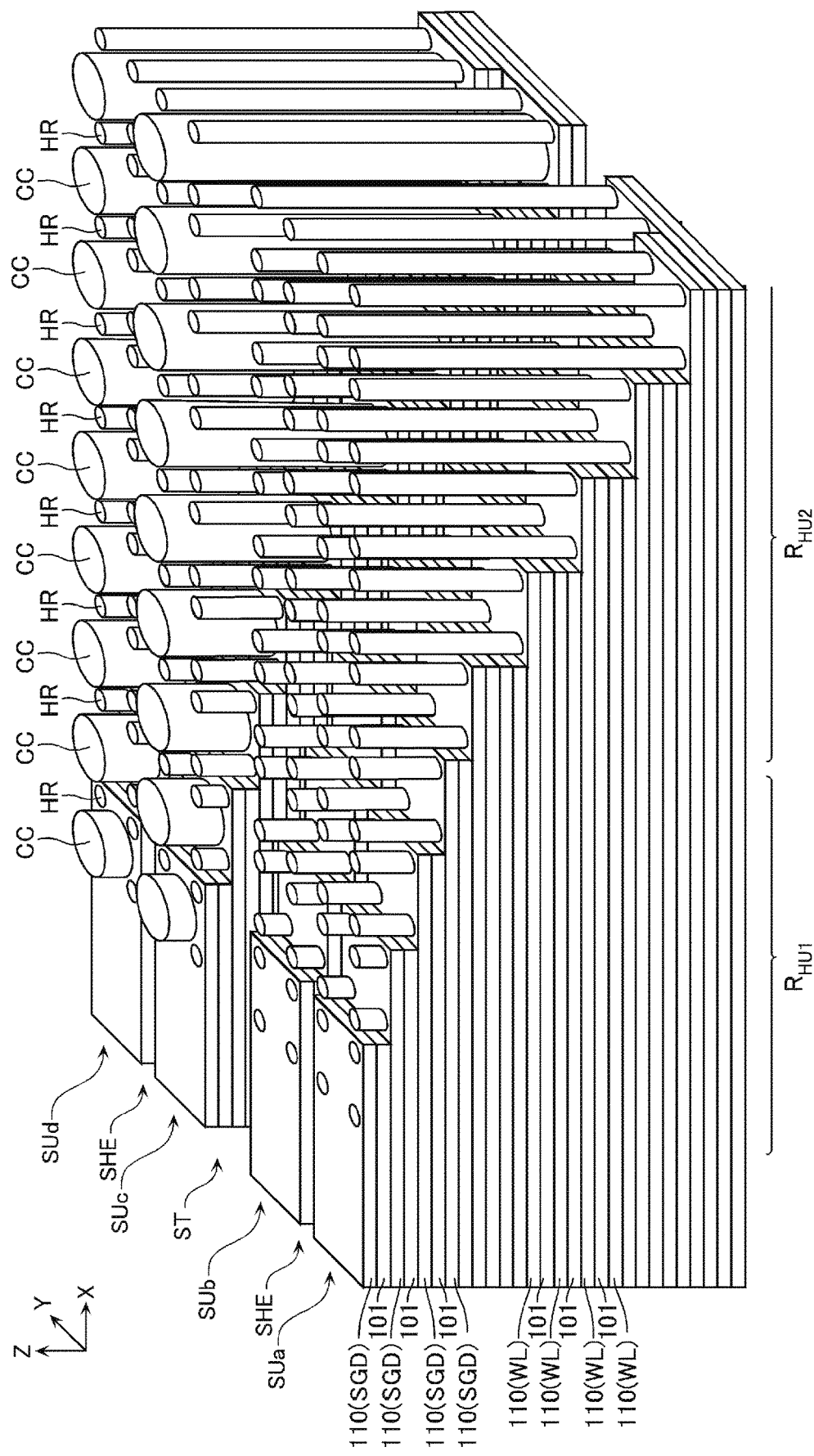
FIG. 13 is a schematic perspective view illustrating a configuration of a part of the memory die MD according to at least one embodiment.

FIG. 6 is a schematic plan view of the memory die MD. FIG. 7 is a schematic cross-sectional view of a structure illustrated in FIG. 6 taken along the line A-A' and viewed in a direction of an arrow. FIG. 8 is a schematic enlarged view of a portion indicated by B of FIG. 6. FIG. 9 is a schematic enlarged view of each region illustrated in FIG. 8. FIG. 10A is a schematic cross-sectional view of a structure illustrated in FIG. 9 taken along the line C-C' and viewed in a direction of an arrow. FIG. 10B is a schematic enlarged view of a portion indicated by D of FIG. 10A. FIG. 10C is a schematic cross-sectional view of a structure illustrated in FIG. 8 taken along the line E-E' and viewed in a direction of an arrow. FIG. 10D is a schematic enlarged view of a part of FIG. 10C. FIG. 10E is a schematic cross-sectional view of a structure illustrated in FIG. 9 taken along the line F-F' and viewed in a direction of an arrow. FIG. 11 is a schematic cross-sectional view of the memory die MD. FIG. 12 is a schematic perspective view illustrating a configuration of a part of the memory die MD. FIG. 13 is a schematic perspective view illustrating a configuration of a part of the memory die MD.

As illustrated in FIG. 6, the memory die MD includes a semiconductor substrate 100. In the illustrated example, the semiconductor substrate 100 is provided with two memory cell array regions $R_{MCA}$ arranged in the X direction. A first hookup region $R_{HU1}$ and a second hookup region $R_{HU2}$ farther from the memory cell array region $R_{MCA}$ than the first hookup region $R_{HU1}$ are provided at locations arranged with the memory cell array region $R_{MCA}$ in the X direction. These regions extend in the Y direction along an end portion in the X direction of the memory cell array region $R_{MCA}$. An array end region $R_{MCAE}$ is provided at a location arranged with the memory cell array region $R_{MCA}$ in the Y direction. This region extends in the X direction along an end portion in the Y direction of the memory cell array region $R_{MCA}$. A peripheral region $R_P$ is provided outside these regions.

As illustrated in FIG. 7, the memory die MD includes a device layer DL provided on the semiconductor substrate 100; a wiring layer M0 provided above the device layer DL; a wiring layer M1 provided above the wiring layer M0; and a wiring layer M2 provided above the wiring layer M1.

[Structure of Semiconductor Substrate 100]

The semiconductor substrate 100 is a semiconductor substrate formed of, for example, P-type silicon (Si) containing a P-type impurity such as boron (B). For example, as illustrated in FIG. 7, a front surface of the semiconductor substrate 100 is provided with, for example, an N-type well region 100N containing an N-type impurity such as phosphorus (P); a P-type well region 100P containing the P-type impurity such as boron (B); a semiconductor substrate region 100S in which the N-type well region 100N and the P-type well region 100P are not provided; and an insulating region 100I. The N-type well region 100N, the P-type well region 100P, and the semiconductor substrate region 100S respectively function as a part of a plurality of transistors Tr and a plurality of capacitors that form the peripheral circuit PC.

[Structure in Memory Cell Array Region $R_{MCA}$ of Device Layer DL]

In the memory cell array region $R_{MCA}$, for example, as illustrated in FIG. 6, a plurality of memory blocks BLK arranged in the Y direction are provided. For example, as illustrated in FIG. 8, the memory block BLK includes two finger structures FS arranged in the Y direction. A structure between the finger structures ST is provided between the two finger structures FS adjacent to each other in the Y direction.

In the following description, the two finger structures FS in the memory block BLK may be respectively referred to as finger structures FS0 and FS1. The source-side select gate lines SGS corresponding to the finger structures FS0 and FS1 may be respectively referred to as source-side select gate lines SGS0 and SGS1. Two string units SU in the finger structure FS0 may be respectively referred to as string units SUa and SUb. Two string units SU in the finger structure FS1 may be respectively referred to as string units SUc and SUd. The drain-side select gate lines SGD corresponding to the string units SUa, SUb, SUc, and SUd may be respectively referred to as drain-side select gate lines SGDa, SGDb, SGDc, and SGDd.

For example, as illustrated in FIG. 10A, the finger structure FS includes a plurality of conductive layers 110 arranged in the Z direction; a plurality of semiconductor layers 120 extending in the Z direction; and a plurality of gate insulating films 130 respectively provided between the plurality of conductive layers 110 and the plurality of semiconductor layers 120.

The conductive layer 110 is an approximately plate-shaped conductive layer extending in the X direction. The conductive layer 110 may include a stacked film of a barrier conductive film such as titanium nitride (TiN) and a metal film such as tungsten (W). The conductive layer 110 may include, for example, polycrystalline silicon containing an impurity such as phosphorus (P) or boron (B). An insulating layer 101 such as silicon oxide (SiO$_2$) is provided between the plurality of conductive layers 110 arranged in the Z direction.

A conductive layer 111 is provided below the conductive layer 110. For example, the conductive layer 111 may include a stacked film of a barrier conductive film such as titanium nitride (TiN) and a metal film such as tungsten (W). The insulating layer 101 such as silicon oxide (SiO$_2$) is provided between the conductive layer 111 and conductive layer 110.

For example, as illustrated in FIG. 11, the conductive layer 111 functions as a gate electrode of the source-side select gate line SGSb (FIG. 5) and the plurality of source-side select transistors STSb connected thereto. The conductive layer 111 is electrically independent for each memory block BLK.

Among the plurality of conductive layers 110, one or a plurality of conductive layers 110 located at the lowermost layer function as a gate electrode of the source-side select gate line SGS (FIG. 5) and a plurality of source-side select transistors STS connected thereto. The plurality of conductive layers 110 are electrically independent for each finger structure FS.

The plurality of conductive layers 110 located thereabove function as a gate electrode of the word line WL (FIG. 5) and the plurality of memory cells MC connected thereto (FIG. 5). The plurality of conductive layers 110 are electrically connected to the plurality of conductive layers 110 that are adjacent to each other in the X direction, respectively. Each of the plurality of conductive layers 110 is electrically independent for each memory block BLK.

One or the plurality of conductive layers 110 located thereabove function as a gate electrode of the drain-side select gate line SGD and the plurality of drain-side select transistors STD connected thereto (FIG. 5). A width in the X direction of the plurality of conductive layers 110 is smaller than that of other of the conductive layers 110. For example, as illustrated in FIG. 9, an insulating layer between the string units SHE is provided between the two conductive layers 110 adjacent to each other in the X direction. Each of the plurality of conductive layers 110 is electrically independent for each string unit SU.

For example, as illustrated in FIG. 9, the semiconductor layers 120 are arranged in a predetermined pattern in the X direction and the Y direction. The semiconductor layer 120 functions as a channel region of a plurality of memory cells MC and the select transistors (STD and STS) in one memory string MS (FIG. 5). The semiconductor layer 120 may be, for example, a semiconductor layer such as polycrystalline silicon (Si). For example, as illustrated in FIG. 10A, the semiconductor layer 120 has an approximately bottomed cylindrical shape, and an insulating layer 125 such as silicon oxide is provided in a central portion. An outer peripheral surface of the semiconductor layer 120 is respectively surrounded by the conductive layer 110, and opposite to the conductive layer 110.

An impurity region 121 containing the N-type impurity such as phosphorus (P) is provided at an upper end portion of the semiconductor layer 120. The impurity region 121 is connected to the bit line BL via a contact Ch and a contact Cb.

A lower end portion of the semiconductor layer 120 is connected to the P-type well region 100P of the semiconductor substrate 100 via a semiconductor layer 122 formed of single crystal silicon (Si). The semiconductor layer 122 functions as a channel region of the source-side select transistor STSb. An outer peripheral surface of the semi-conductor layer 122 is surrounded by the conductive layer 111, and opposite to the conductive layer 111. An insulating layer 123 such as silicon oxide is provided between the semiconductor layer 122 and the conductive layer 111.

The gate insulating film 130 has an approximately cylindrical shape that covers the outer peripheral surface of the semiconductor layer 120.

For example, as illustrated in FIG. 10B, the gate insulating film 130 includes a tunnel insulating film 131, a charge storage film 132, and a block insulating film 133 that are stacked between the semiconductor layer 120 and the conductive layer 110. For example, the tunnel insulating film 131 and the block insulating film 133 are insulating films such as silicon oxide (SiO$_2$). For example, the charge storage film 132 is a film capable of storing charges such as silicon nitride (Si$_3$N$_4$). The tunnel insulating film 131, the charge storage film 132, and the block insulating film 133 have an approximately cylindrical shape, and extend in the Z direction along the outer peripheral surface of the semiconductor layer 120.

FIG. 10B illustrates an example in which the gate insulating film 130 includes the charge storage film 132 such as silicon nitride. However, for example, the gate insulating film 130 may include a floating gate such as polycrystalline silicon containing the N-type or P-type impurity.

For example, as illustrated in FIG. 10A, the structure between the finger structures ST includes a conductive layer 140 extending in the Z direction and the X direction; and an insulating layer 141 provided on the side surface of the conductive layer 140. The conductive layer 140 is connected to an N-type impurity region provided in the P-type well region 100P of the semiconductor substrate 100. For example, the conductive layer 140 may include a stacked film of a barrier conductive film such as titanium nitride (TiN) and a metal film such as tungsten (W). For example, the conductive layer 140 functions as a part of the source line SL (FIG. 5).

[Structure in First Hookup Region R$_{HU1}$ of Device Layer DL]

As illustrated in FIG. 8, an end portion in the X direction of the plurality of conductive layers 110 functioning as the drain-side select gate line SGD is provided in the first hookup region R$_{HU1}$. A plurality of contacts CC may be arranged in a matrix configuration in the X direction and the Y direction are provided in the first hookup region R$_{HU1}$. For example, the contact CC may include a stacked film of a barrier conductive film such as titanium nitride (TiN) and a metal film such as tungsten (W).

For example, as illustrated in FIGS. 12 and 13, a plurality of contacts CC arranged in the X direction are provided at a location corresponding to the string unit SUc. A region R$_{CC}$ in FIG. 12 indicates a region of an upper surface of the conductive layer 110 that contacts a lower surface of the contact CC. As illustrated in FIGS. 12 and 13, among the plurality of contacts CC corresponding to the string unit SUc, the one closest to the memory cell array region R$_{MCA}$ is connected to the first conductive layer 110 counted from above. The one second closest to the memory cell array region R$_{MCA}$ is connected to the second conductive layer 110 counted from above. In the same manner, the one a-th (a is a natural number) closest to the memory cell array region R$_{MCA}$ is connected to an a-th conductive layer 110 counted from above.

For example, as illustrated in FIGS. 12 and 13, a plurality of contacts CC arranged in the X direction are provided at a location corresponding to the string unit SUd. As illustrated in FIGS. 12 and 13, among the plurality of contacts CC corresponding to the string unit SUd, the one closest to the memory cell array region $R_{MCA}$ is connected to the first conductive layer 110 counted from above. The one second closest to the memory cell array region $R_{MCA}$ is connected to the second conductive layer 110 counted from above. Hereinafter, in the same manner, the one a-th (a is a natural number) closest to the memory cell array region $R_{MCA}$ is connected to an a-th conductive layer 110 counted from above.

As illustrated in FIG. 10C, a through via hole penetrating the plurality of conductive layers 110 and the plurality of insulating layers 101 arranged in the Z direction is provided at a location corresponding to the contact CC (a location that overlaps the contact CC when viewed from the Z direction). An inner diameter of the through via hole provided in the conductive layer 110 is smaller than an inner diameter of the through via hole provided in the insulating layer 101. An insulating layer 103 such as silicon oxide ($SiO_2$) formed in an approximately cylindrical shape is provided on an inner peripheral surface of the through via hole. An insulating layer 104 such as silicon nitride (SiN) formed in an approximately columnar shape is provided on an inner peripheral surface of the insulating layer 103. As illustrated in FIG. 10D, an insulating layer 105 such as silicon oxide ($SiO_2$) formed in an approximately annular shape is provided on an upper surface of the insulating layer 103. As illustrated in FIGS. 10D and 12, a central portion of the lower surface of the contact CC contacts an upper surface of the insulating layer 104. A region outside the central portion thereof contacts an upper surface of the insulating layer 105. A region outside the above-described region contacts the approximately annular region $R_{CC}$ (FIG. 12) on an upper surface of the conductive layer 110. In the following description, a configuration including the insulating layer 103, the insulating layer 104, and the insulating layer 105 may be referred to as an "insulating structure".

As illustrated in FIG. 10D, the insulating layer 103 includes a first portion 103a provided at a height location corresponding to the insulating layer 101; and a second portion 103b provided at a height location corresponding to the conductive layer 110. An outer peripheral surface of the first portion 103a is connected to the inner peripheral surface of the through via hole provided in the insulating layer 101. An upper surface and a lower surface of the first portion 103a are respectively connected to a lower surface and an upper surface of the conductive layer 110. An outer diameter $W_{103a}$ of the first portion 103a may be approximately the same as an outer diameter (a width of an interface between the contact CC and the conductive layer 110) $W_{CC}$ at a lower end portion of the contact CC, or may be smaller than the outer diameter $W_{CC}$. The outer diameter $W_{103a}$ of the first portion 103a may be larger than the outer diameter $W_{CC}$ at the lower end portion of the contact CC. An outer diameter $W_{103b}$ of the second portion 103b is smaller than the outer diameter $W_{103a}$. A thickness $T_{103b}$ in a radial direction of the second portion 103b is at least larger than a half size of a distance $D_{101}$ ($D_{101}/2$) in the Z direction between the adjacent conductive layers 110 in the Z direction. The upper surface of the insulating layer 104 is provided above a lower end of the contact CC corresponding to the insulating layer 104. The upper surface of the insulating layer 104 is located above the upper surface of the conductive layer 110 connected to the contact CC. The lower end of the contact CC may be located above the lower surface of the conductive layer 110. An outer peripheral surface of the insulating layer 105 is connected to the inner peripheral surface of the through via hole provided in the conductive layer 110. An outer diameter $W_{105}$ of the insulating layer 105 may be approximately the same as the outer diameter $W_{103b}$ of the second portion 103b, or may be larger than the outer diameter $W_{103b}$.

As illustrated in FIG. 9, a support structure HR provided near the contact CC is provided in the first hookup region $R_{HU1}$. For example, as illustrated in FIG. 10E, the support structure HR includes a semiconductor layer 120' extending in the Z direction; and a plurality of insulating films 130' respectively provided between the plurality of conductive layers 110 and the plurality of semiconductor layers 120'.

The semiconductor layer 120' has almost the same arrangement as that of the semiconductor layer 120. However, the semiconductor layer 120' does not function as the channel region of the memory cell MC. The semiconductor layer 120' is not connected to the bit line BL. A semiconductor layer 122' formed of single crystal silicon (Si) is provided below the semiconductor layer 120'. A bottom portion of the insulating film 130' is provided between the semiconductor layer 120' and the semiconductor layer 122', and the semiconductor layer 120' is not connected to the semiconductor layer 122'.

The semiconductor layer 122' has almost the same arrangement as that of the semiconductor layer 122. However, the semiconductor layer 122' does not function as the channel region of the source-side select transistor STSb.

The insulating film 130' has almost the same arrangement as that of the gate insulating film 130. However, the insulating film 130' has an approximately bottomed cylindrical shape that covers an outer peripheral surface and a bottom surface of the semiconductor layer 120'.

In the examples of FIGS. 8, 9, 10C, 12, and 13, a configuration corresponding to the string units SUc and SUd is illustrated. For example, such a configuration is provided in the first hookup region $R_{HU1}$ on one side in the X direction of the memory cell array region $R_{MCA}$ (for example, the right side in FIG. 6). In such a case, a configuration corresponding to the string units SUa and SUb is provided in the first hookup region $R_{HU1}$ on the other side in the X direction of the memory cell array region $R_{MCA}$ (for example, the left side in FIG. 6).

[Structure in Second Hookup Region $R_{HU2}$ of Device Layer DL]

As illustrated in FIG. 8, a part of the plurality of conductive layers 110 functioning as the word line WL or the source-side select gate line SGS is provided in the second hookup region $R_{HU2}$. A plurality of contacts CC arranged in a matrix configuration in the X direction and the Y direction are provided in the second hookup region $R_{HU2}$. As shown in FIG. 10C, the plurality of contacts CC extend in the Z direction and are connected to the conductive layer 110 at the lower end.

For example, as illustrated in FIGS. 12 and 13, the plurality of contacts CC arranged in the X direction may be provided at the location corresponding to the string unit SUc. As illustrated in FIGS. 12 and 13, among the plurality of contacts CC corresponding to the string unit SUc, the one fifth closest to the memory cell array region $R_{MCA}$ is connected to a sixth conductive layer 110 counted from above. The one sixth closest to memory cell array region $R_{MCA}$ is connected to an eighth conductive layer 110 counted from above. In the same manner, the one b-th (b is a natural number) closest to the memory cell array region $R_{MCA}$ is connected to a 2b-4th conductive layer 110 counted from above.

For example, as illustrated in FIGS. 12 and 13, the plurality of contacts CC arranged in the X direction are provided at the location corresponding to the string unit SUd. As illustrated in FIGS. 12 and 13, among the plurality of contacts CC corresponding to the string unit SUd, the one fifth closest to the memory cell array region $R_{MCA}$ is connected to a fifth conductive layer 110 counted from above. The one sixth closest to memory cell array region $R_{MCA}$ is connected to a seventh conductive layer 110 counted from above. In the same manner, the one b-th (b is a natural number) closest to the memory cell array region $R_{MCA}$ is connected to a 2b-5th conductive layer 110 counted from above.

As illustrated in FIG. 10C, the insulating layers 103, 104, and 105 are also provided at a location corresponding to the contact CC of the second hookup region $R_{HU2}$ in the same manner as that of the first hookup region $R_{HU1}$.

As illustrated in FIG. 9, the support structure HR provided near the contact CC is provided in the second hookup region $R_{HU2}$.

In the examples of FIGS. 8, 9, 10C, 12, and 13, a configuration corresponding to the string units SUc and SUd is illustrated. For example, such an arrangement is provided in the second hookup region $R_{HU2}$ on one side in the X direction of the memory cell array region $R_{MCA}$ (for example, the right side in FIG. 6). In such a case, a configuration corresponding to the string units SUa and SUb is provided in the second hookup region $R_{HU2}$ on the other side in the X direction of the memory cell array region $R_{MCA}$ (for example, the left side in FIG. 6).

[Structure in Peripheral Region $R_P$ of Device Layer DL]

The peripheral circuit PC illustrated with reference to FIGS. 4 and 5 is provided in the peripheral region $R_P$ of FIG. 6.

For example, as illustrated in FIG. 7, a wiring layer GC is provided in the peripheral region $R_P$ of the semiconductor substrate 100 via an insulating layer (which is not illustrated). The wiring layer GC includes a plurality of electrodes gc opposite to the front surface of the semiconductor substrate 100. The plurality of electrodes gc in each region of the semiconductor substrate 100 and the wiring layer GC are respectively connected to a contact CS.

The N-type well region 100N, the P-type well region 100P, and the semiconductor substrate region 100S of the semiconductor substrate 100 respectively function as a channel region of the plurality of transistors Tr forming the peripheral circuit PC and one electrode of the plurality of capacitors.

The plurality of electrodes gc in the wiring layer GC respectively function as a gate electrode of the plurality of transistors Tr forming the peripheral circuit PC and the other electrode of the plurality of capacitors.

The contact CS extends in the Z direction and is connected to an upper surface of the semiconductor substrate 100 or the electrode gc at a lower end. An impurity region containing the N-type impurity or the P-type impurity is provided in a connection portion between the contact CS and the semiconductor substrate 100. For example, the contact CC may include a stacked film of a barrier conductive film such as titanium nitride (TiN) and a metal film such as tungsten (W).

[Structure of Wiring Layers M0, M1, and M2]

For example, as illustrated in FIG. 7, a plurality of wirings in the wiring layers M0, M1, and M2 are electrically connected to at least one of the arrangement in the memory cell array MCA and the configuration in the peripheral circuit PC via the above-described contacts CC and CS.

The wiring layers M0 respectively include a plurality of wirings m0. For example, the plurality of wirings m0 may include a stacked film of a barrier conductive film such as titanium nitride (TiN) and a metal film such as tungsten (W).

The wiring layers M1 respectively include a plurality of wirings m1. For example, the plurality of wirings m1 may include a stacked film of a barrier conductive film such as titanium nitride (TiN) and a metal film such as copper (Cu). A part of the plurality of wirings m1 functions as the bit line BL (FIG. 5). For example, as illustrated in FIG. 9, the bit line BL is arranged in the X direction and extends in the Y direction. The plurality of bit lines BL are respectively connected to one semiconductor layer 120 in each string unit SU.

For example, as illustrated in FIG. 7, the wiring layers M2 respectively include a plurality of wirings m2. For example, the plurality of wirings m2 may include a stacked film of a barrier conductive film such as titanium nitride (TiN) and a metal film such as aluminum (Al). A part of the plurality of wirings m2 functions as the pad electrode P (FIGS. 2 and 3).

[Manufacturing Method]

Figure 49:
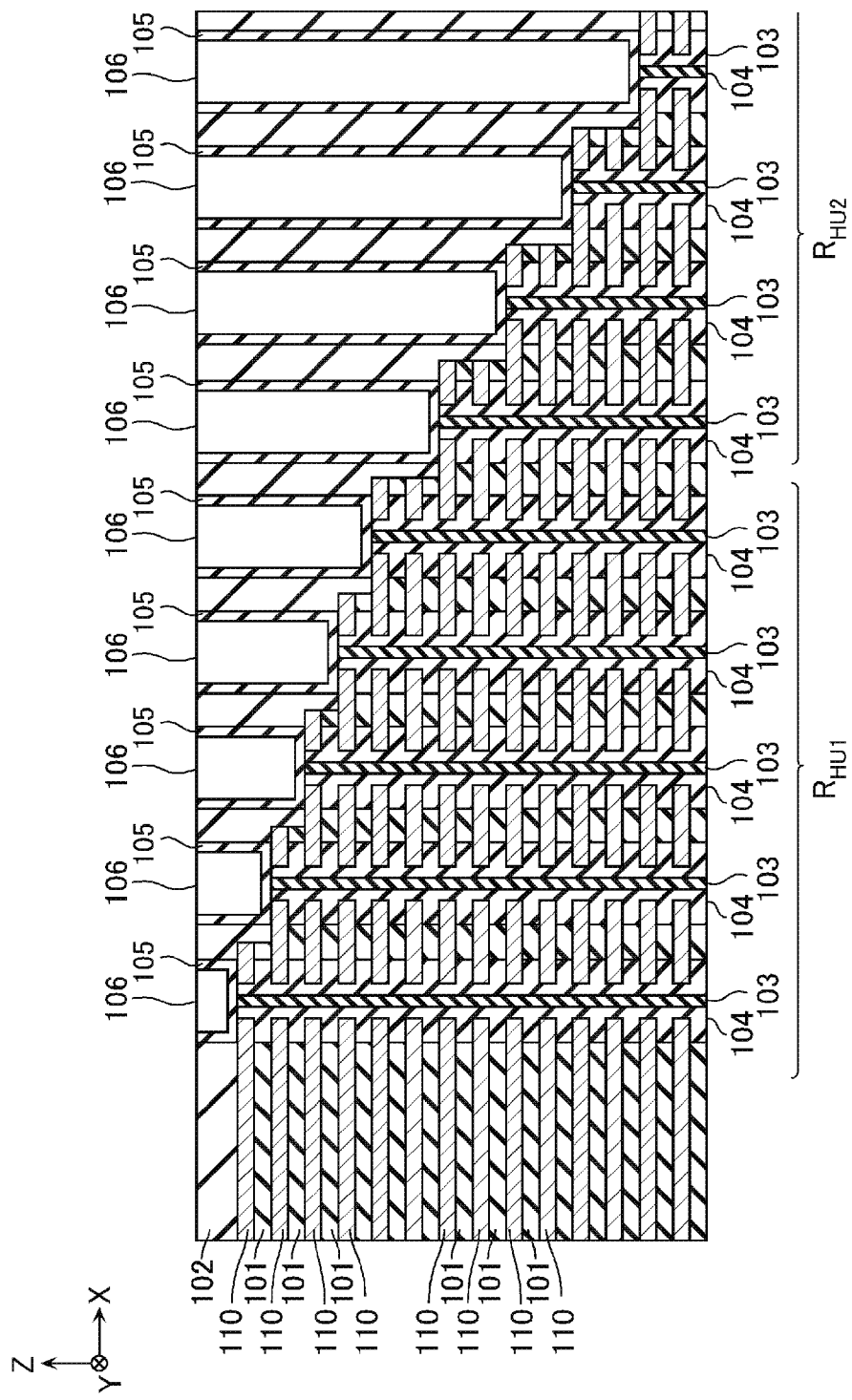
FIG. 49 is a schematic perspective view illustrating the manufacturing method according to at least one embodiment.
Figure 50:
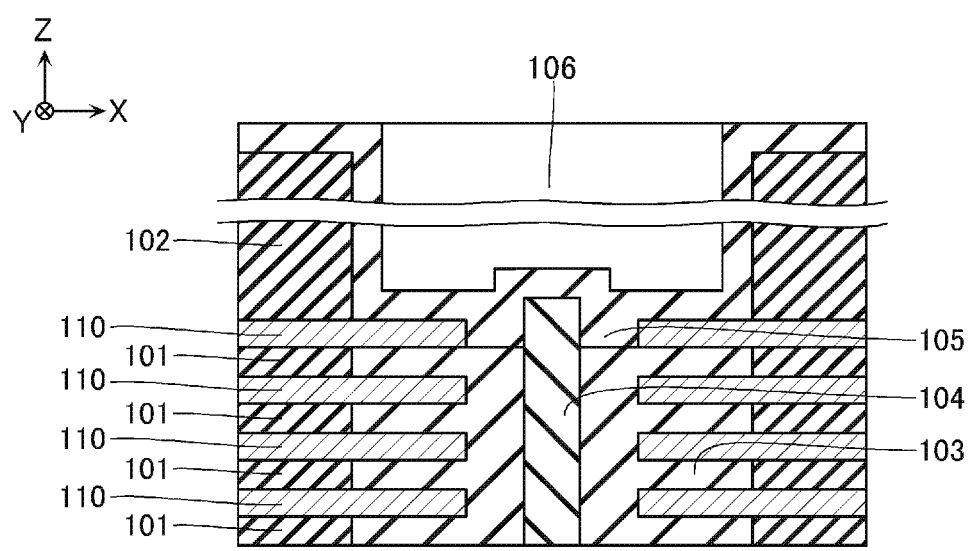
FIG. 50 is a schematic perspective view illustrating the manufacturing method according to at least one embodiment.
Figure 51:
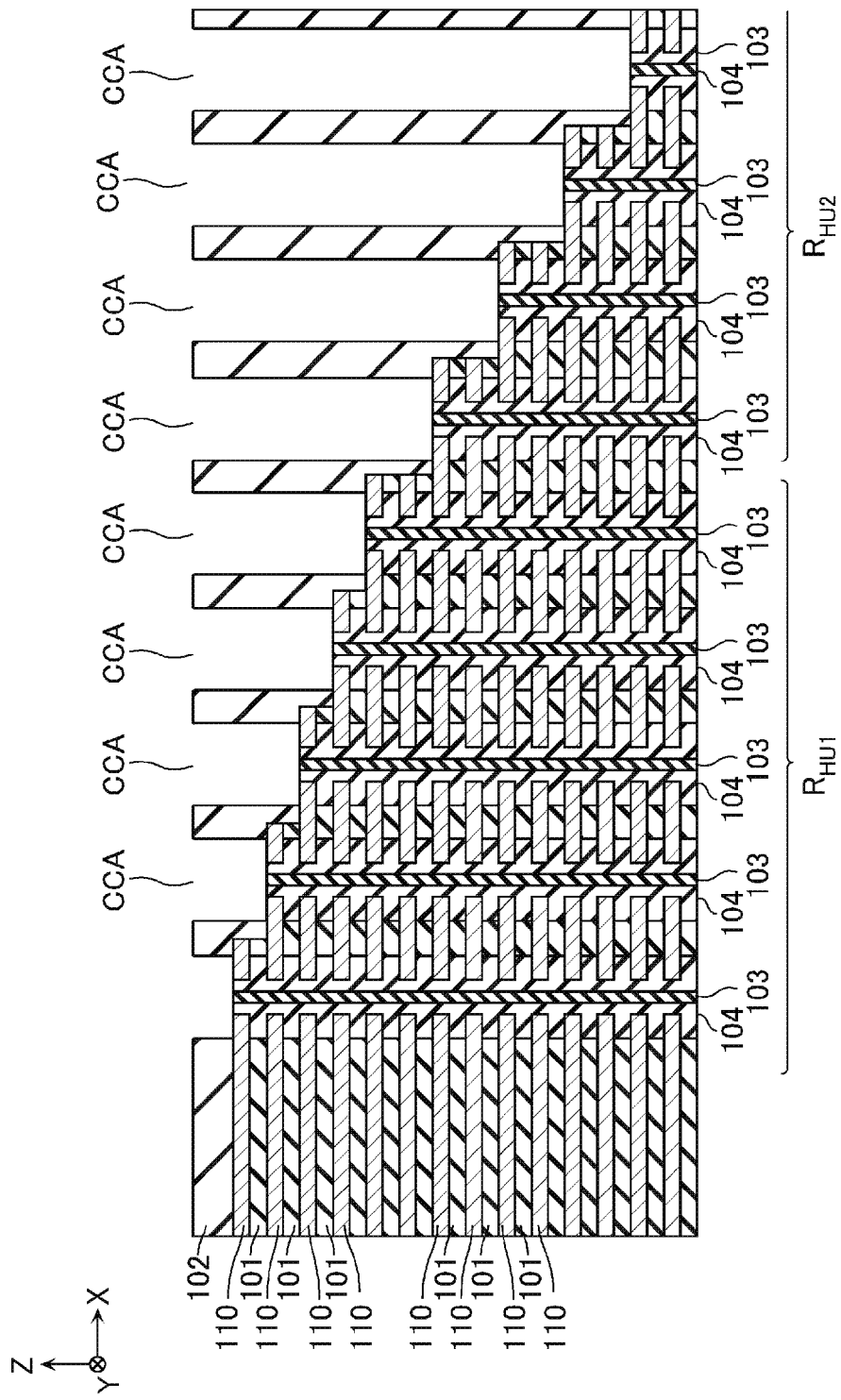
FIG. 51 is a schematic perspective view illustrating the manufacturing method according to at least one embodiment.
Figure 52:
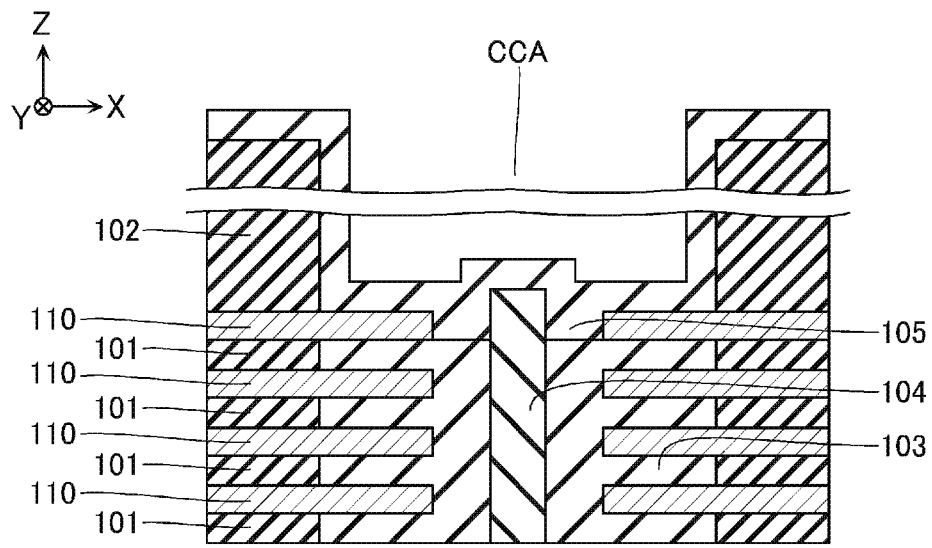
FIG. 52 is a schematic perspective view illustrating the manufacturing method according to at least one embodiment.
Figure 53:
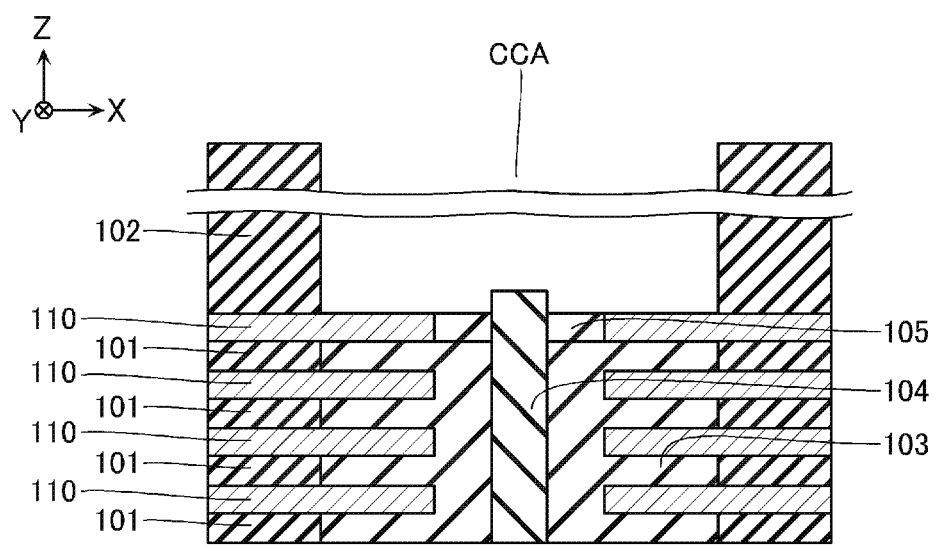
FIG. 53 is a schematic perspective view illustrating the manufacturing method according to at least one embodiment.

Next, a manufacturing method of the memory die MD will be illustrated with reference to FIGS. 14 to 53. FIGS. 14 to 22 are schematic perspective views illustrating the manufacturing method thereof, and illustrate an arrangement corresponding to FIGS. 12 and 13. FIGS. 23, 24, 26, 28, 31, and 34 are schematic perspective views illustrating the manufacturing method thereof, and illustrate an arrangement corresponding to FIG. 10C. FIGS. 25, 27, 29, 30, 32, 33, 35, and 36 are schematic perspective views illustrating the manufacturing method thereof, and illustrate an arrangement corresponding to FIG. 10D. FIGS. 37 to 48 are schematic cross-sectional views illustrating the manufacturing method thereof, and illustrate a cross section corresponding to FIG. 10A. FIGS. 49 and 51 are schematic perspective views illustrating the manufacturing method thereof, and illustrate an arrangement corresponding to FIG. 10C. FIGS. 50, 52, and 53 are schematic perspective views illustrating the manufacturing method thereof, and illustrate an arrangement corresponding to FIG. 10D.

When manufacturing the memory die MD according to the embodiment, first, a plurality of transistors forming the peripheral circuit PC are formed in the peripheral region $R_P$ of the semiconductor substrate 100 (FIG. 6).

Figure 14:
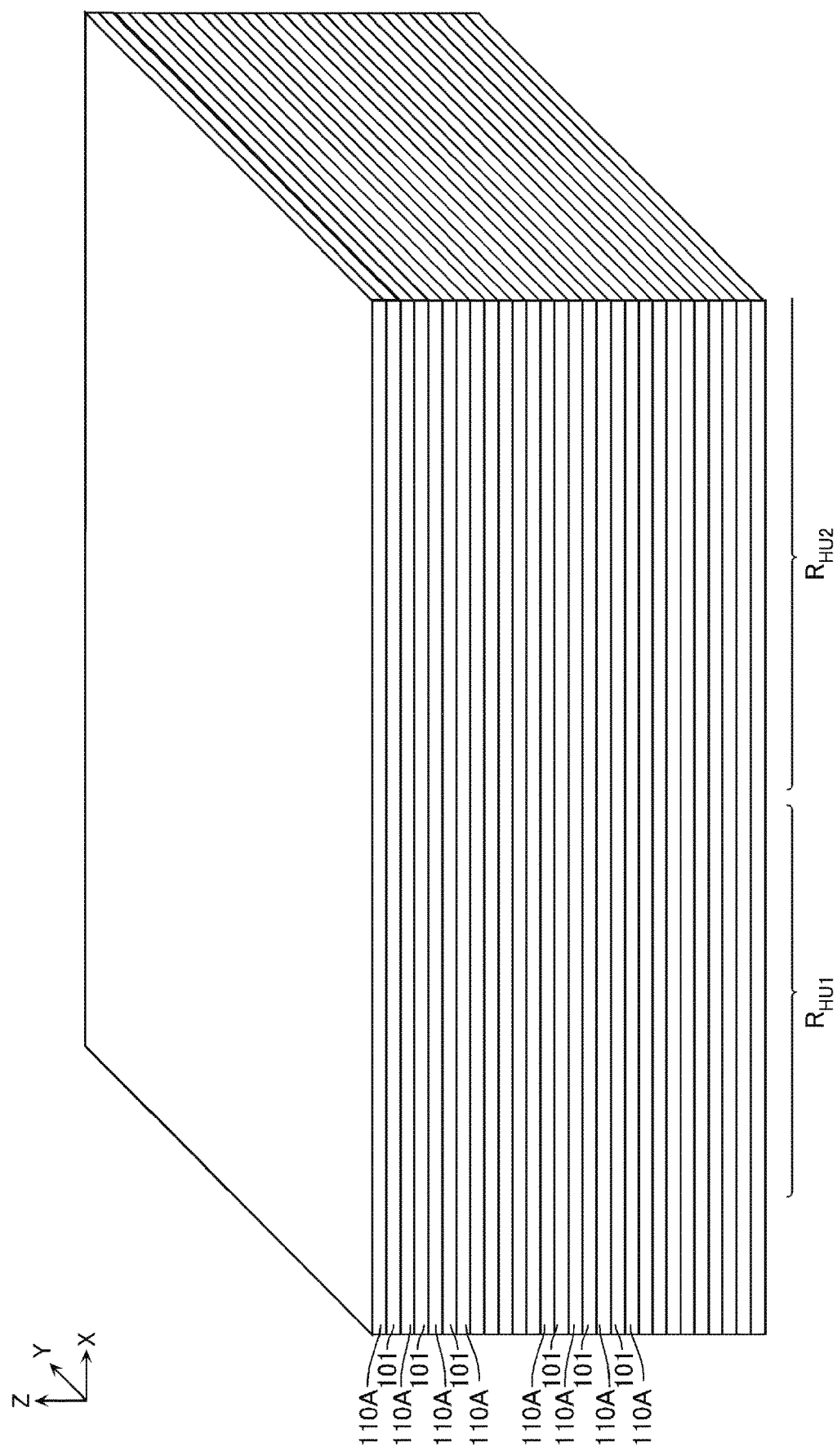
FIG. 14 is a schematic perspective view illustrating a manufacturing method of the memory die MD according to the first embodiment.

Next, for example, as illustrated in FIG. 14, a plurality of sacrificial layers 110A and insulating layers 101 are formed on the semiconductor substrate 100. The sacrificial layer 110A is formed of, for example, silicon nitride (SiN). For example, this process is performed by a method such as chemical vapor deposition (CVD). The plurality of sacrificial layers 110A and the insulating layers 101 are formed in the memory cell array region $R_{MCA}$, the first hookup region $R_{HU1}$, the second hookup region $R_{HU2}$, and the array end region $R_{MCAE}$ illustrated with reference to FIG. 6.

Figure 15:
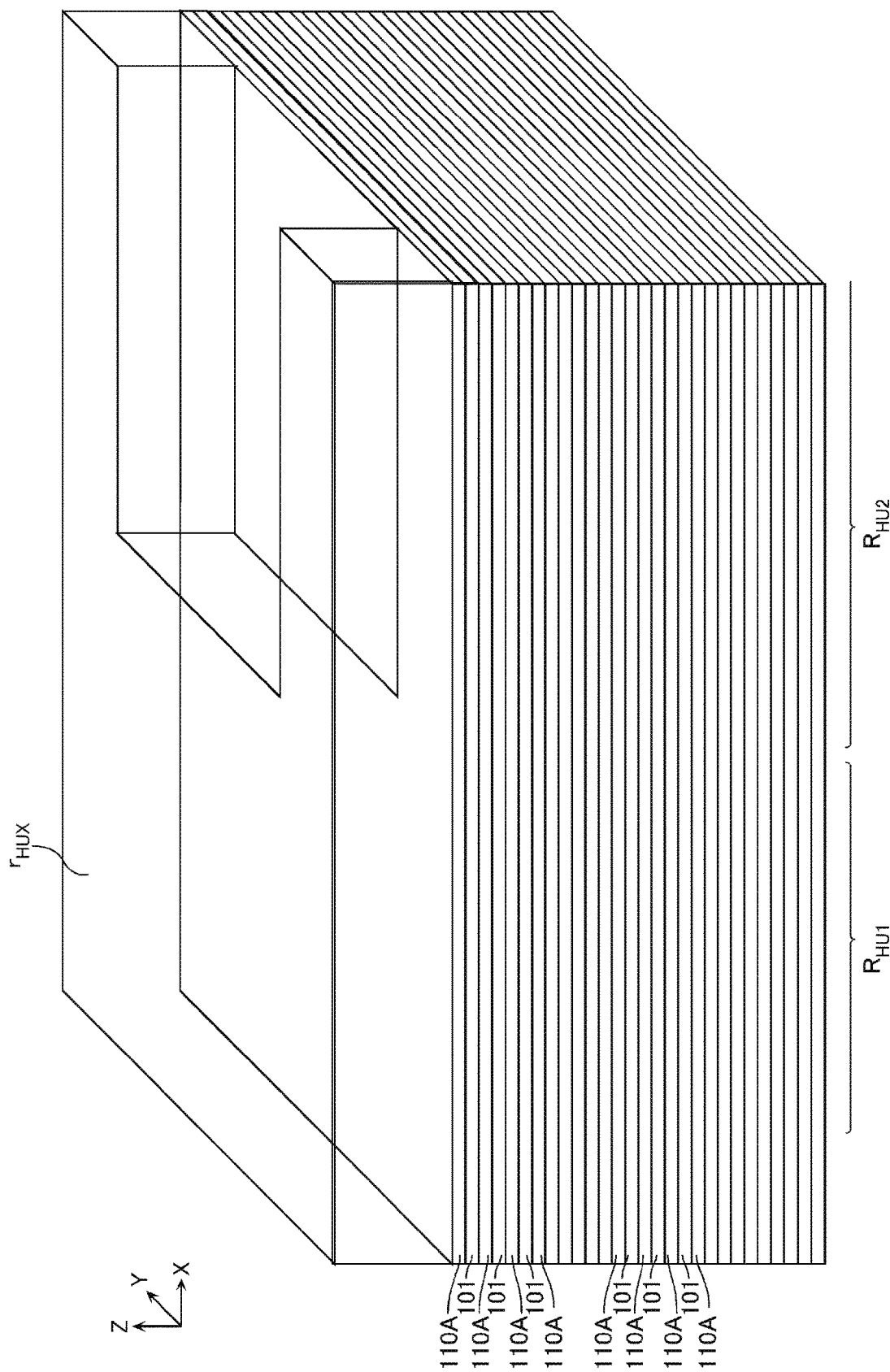
FIG. 15 is a schematic perspective view illustrating the manufacturing method according to at least one embodiment.

Next, for example, as illustrated in FIG. 15, a resist $r_{HUX}$ that covers the structure illustrated with reference to FIG. 14 is formed. The resist $r_{HUX}$ has a pattern that exposes a partial region of the structure formed in the second hookup region $R_{HU2}$ and covers the rest of regions.

Figure 16:
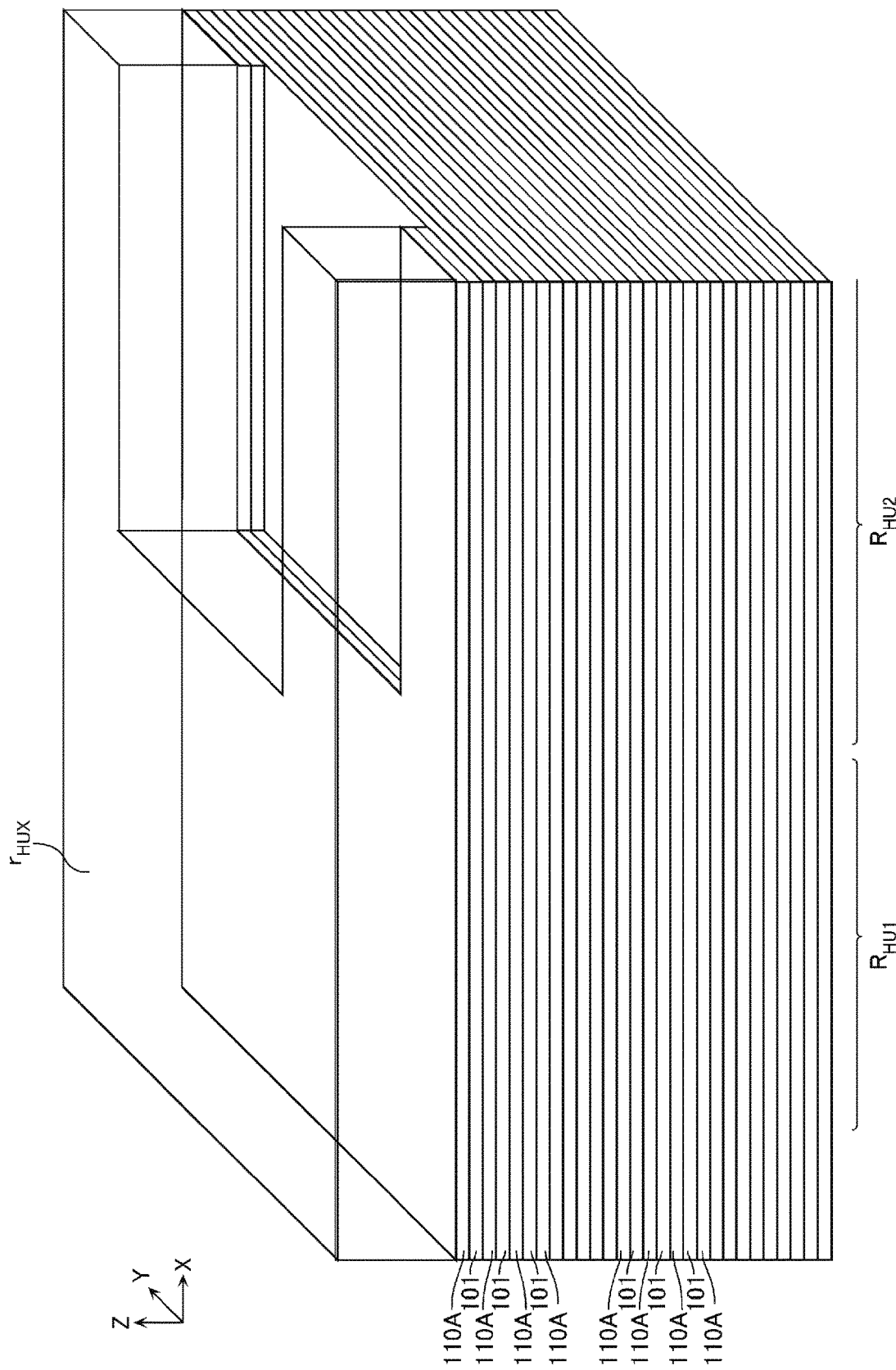
FIG. 16 is a schematic perspective view illustrating the manufacturing method according to at least one embodiment.

Next, for example, as illustrated in FIG. 16, the sacrificial layer 110A and the insulating layer 101 are removed one by one by using the resist $r_{HUX}$ as a mask. In this process, for example, the sacrificial layer 110A is removed under such a first etching condition that an etching rate of silicon nitride (SiN) becomes higher than an etching rate of silicon oxide ($SiO_2$). Next, the insulating layer 101 is removed under such a second etching condition that the etching rate of silicon oxide ($SiO_2$) becomes higher than the etching rate of silicon nitride (SiN). For example, reactive ion etching (RIE) is used for the etching in this process.

Figure 17:
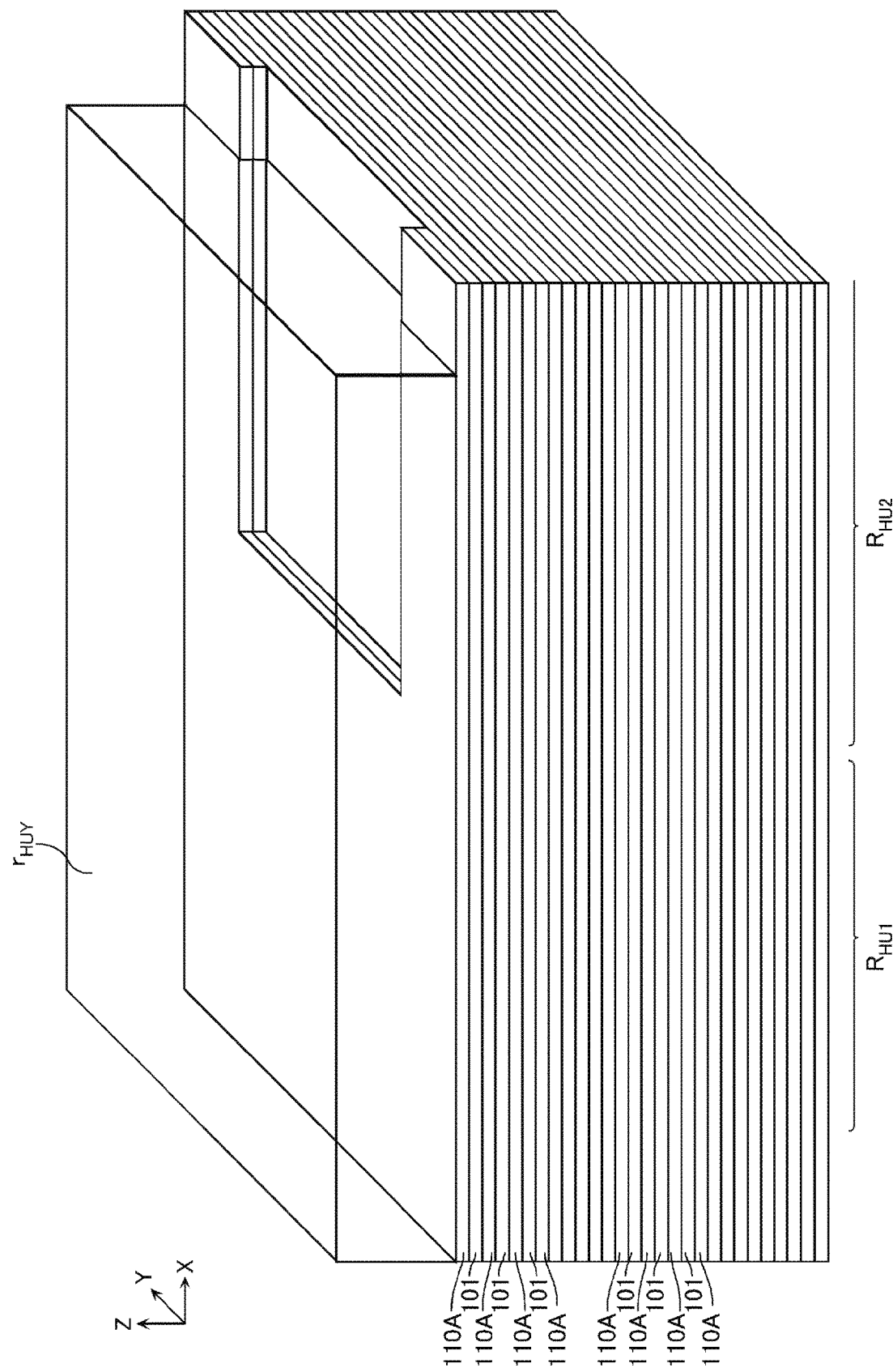
FIG. 17 is a schematic perspective view illustrating the manufacturing method according to at least one embodiment.

Next, for example, as illustrated in FIG. 17, the resist $r_{HUX}$ is removed, and a resist $r_{HUY}$ that covers the structure illustrated with reference to FIG. 16 is formed. The resist $r_{HUY}$ has a pattern that exposes a partial region of the structure formed in the second hookup region $R_{HU2}$ and covers the rest of regions.

Figure 18:
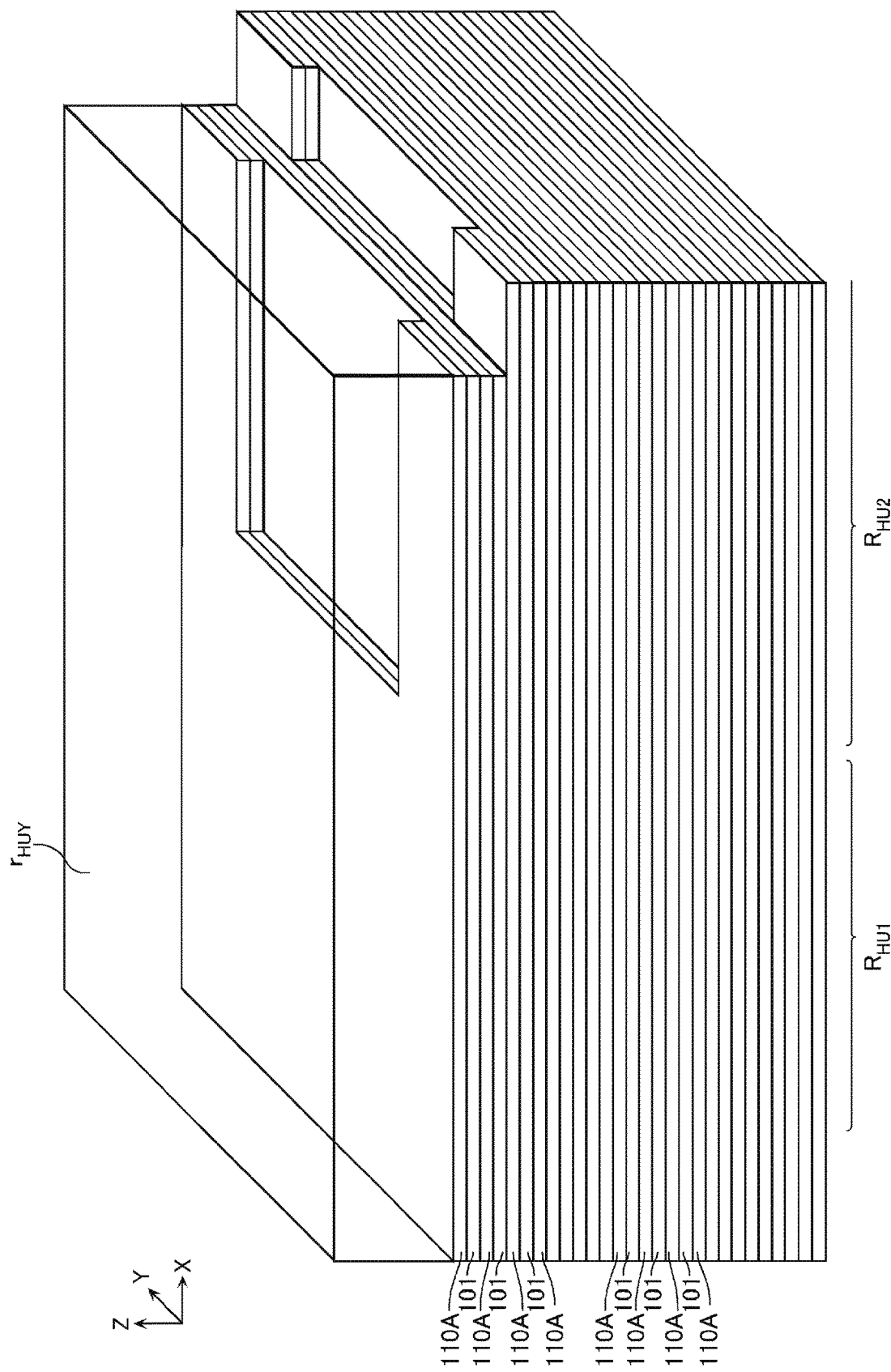
FIG. 18 is a schematic perspective view illustrating the manufacturing method according to at least one embodiment.

Next, for example, as illustrated in FIG. 18, the sacrificial layer 110A and the insulating layer 101 are removed by two layers by using the resist $r_{HUY}$ as a mask. In this process for example, the etching under the first etching condition and the etching under the second etching condition are alternately performed twice.

Figure 19:
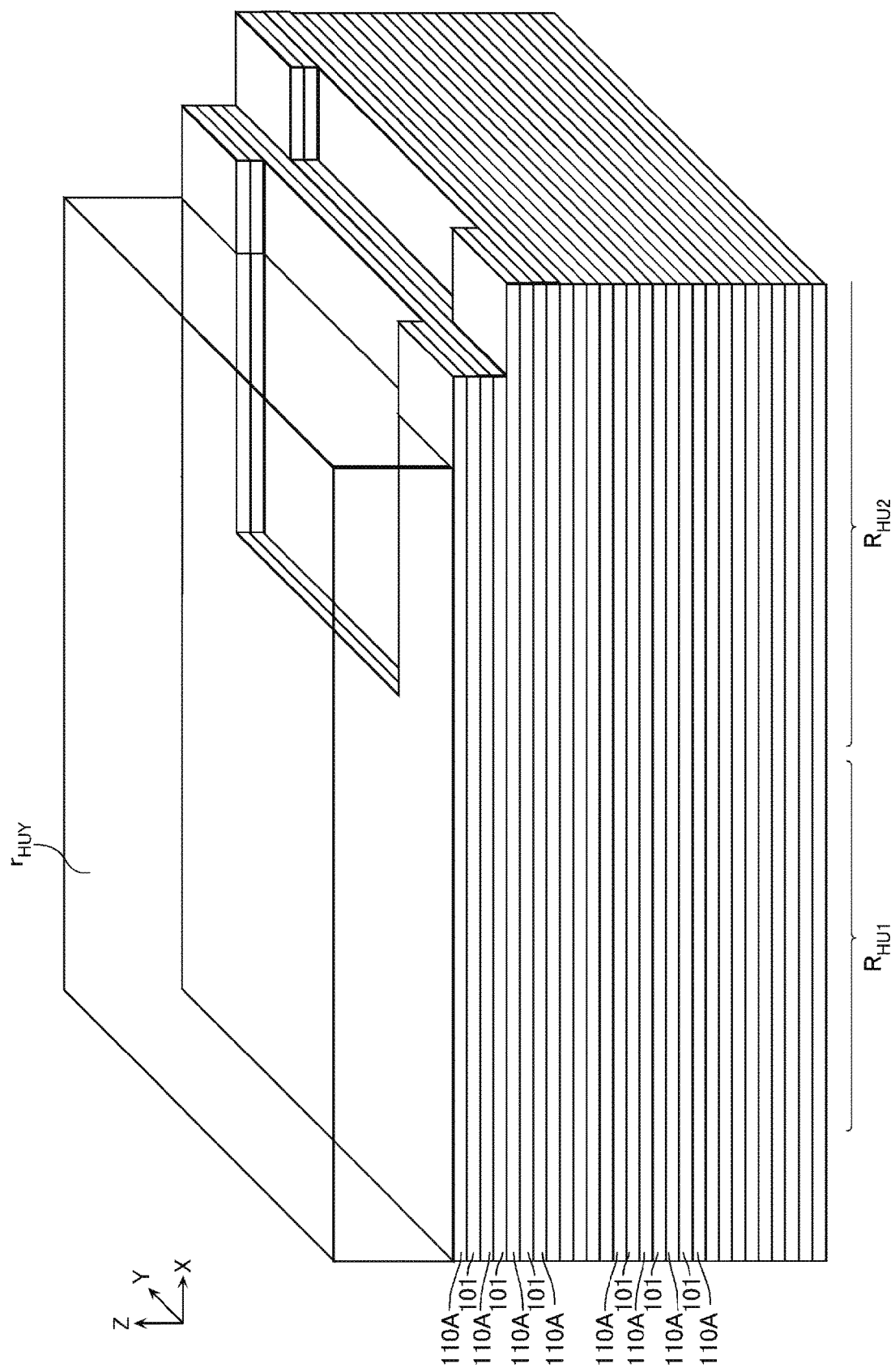
FIG. 19 is a schematic perspective view illustrating the manufacturing method according to at least one embodiment.

Next, for example, as illustrated in FIG. 19, a part of the resist $r_{HUY}$ is removed, and a part of the region covered by the resist $r_{HUY}$ is exposed.

Figure 20:
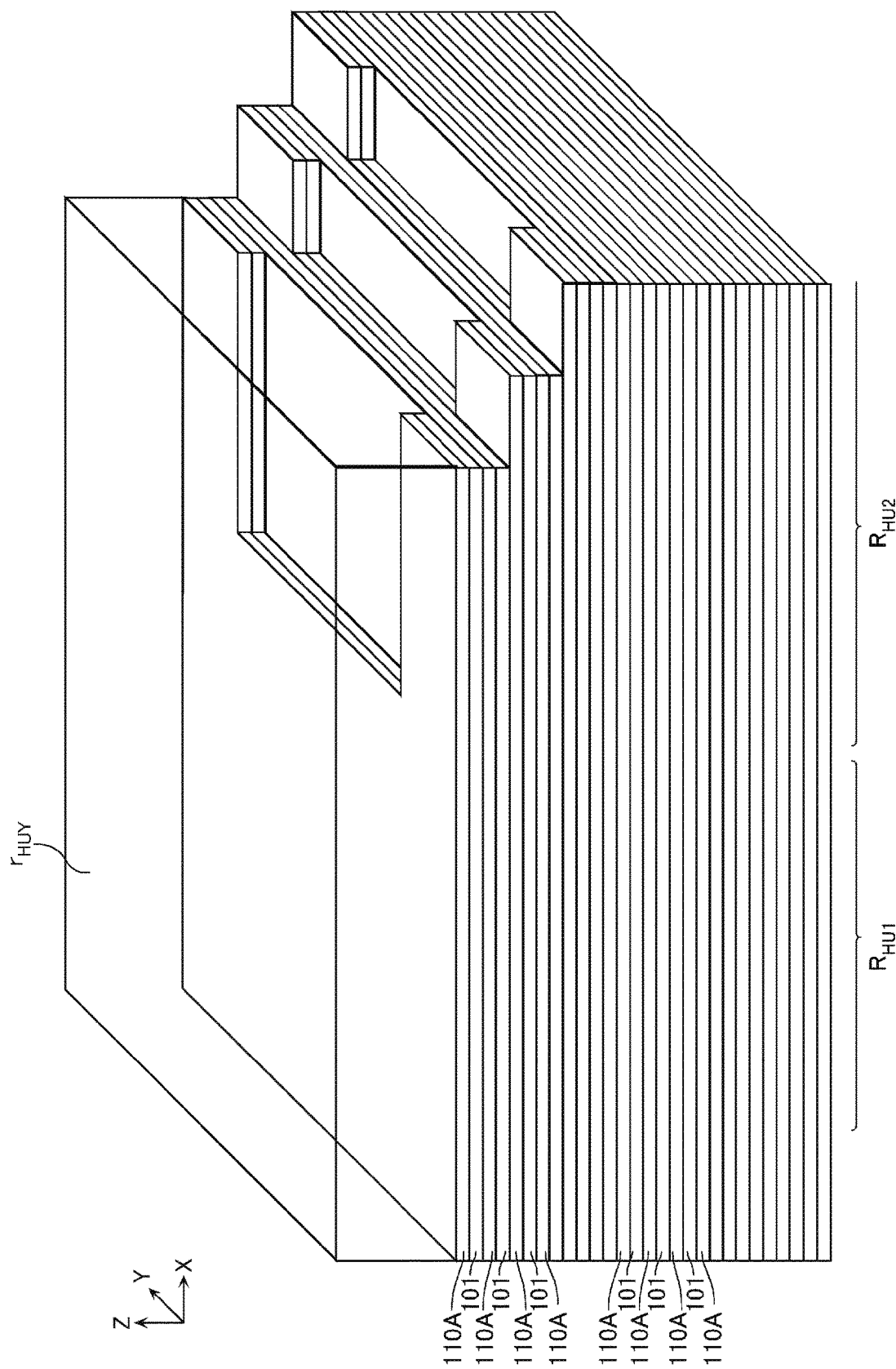
FIG. 20 is a schematic perspective view illustrating the manufacturing method according to at least one embodiment.

Next, for example, as illustrated in FIG. 20, the sacrificial layer 110A and the insulating layer 101 are removed by two layers by using the resist $r_{HUY}$ as a mask. In this process, for example, the etching under the first etching condition and the etching under the second etching condition are alternately performed twice.

Figure 21:
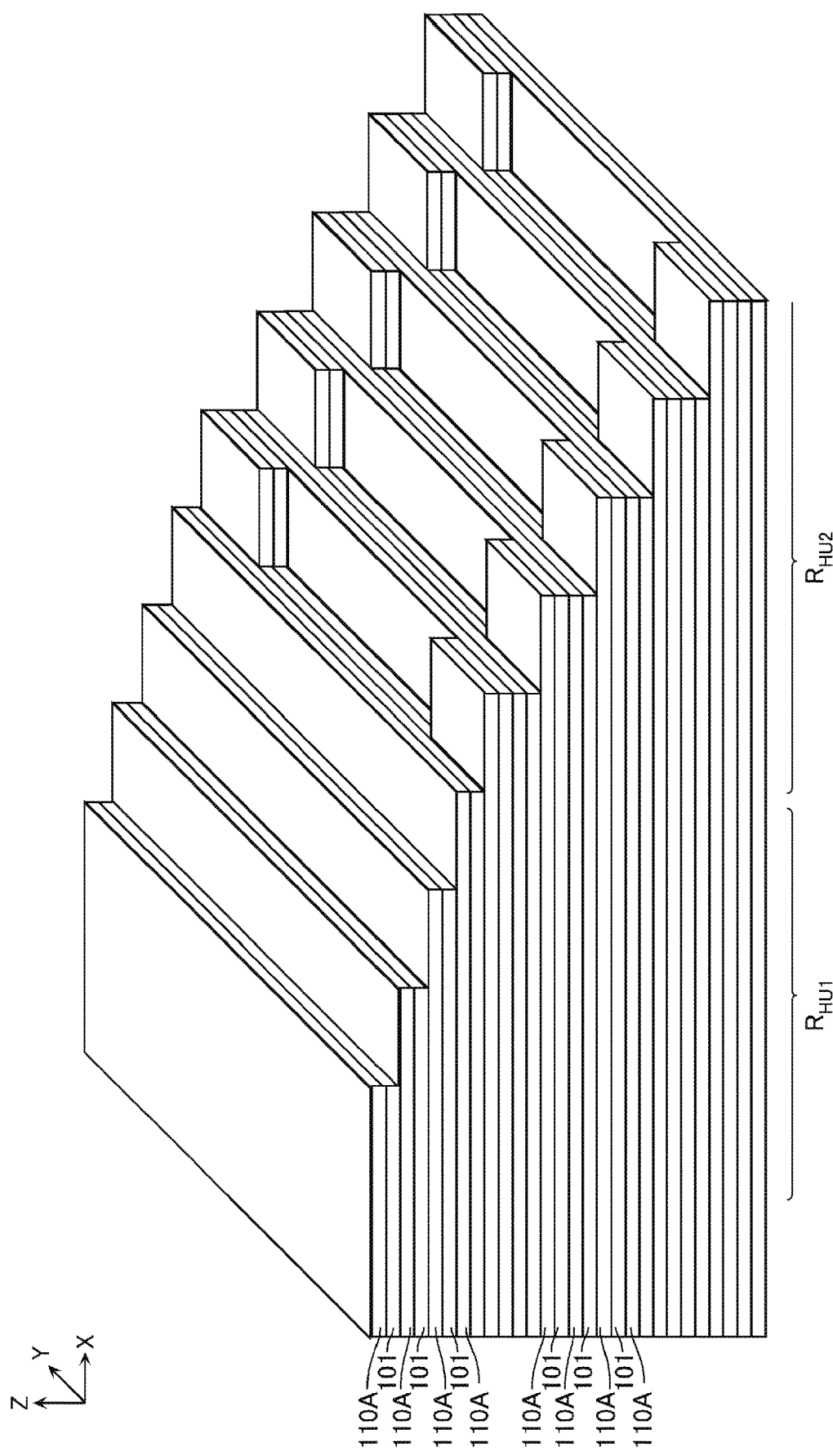
FIG. 21 is a schematic perspective view illustrating the manufacturing method according to at least one embodiment.

In the same manner, the process illustrated with reference to FIG. 19 and the process illustrated with reference to FIG. 20 are repeatedly performed a plurality of times. When an end portion of the resist $r_{HUY}$ reaches the first hookup region $R_{HU1}$ and the configuration in the first hookup region $R_{HU1}$ is exposed, a process of removing the sacrificial layer 110A and the insulating layer 101 one by one by using the resist $r_{HUY}$ as a mask and of removing a part of the resist $r_{HUY}$ is repeatedly performed a plurality of times. Accordingly, for example, an approximately stepped structure as illustrated in FIG. 21 is formed.

Next, the insulating layer 102 (refer to FIG. 10C) that covers this stepped structure is formed. For example, this process is performed by a method such as CVD.

Figure 22:
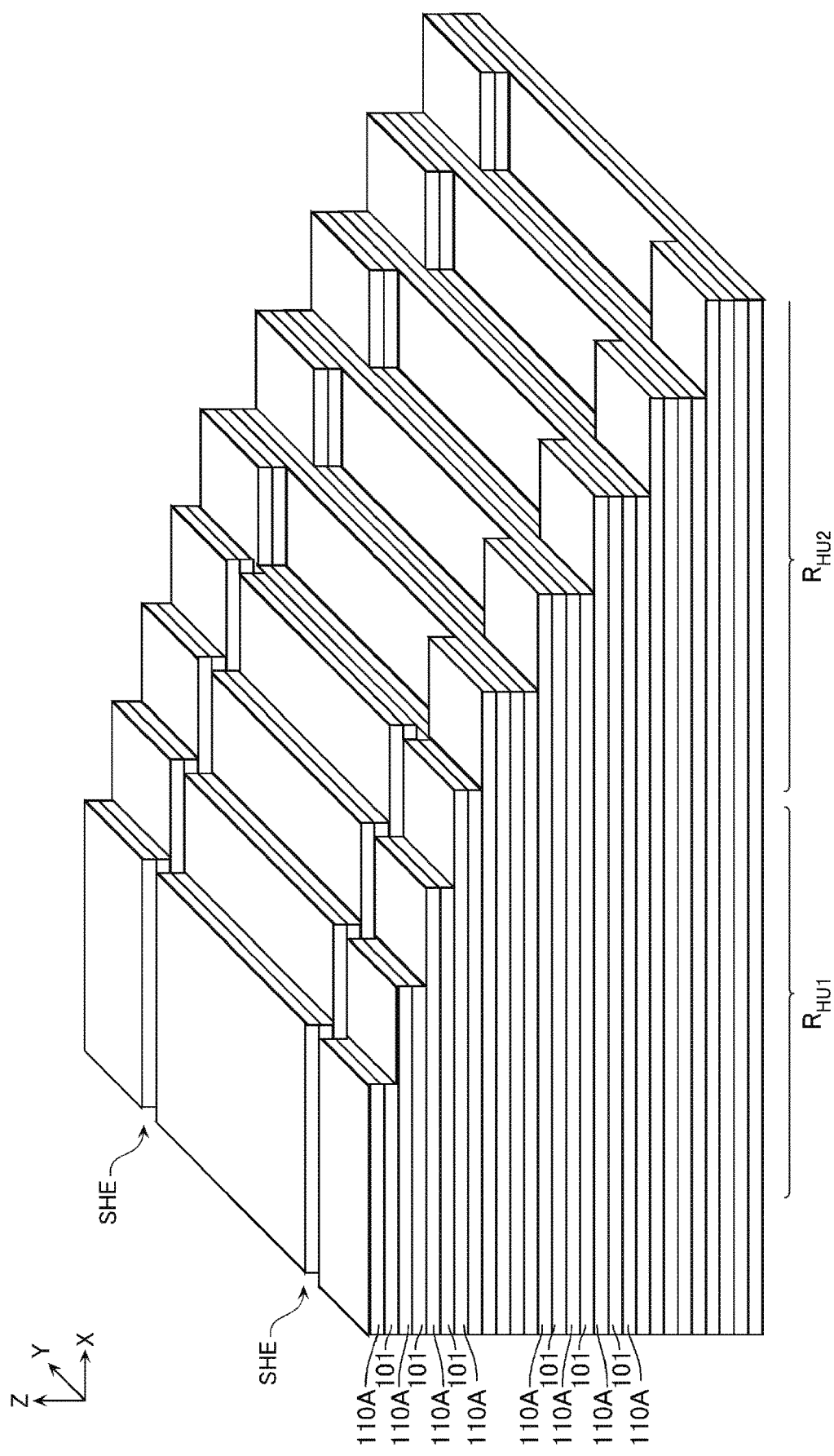
FIG. 22 is a schematic perspective view illustrating the manufacturing method according to at least one embodiment.

Next, for example, as illustrated in FIG. 22, the insulating layer between the string units SHE is formed. In this process, for example, a groove is formed at a location corresponding to the insulating layer between the string units SHE. This groove is a groove that extends in the X direction and the Z direction, and divides a part of the plurality of sacrificial layers 110A and the plurality of insulating layers 101 in the Y direction. For example, this process is performed by a method such as RIE. Next, the insulating layer between the string units SHE is formed inside the groove. For example, this process is performed by a method such as CVD.

Figure 23:
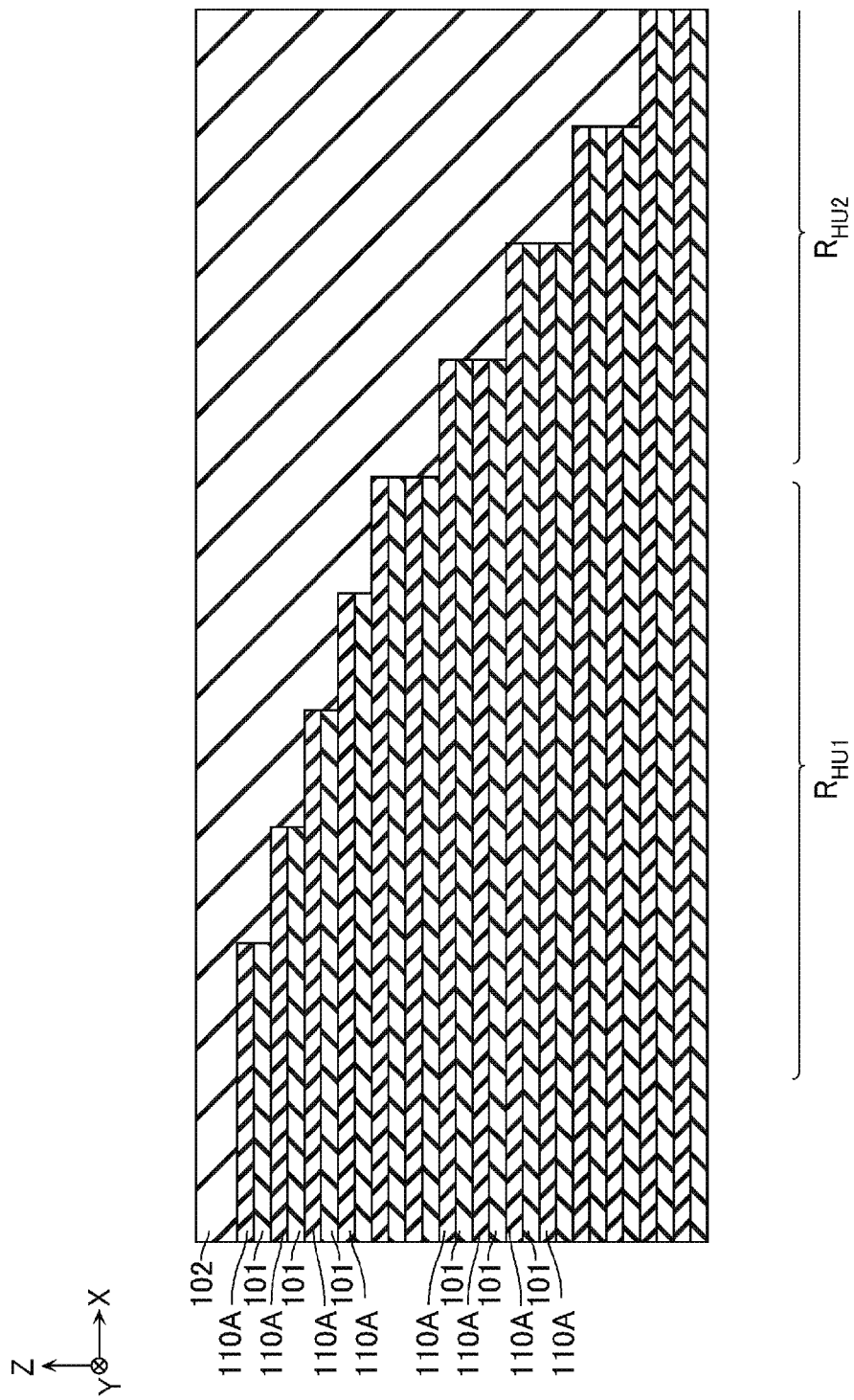
FIG. 23 is a schematic perspective view illustrating the manufacturing method according to at least one embodiment.

FIG. 23 illustrates a structure in the first hookup region $R_{HU1}$ and the second hookup region $R_{HU2}$ at this time.

Figure 24:
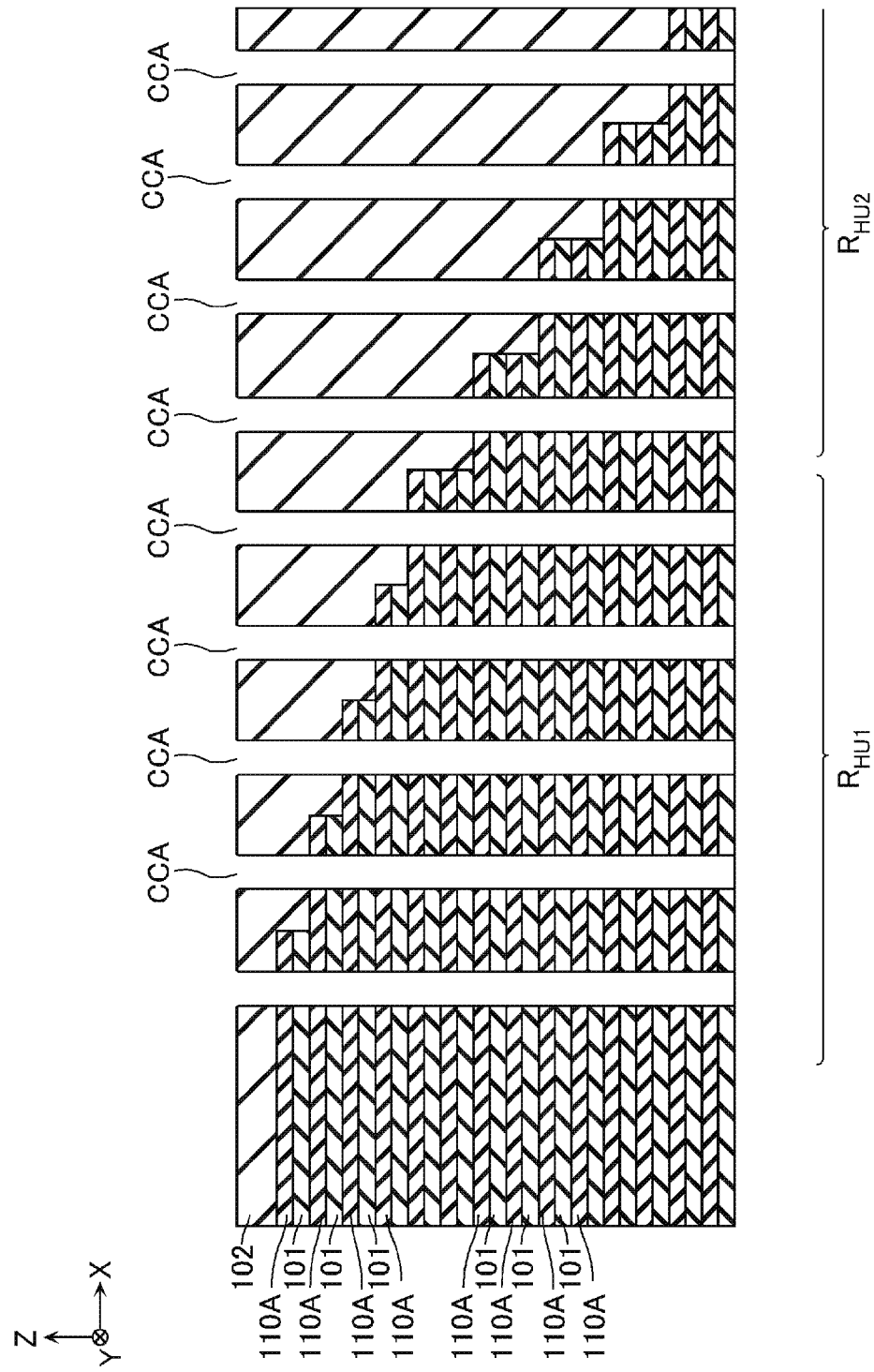
FIG. 24 is a schematic perspective view illustrating the manufacturing method according to at least one embodiment.
Figure 25:
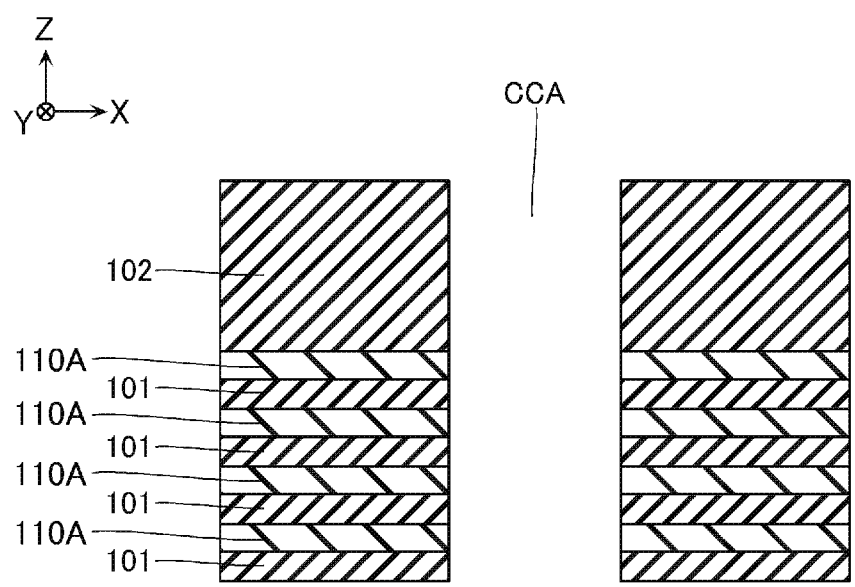
FIG. 25 is a schematic perspective view illustrating the manufacturing method according to at least one embodiment.

Next, for example, as illustrated in FIGS. 24 and 25, a plurality of contact holes CCA are formed at locations corresponding to the plurality of contacts CC. The contact hole CCA is a through via hole that extends in the Z direction, and penetrates the plurality of sacrificial layers 110A and the plurality of insulating layers 101 arranged in the Z direction, and the insulating layer 102. For example, this process is performed by a method such as RIE.

Figure 26:
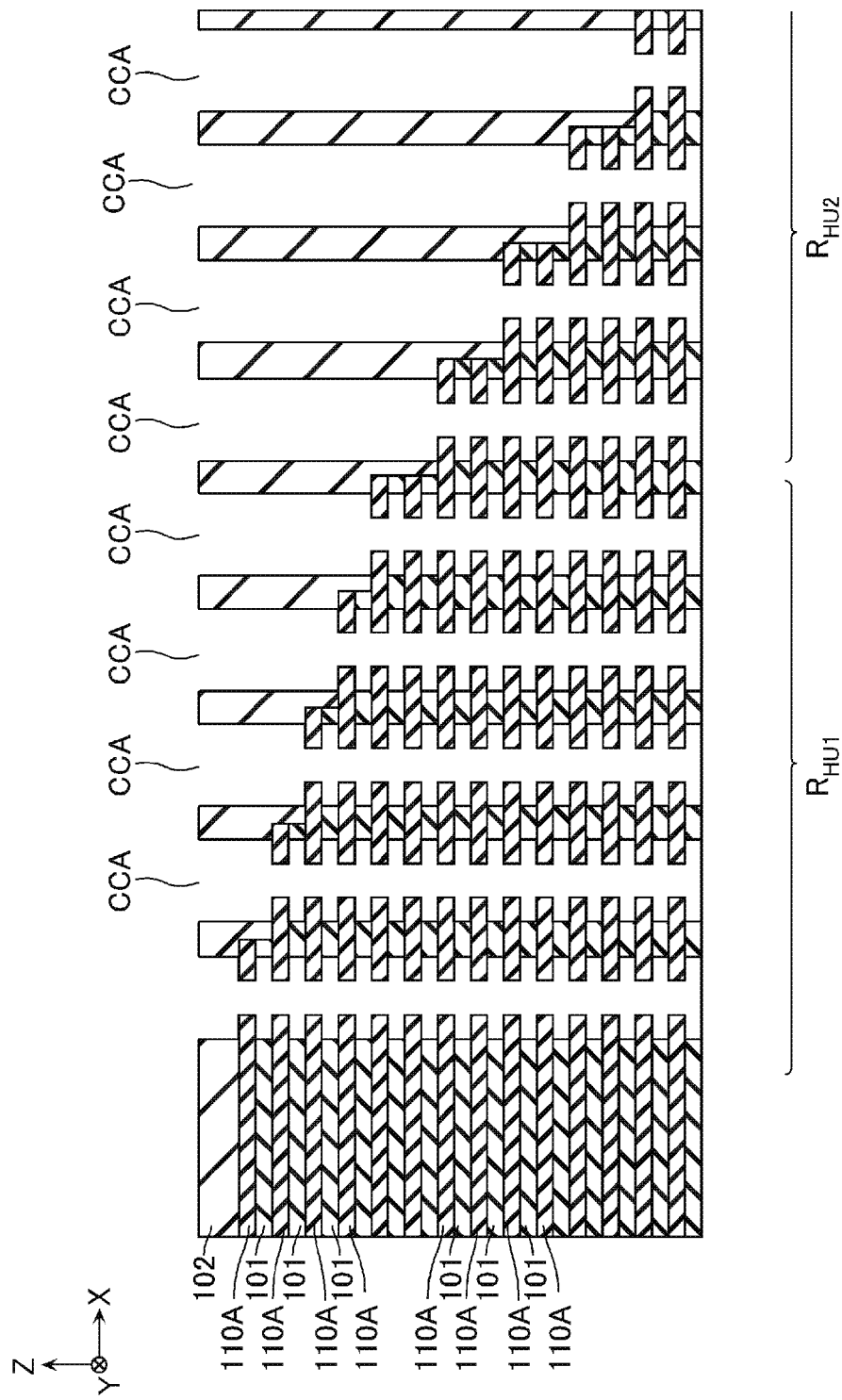
FIG. 26 is a schematic perspective view illustrating the manufacturing method according to at least one embodiment.
Figure 27:
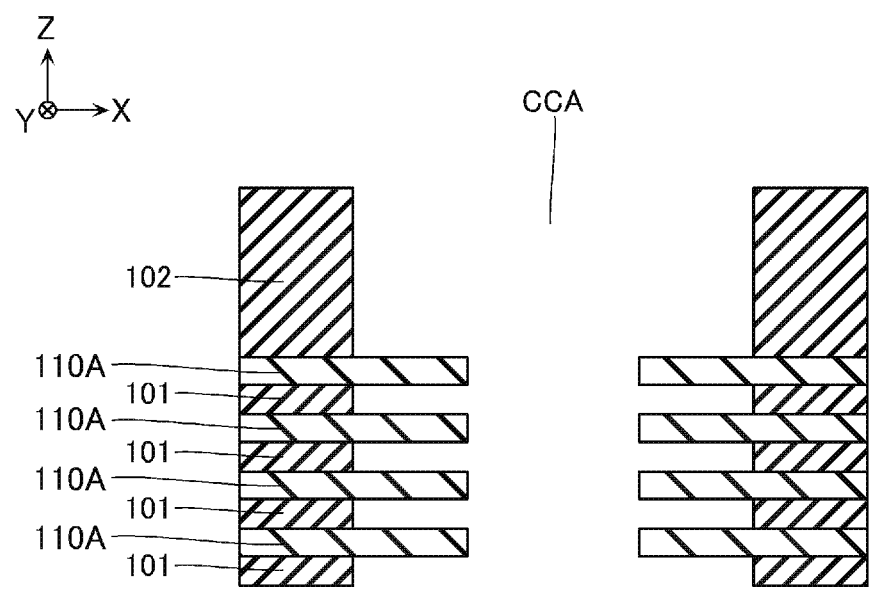
FIG. 27 is a schematic perspective view illustrating the manufacturing method according to at least one embodiment.

Next, for example, as illustrated in FIGS. 26 and 27, a part of the plurality of insulating layers 101 arranged in the Z direction and the insulating layer 102 is removed. Accordingly, an inner diameter of the contact hole CCA at a location corresponding to the insulating layer 101 and a location corresponding to the insulating layer 102 becomes large. In this process, for example, wet etching is performed under such a condition that the etching rate of silicon oxide ($SiO_2$) becomes higher than the etching rate of silicon nitride (SiN).

Figure 28:
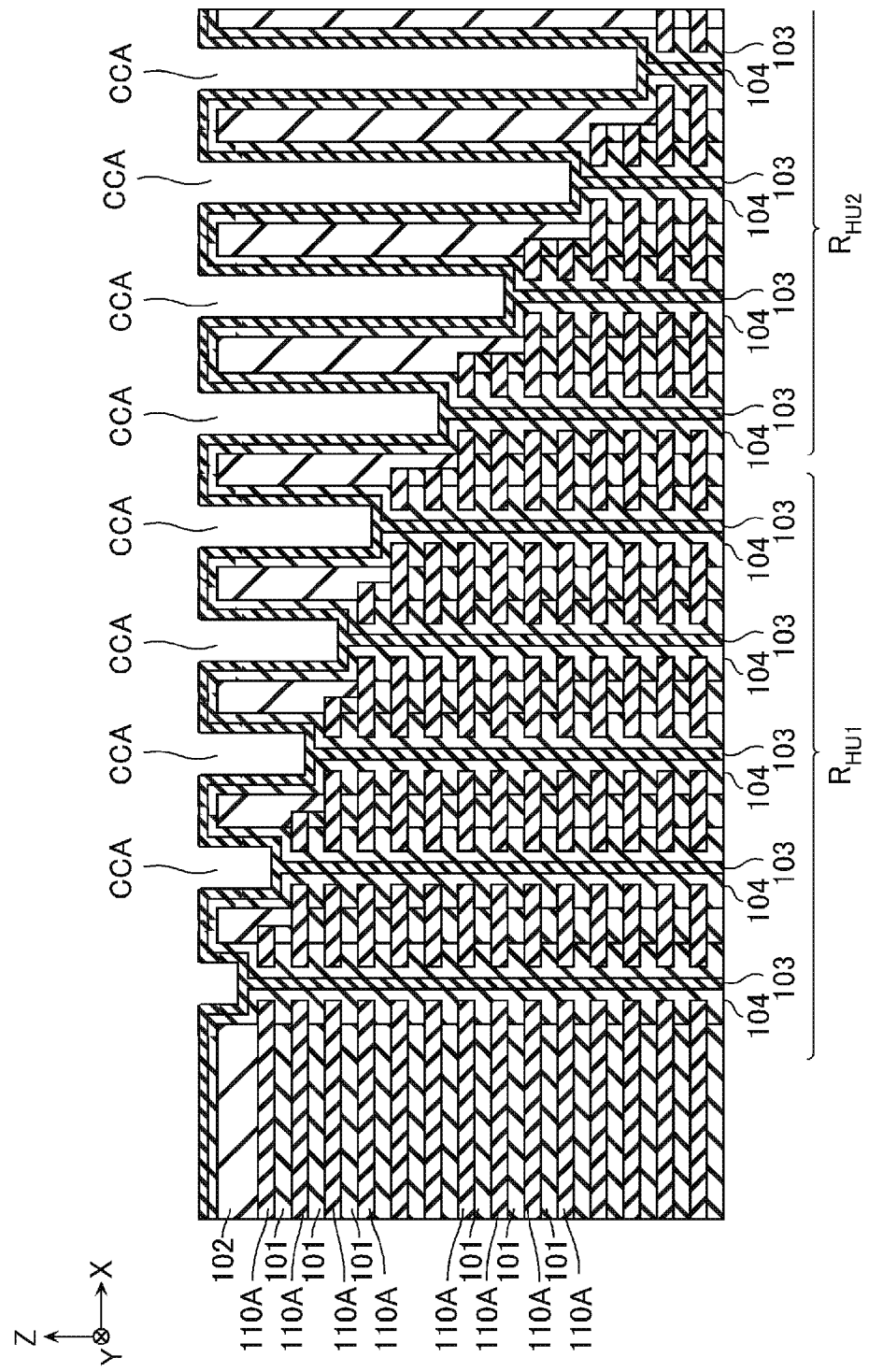
FIG. 28 is a schematic perspective view illustrating the manufacturing method according to at least one embodiment.
Figure 29:
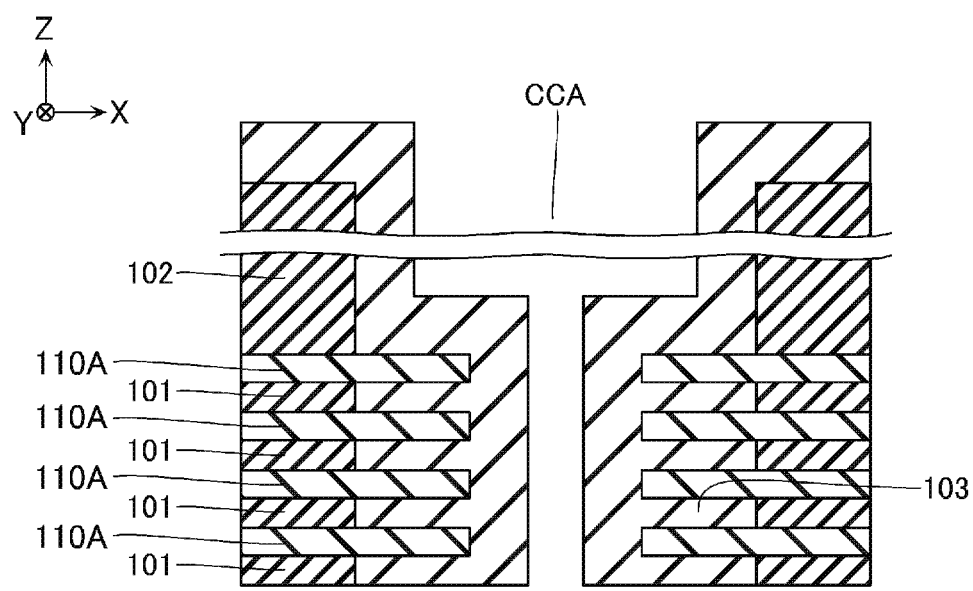
FIG. 29 is a schematic perspective view illustrating the manufacturing method according to at least one embodiment.
Figure 30:
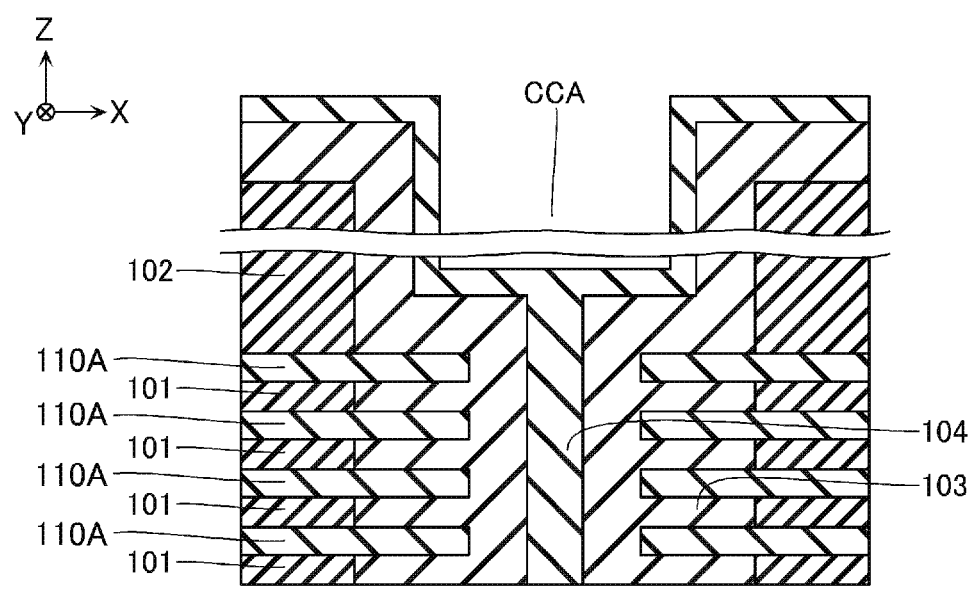
FIG. 30 is a schematic perspective view illustrating the manufacturing method according to at least one embodiment.

Next, for example, as illustrated in FIGS. 28 to 30, the insulating layer 103 and the insulating layer 104 are formed inside the contact hole CCA. For example, as illustrated in FIG. 29, the insulating layer 103 is formed inside the contact hole CCA. The insulating layer 103 is formed thick enough to embed a space between the sacrificial layers 110A adjacent to each other in the Z direction, and thin enough not to embed the contact hole CCA. Accordingly, an inner diameter of a lower portion of the contact hole CCA (a portion provided at a height location corresponding to the sacrifice layer 110A and the insulating layer 101) becomes smaller than an inner diameter of an upper portion of the contact hole CCA (a portion provided at a height location corresponding to the insulating layer 102). Next, for example, as illustrated in FIG. 30, the insulating layer 104 is formed inside the contact hole CCA. The insulating layer 104 is formed thick enough to embed the lower portion of the contact hole CCA, and thin enough not to embed the upper portion of the contact hole CCA.

Figure 31:
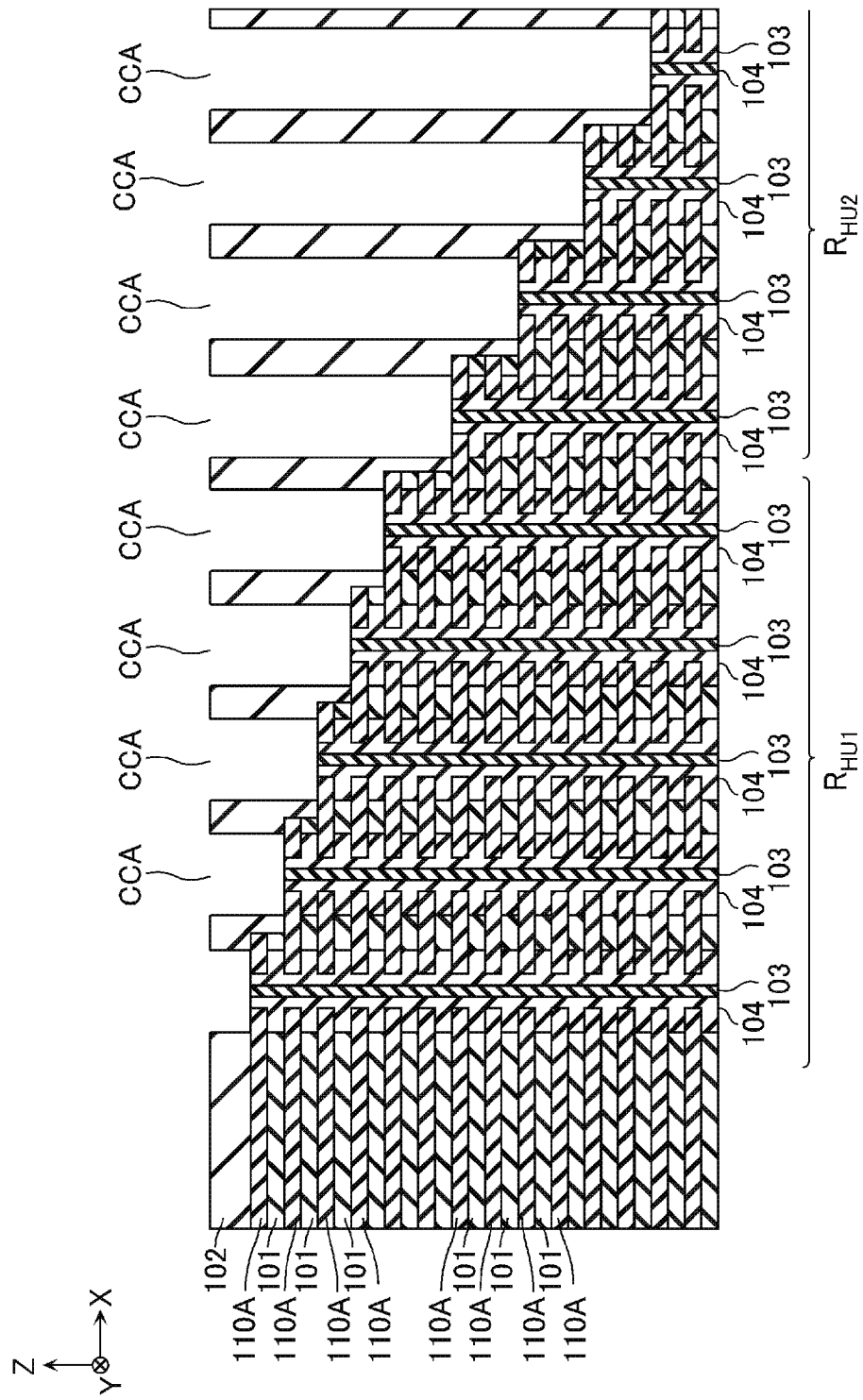
FIG. 31 is a schematic perspective view illustrating the manufacturing method according to at least one embodiment.
Figure 32:
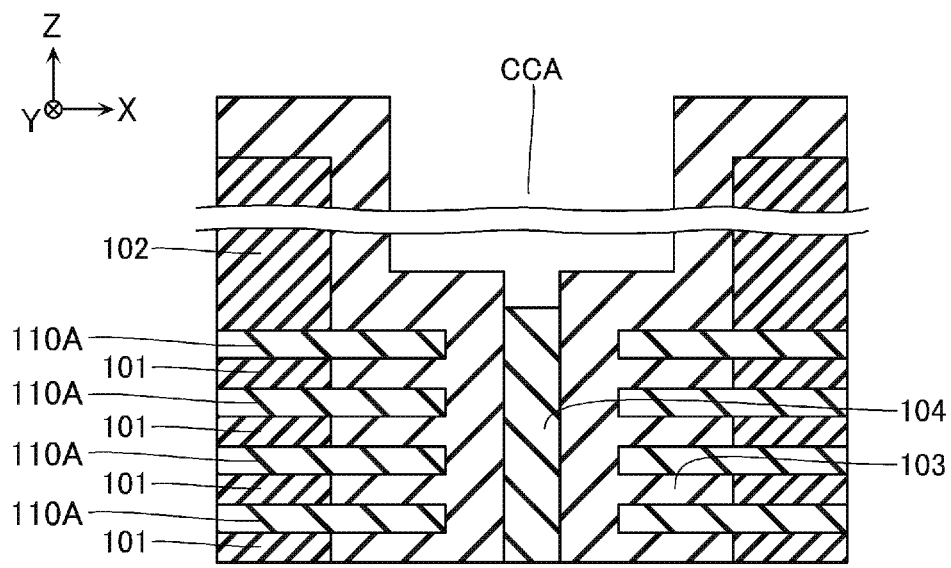
FIG. 32 is a schematic perspective view illustrating the manufacturing method according to at least one embodiment.
Figure 33:
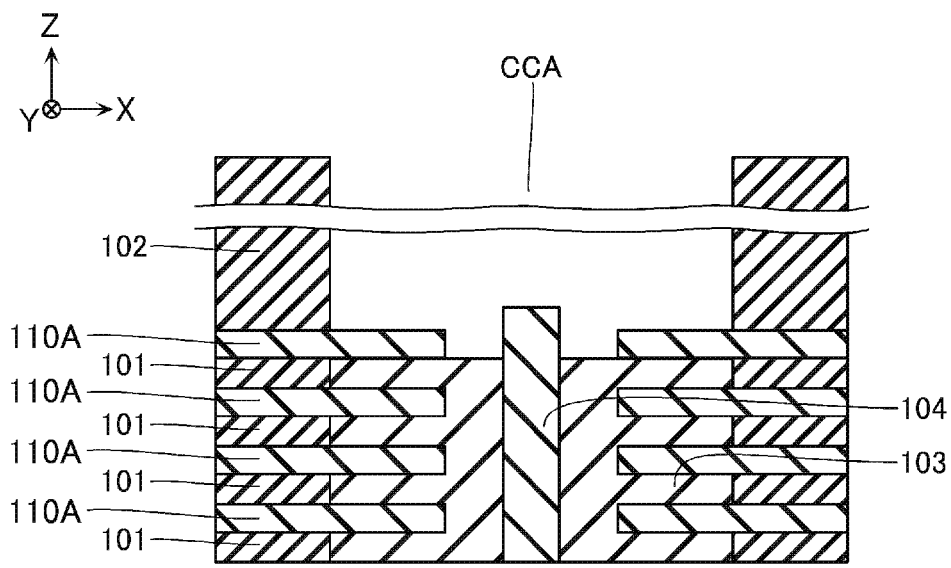
FIG. 33 is a schematic perspective view illustrating the manufacturing method according to at least one embodiment.

Next, for example, as illustrated in FIGS. 31 to 33, a portion of the insulating layer 103 and the insulating layer 104 that is formed on the upper portion of the contact hole CCA is removed. For example, as illustrated in FIG. 32, apart of the insulating layer 104 is removed. In this process, for example, the wet etching is performed under such a condition that the etching rate of silicon nitride (SiN) becomes higher than the etching rate of silicon oxide ($SiO_2$). For example, as illustrated in FIG. 33, a part of the insulating layer 103 is removed. In this process, for example, the wet etching performed under such a condition that the etching rate of silicon oxide ($SiO_2$) becomes higher than the etching rate of silicon nitride (SiN).

Figure 34:
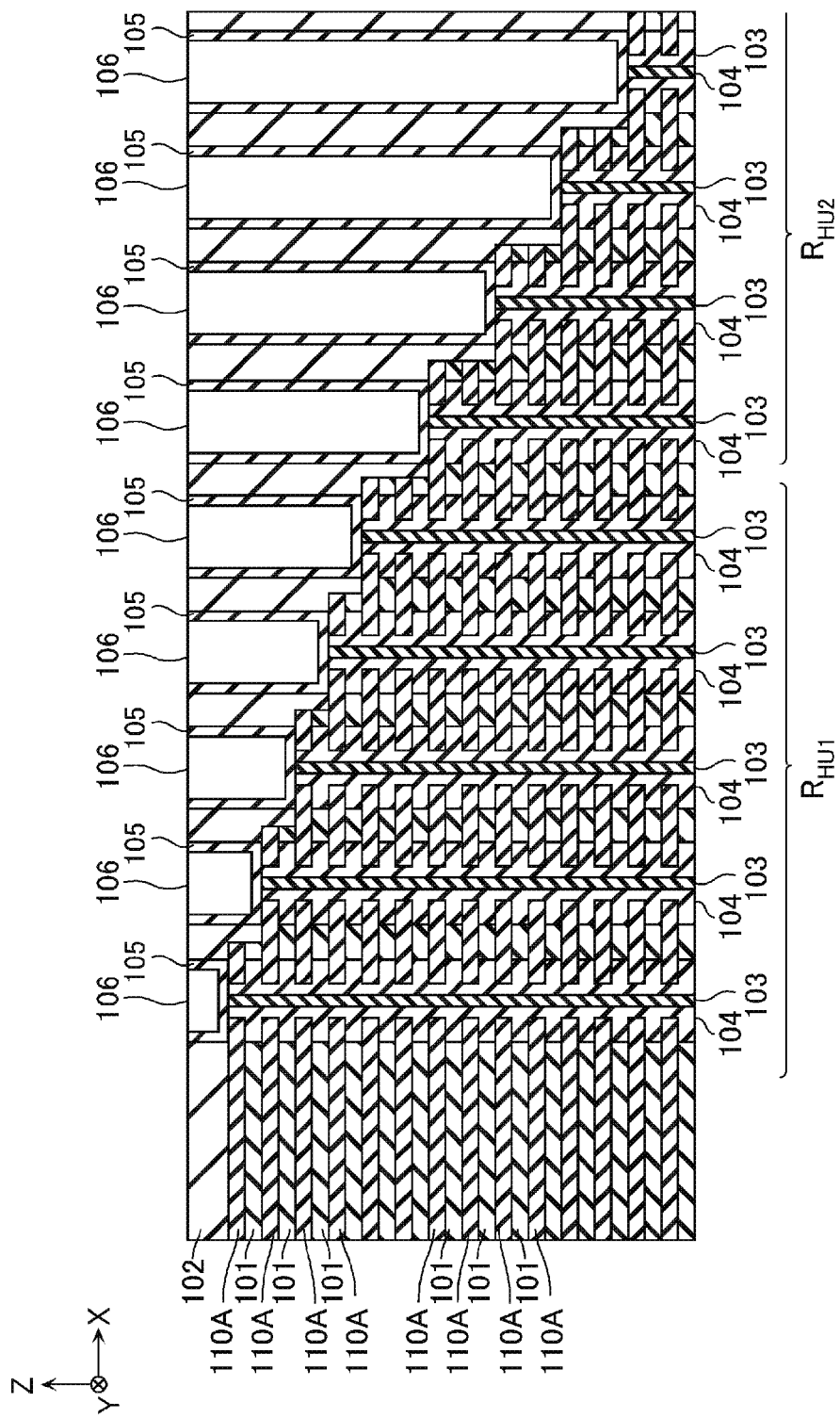
FIG. 34 is a schematic perspective view illustrating the manufacturing method according to at least one embodiment.
Figure 35:
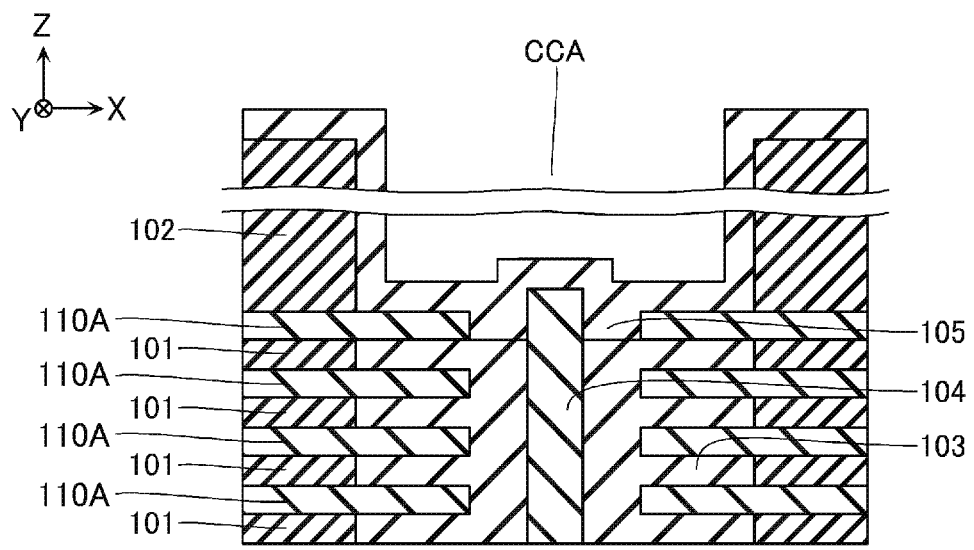
FIG. 35 is a schematic perspective view illustrating the manufacturing method according to at least one embodiment.
Figure 36:
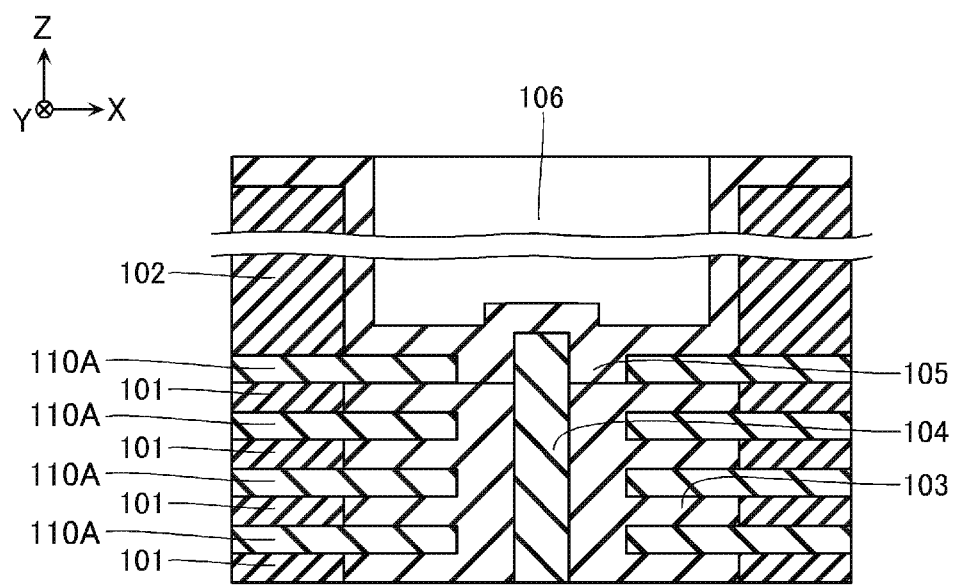
FIG. 36 is a schematic perspective view illustrating the manufacturing method according to at least one embodiment.

Next, for example, as illustrated in FIGS. 34 to 36, the insulating layer 105 and the sacrificial layer 106 are formed inside the contact hole CCA. For example, as illustrated in FIG. 35, the insulating layer 105 is formed inside the contact hole CCA. The insulating layer 105 is formed thick enough to embed a space between the sacrificial layer 110A and the insulating layer 104, and thin enough not to embed the contact hole CCA. Next, for example, as illustrated in FIG. 36, the sacrificial layer 106 such as amorphous silicon is formed inside the contact hole CCA. The sacrifice layer 106 is formed thick enough to embed the contact hole CCA.

Figure 37:
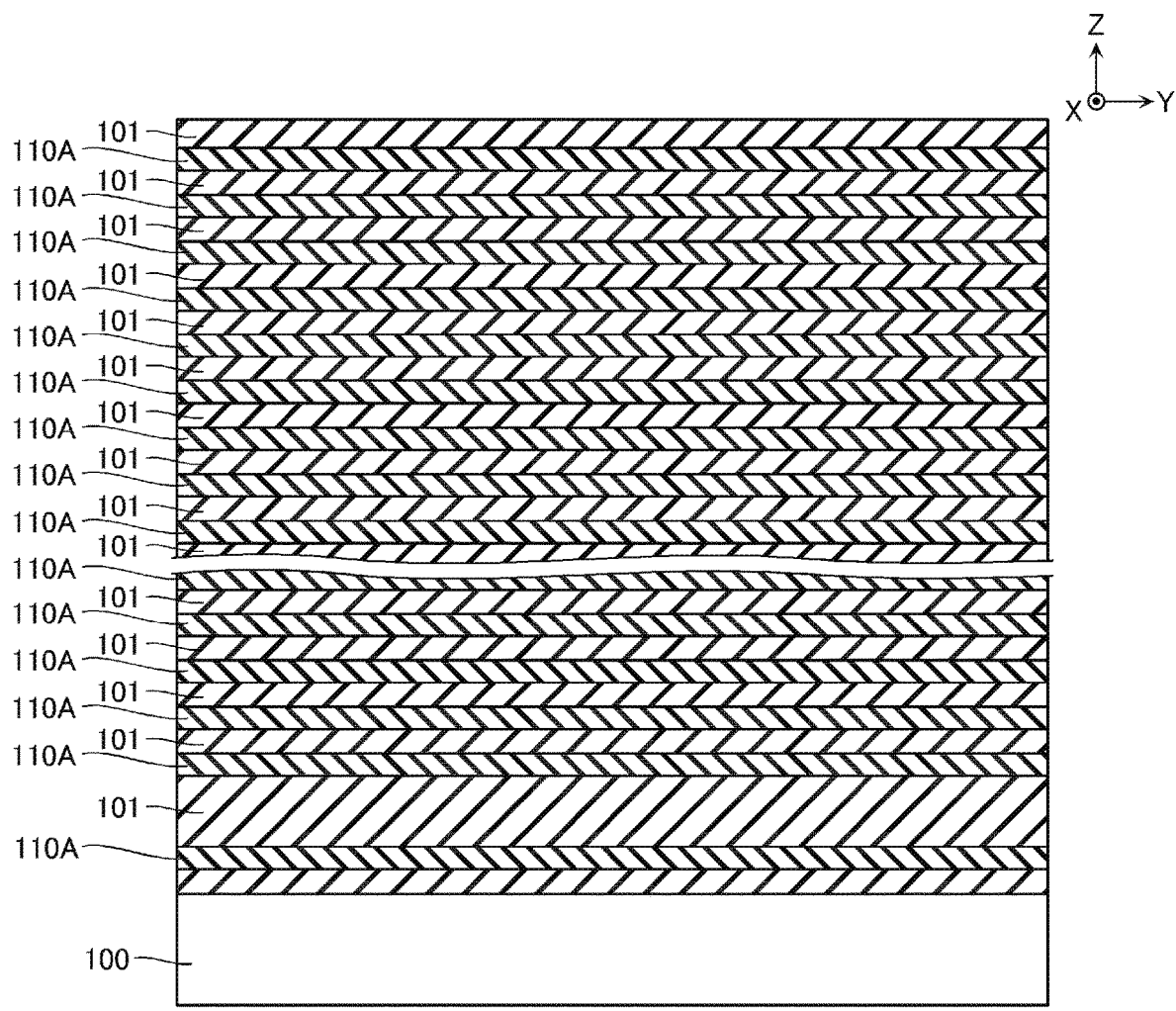
FIG. 37 is a schematic perspective view illustrating the manufacturing method according to at least one embodiment.

FIG. 37 illustrates a structure of the memory cell array region $R_{MCA}$ at this time.

Figure 38:
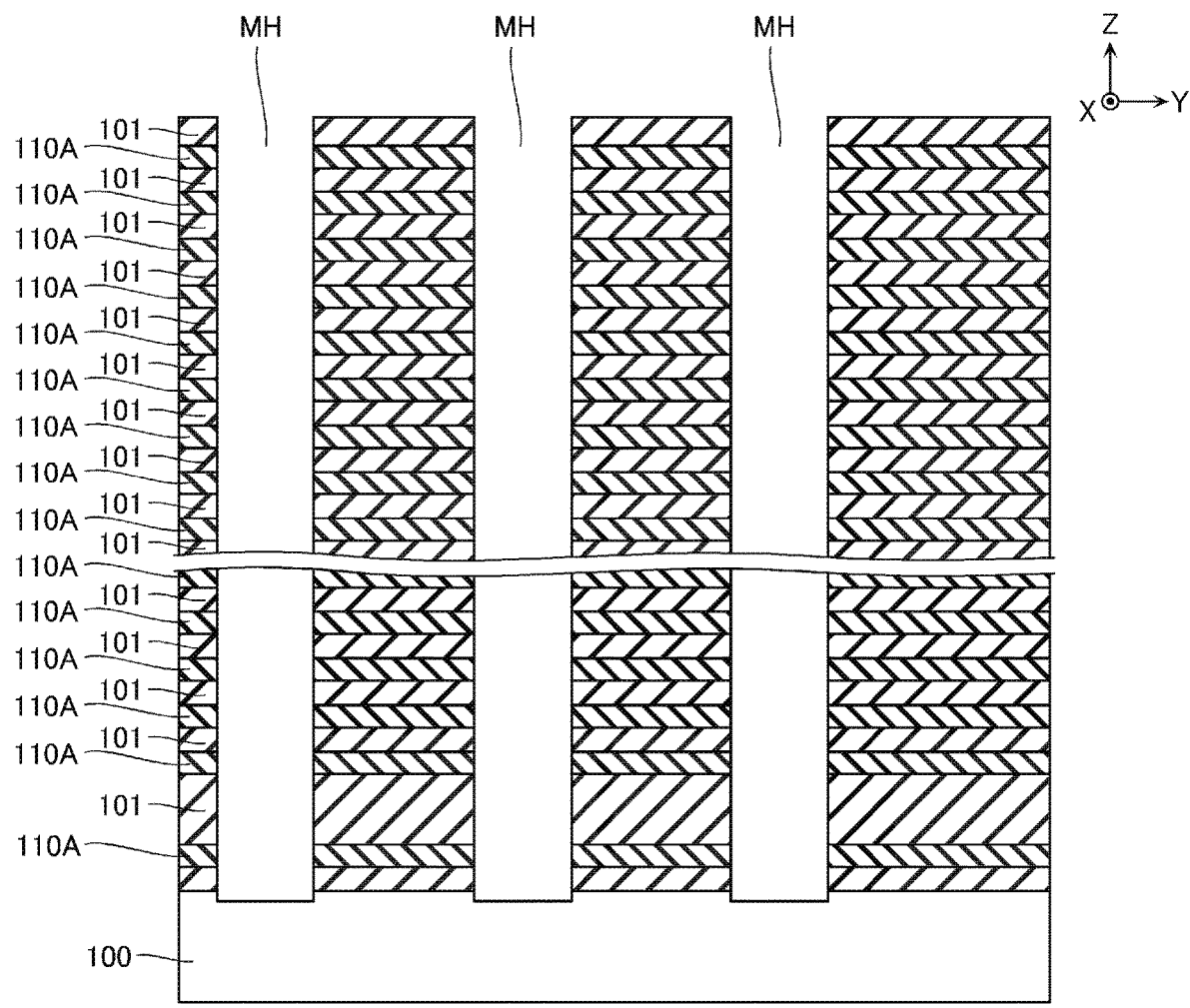
FIG. 38 is a schematic perspective view illustrating the manufacturing method according to at least one embodiment.

Next, for example, as illustrated in FIG. 38, a plurality of memory holes MH are formed at a location corresponding to the semiconductor layer 120 and a location corresponding to the support structure HR. The memory hole MH is a through via hole that extends in the Z direction, penetrates the insulating layer 101 and the sacrificial layer 110A, and exposes the upper surface of the semiconductor substrate 100. For example, this process is performed by a method such as RIE.

Figure 39:
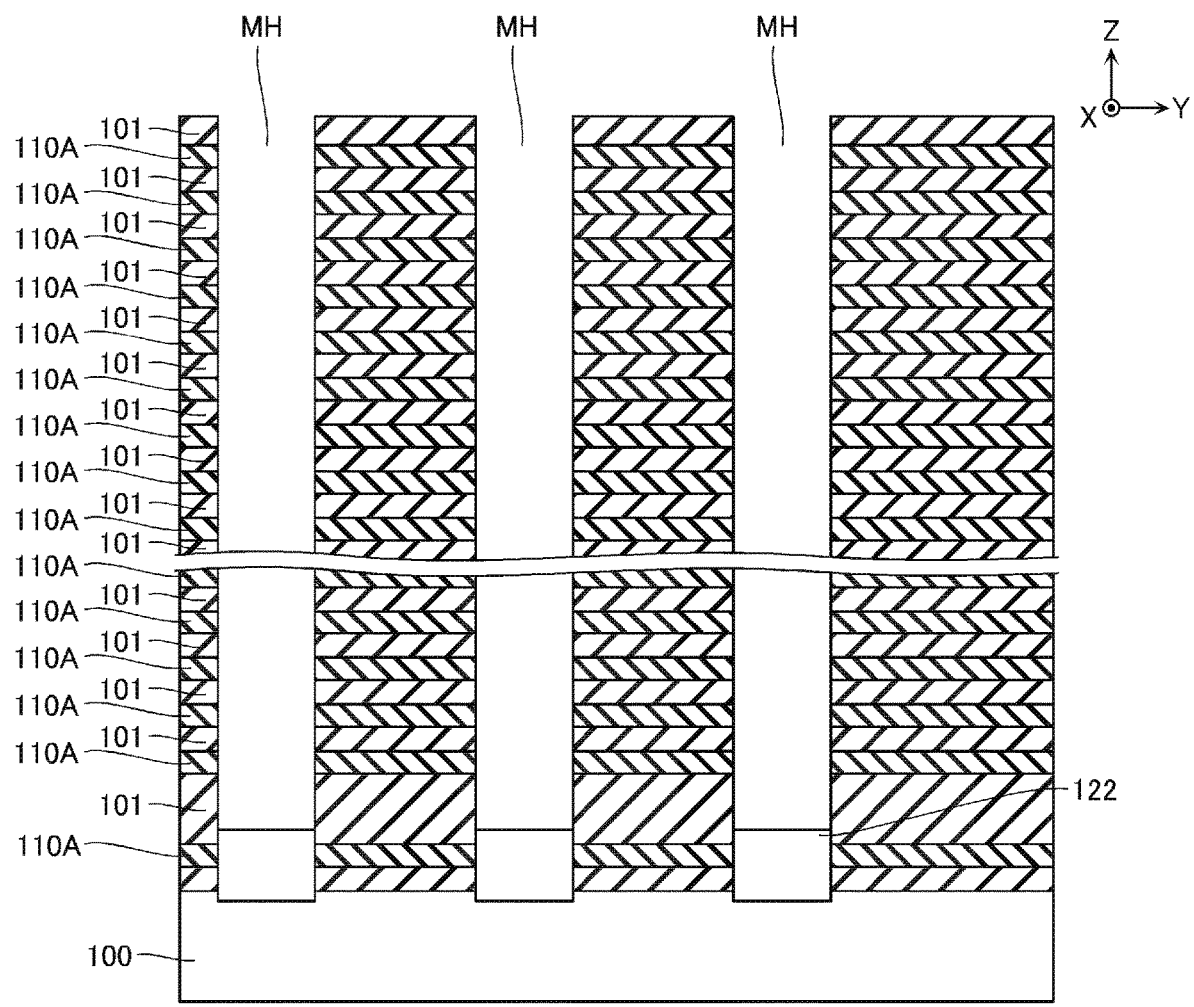
FIG. 39 is a schematic perspective view illustrating the manufacturing method according to at least one embodiment.

Next, for example, as illustrated in FIG. 39, the semiconductor layer 122 is formed on a bottom surface of the memory hole MH. For example, this process is performed by a method such as epitaxial growth.

Figure 40:
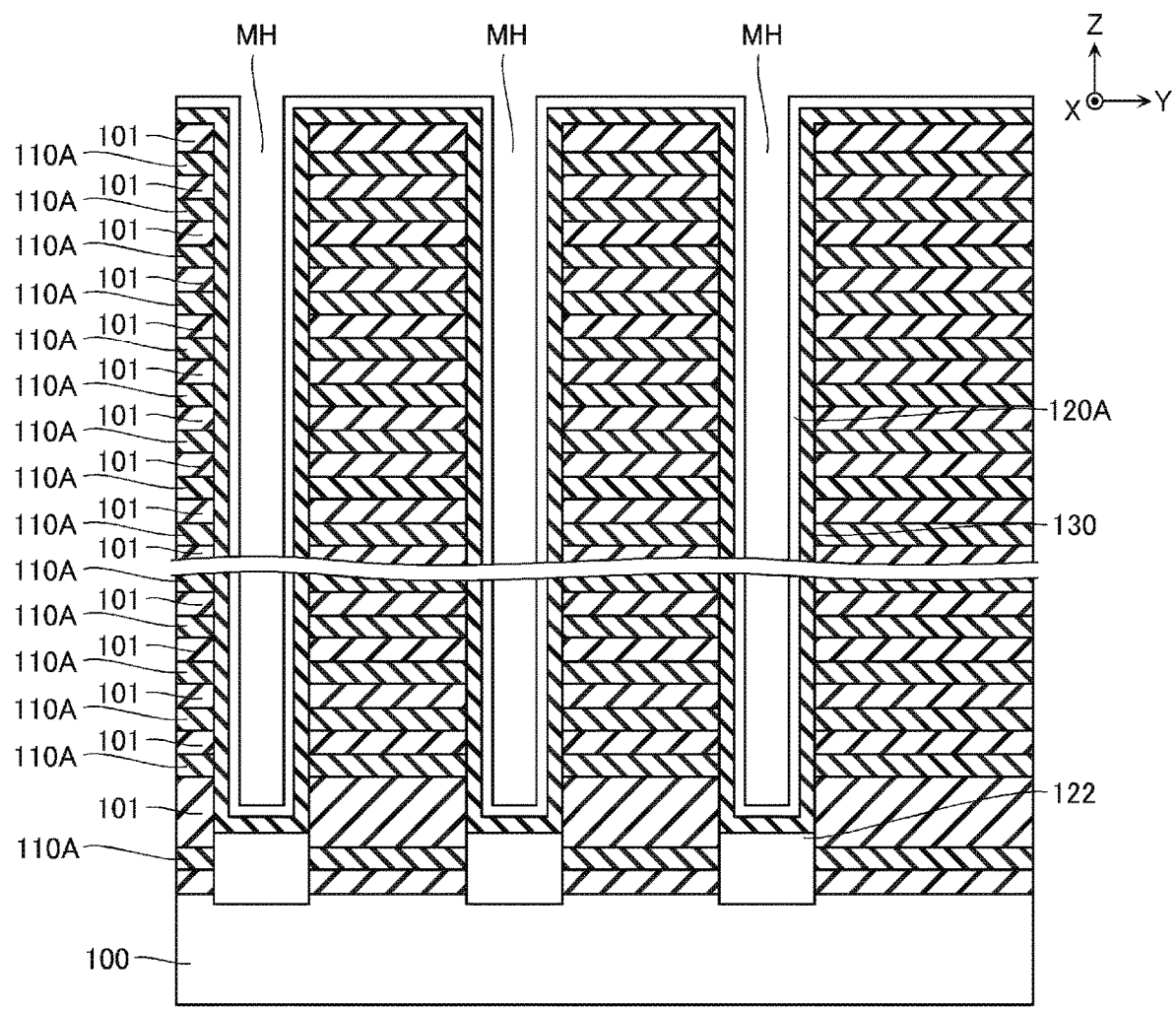
FIG. 40 is a schematic perspective view illustrating the manufacturing method according to at least one embodiment.

Next, for example, as illustrated in FIG. 40, the gate insulating film 130 and an amorphous silicon film 120A are formed on an upper surface of the semiconductor layer 122 and an inner peripheral surface of the memory hole MH. For example, this process is performed by a method such as CVD.

Figure 41:
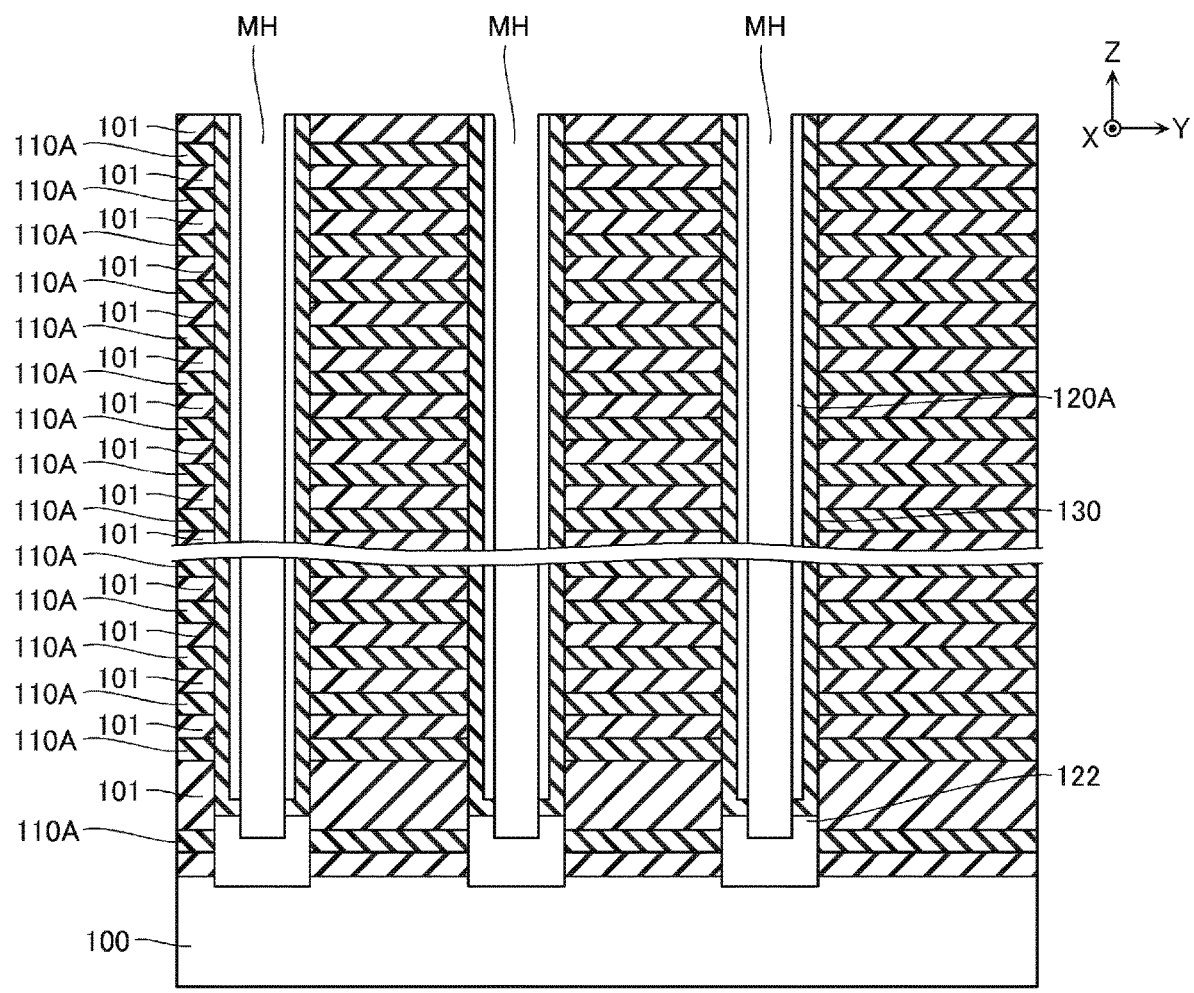
FIG. 41 is a schematic perspective view illustrating the manufacturing method according to at least one embodiment.

Next, for example, as illustrated in FIG. 41, a portion of the gate insulating film 130 and the amorphous silicon film 120A that covers the upper surface of the semiconductor layer 122 is removed. For example, this process is performed by a method such as RIE. In this process, for example, the location corresponding to the support structure HR may be covered with a resist.

Figure 42:
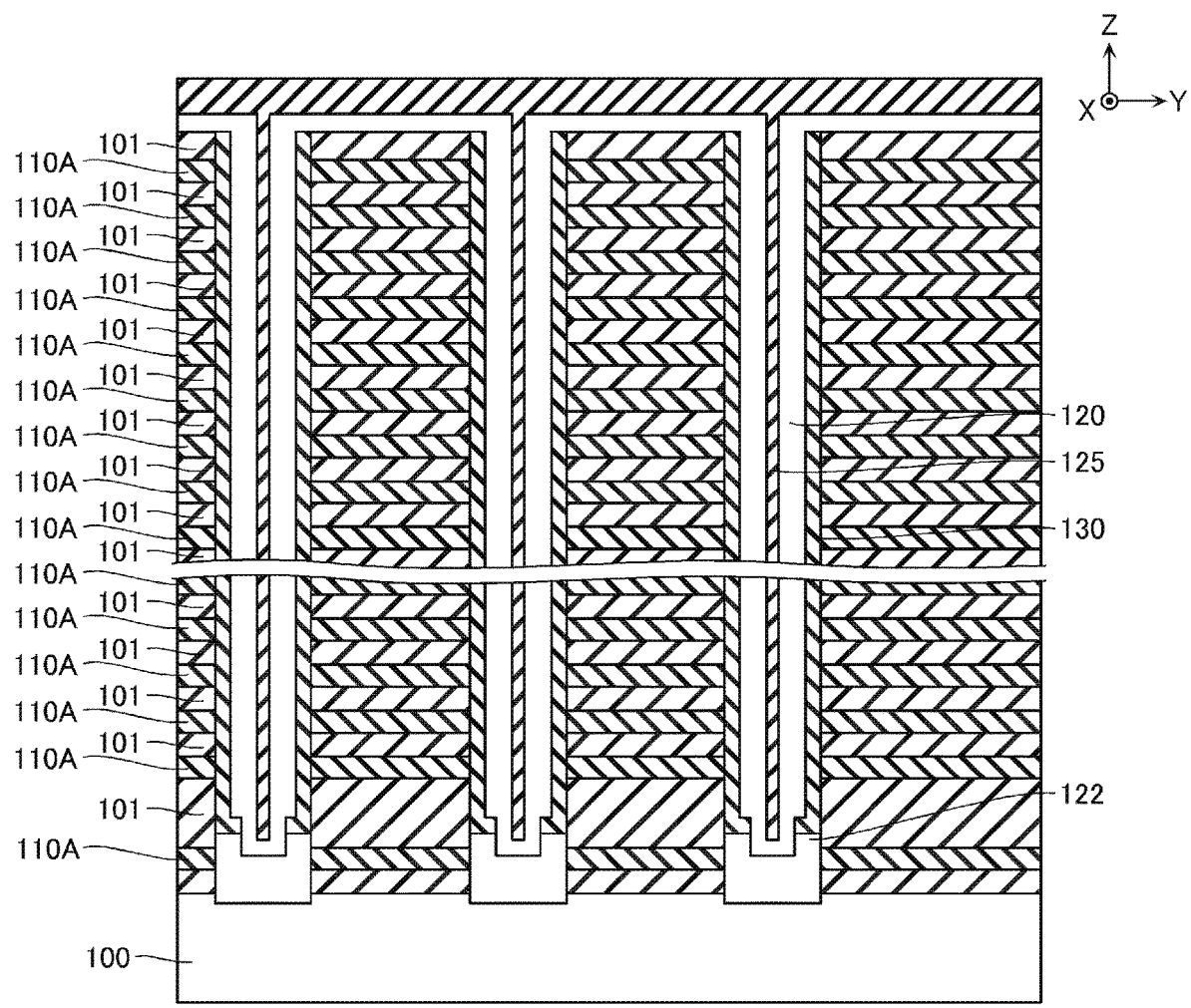
FIG. 42 is a schematic perspective view illustrating the manufacturing method according to at least one embodiment.

Next, for example, as illustrated in FIG. 42, the amorphous silicon film 120A and the insulating layer 125 are formed on the upper surface of the semiconductor layer 122 and an inner peripheral surface of the amorphous silicon film 120A. For example, this process is performed by a method such as CVD. Thereafter, a crystal structure of the amorphous silicon film 120A is modified by an annealing process and the semiconductor layer 120 is formed.

Figure 43:
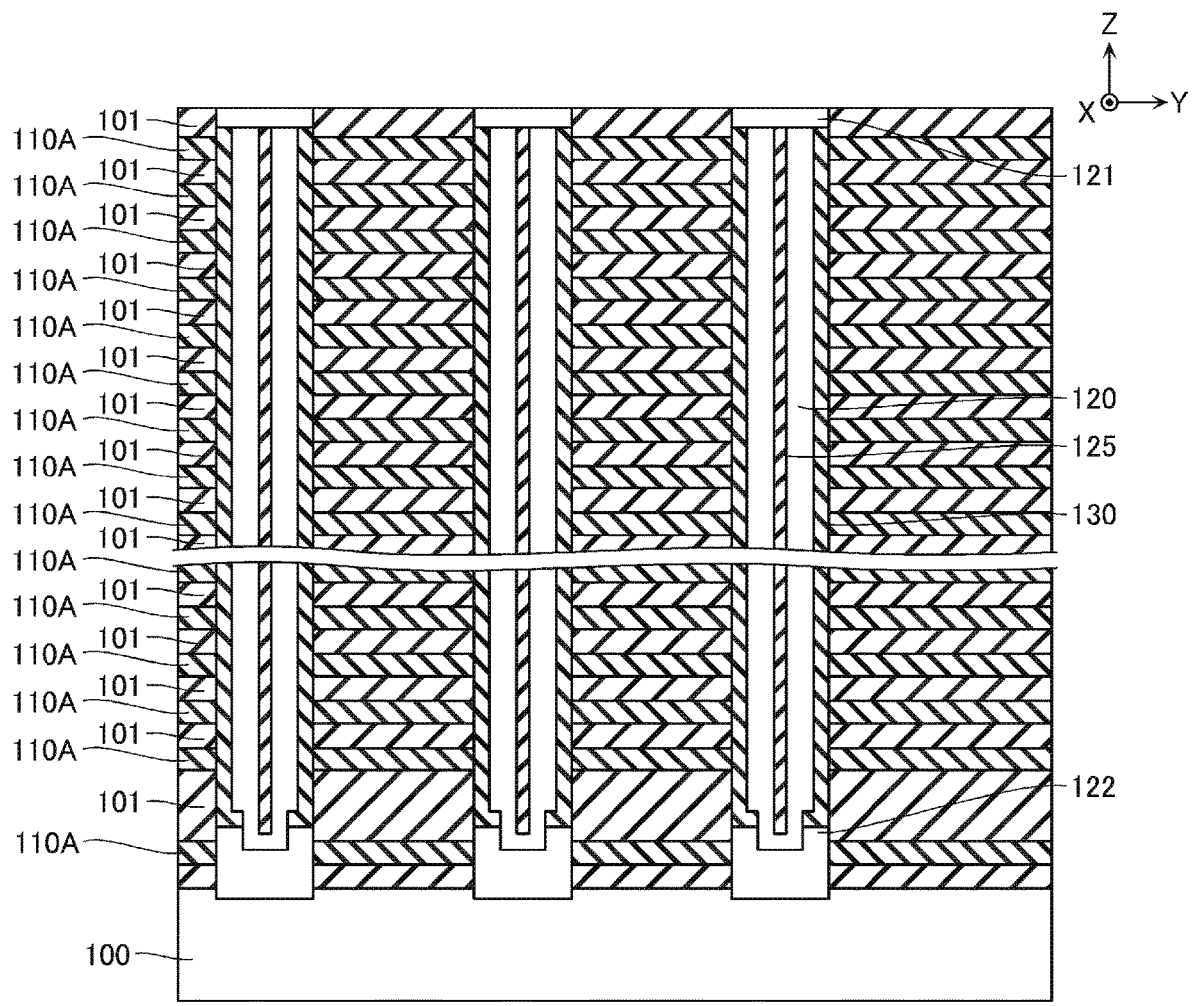
FIG. 43 is a schematic perspective view illustrating the manufacturing method according to at least one embodiment.

Next, as illustrated in FIG. 43, for example, a part of the insulating layer 125, the semiconductor layer 120, and the gate insulating film 130 is removed, thereby exposing the insulating layer 101 located at an uppermost layer. The impurity region 121 of the semiconductor layer 120 is formed near an upper end of the memory hole MH. For example, this process is performed by a method such as RIE and CVD.

Figure 44:
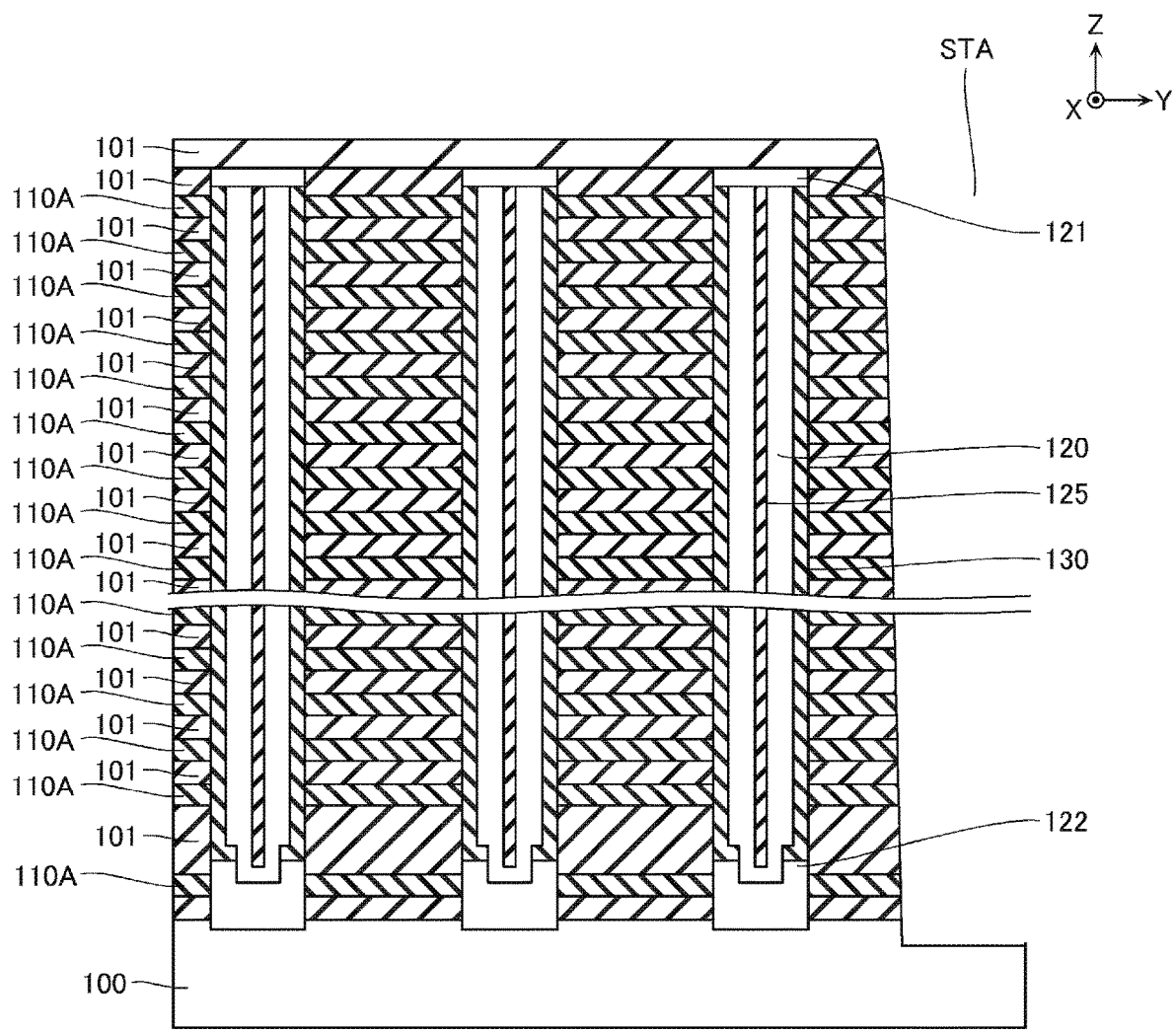
FIG. 44 is a schematic perspective view illustrating the manufacturing method according to at least one embodiment.

Next, for example, as illustrated in FIG. 44, a groove STA is formed. The groove STA is a groove that extends in the Z direction and the X direction, divides the insulating layer 101 and the sacrifice layer 110A in the Y direction, and exposes the upper surface of the semiconductor substrate 100. For example, this process is performed by a method such as RIE.

Figure 45:
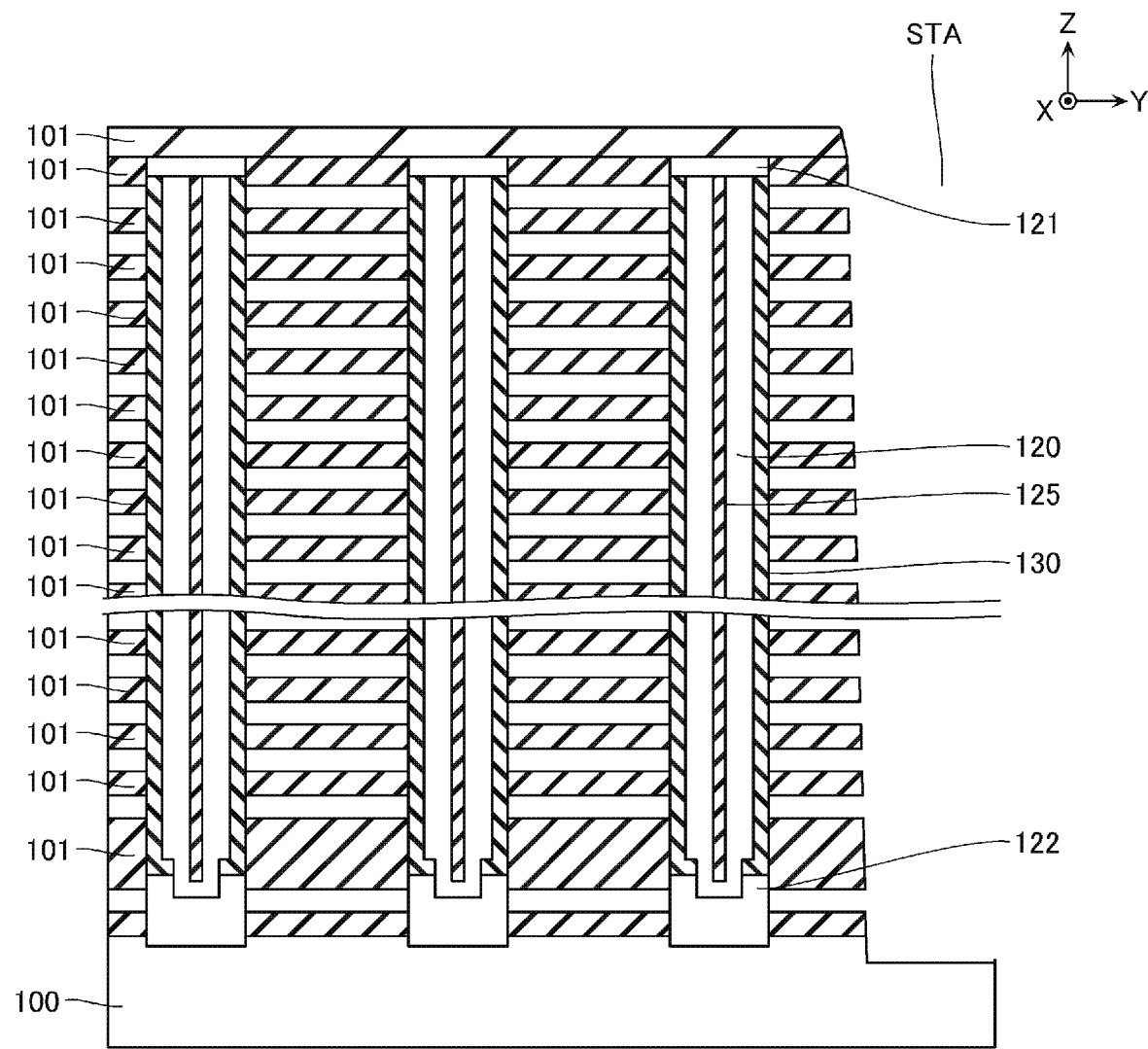
FIG. 45 is a schematic perspective view illustrating the manufacturing method according to at least one embodiment.

Next, for example, as illustrated in FIG. 45, the sacrifice layer 110A is removed via the groove STA. Accordingly, it is possible to form a hollow structure including the plurality of insulating layers 101 arranged in the Z direction; a structure in the memory hole MH supporting the insulating layers 101 (the semiconductor layer 120, the gate insulating film 130, and the insulating layer 125); and the support structure HR. For example, this process can be performed by wet etching.

Figure 46:
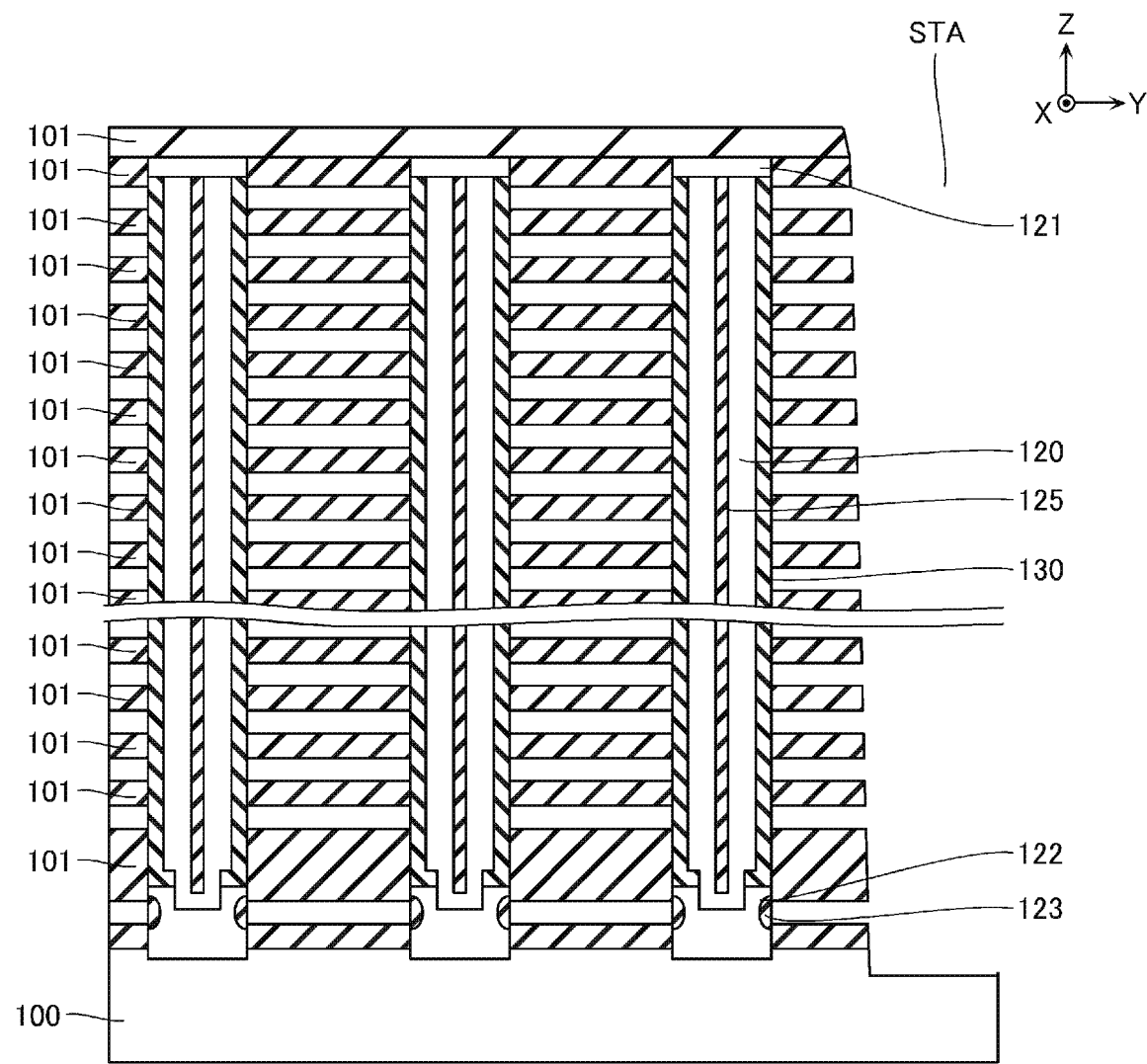
FIG. 46 is a schematic perspective view illustrating the manufacturing method according to at least one embodiment.

Next, for example, as illustrated in FIG. 46, the insulating layer 123 is formed. For example, this process is performed by a method such as an oxidation process.

Figure 47:
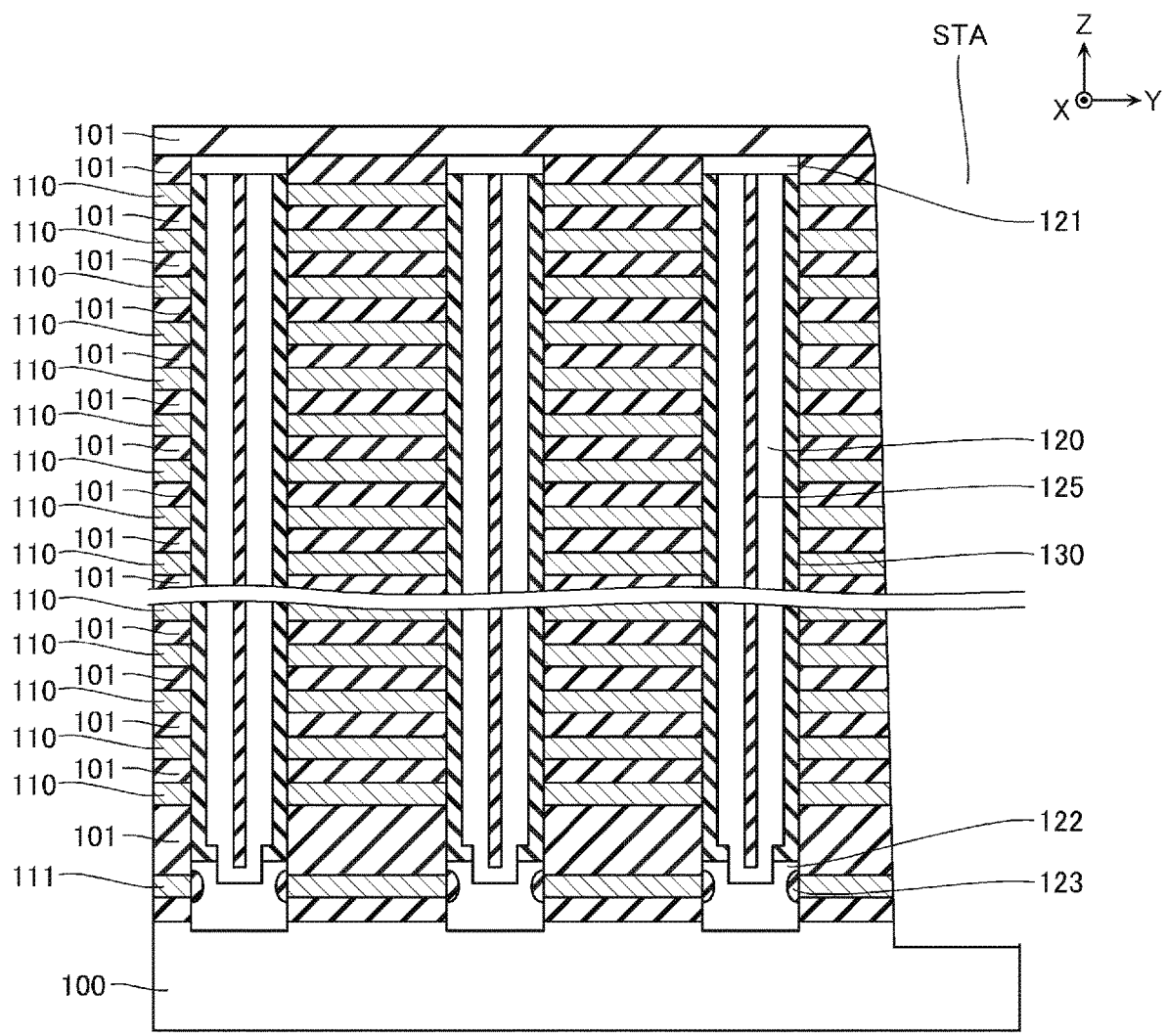
FIG. 47 is a schematic perspective view illustrating the manufacturing method according to at least one embodiment.

Next, for example, as illustrated in FIG. 47, the conductive layer 110 and the conductive layer 111 are formed. For example, this process may be performed by CVD.

Figure 48:
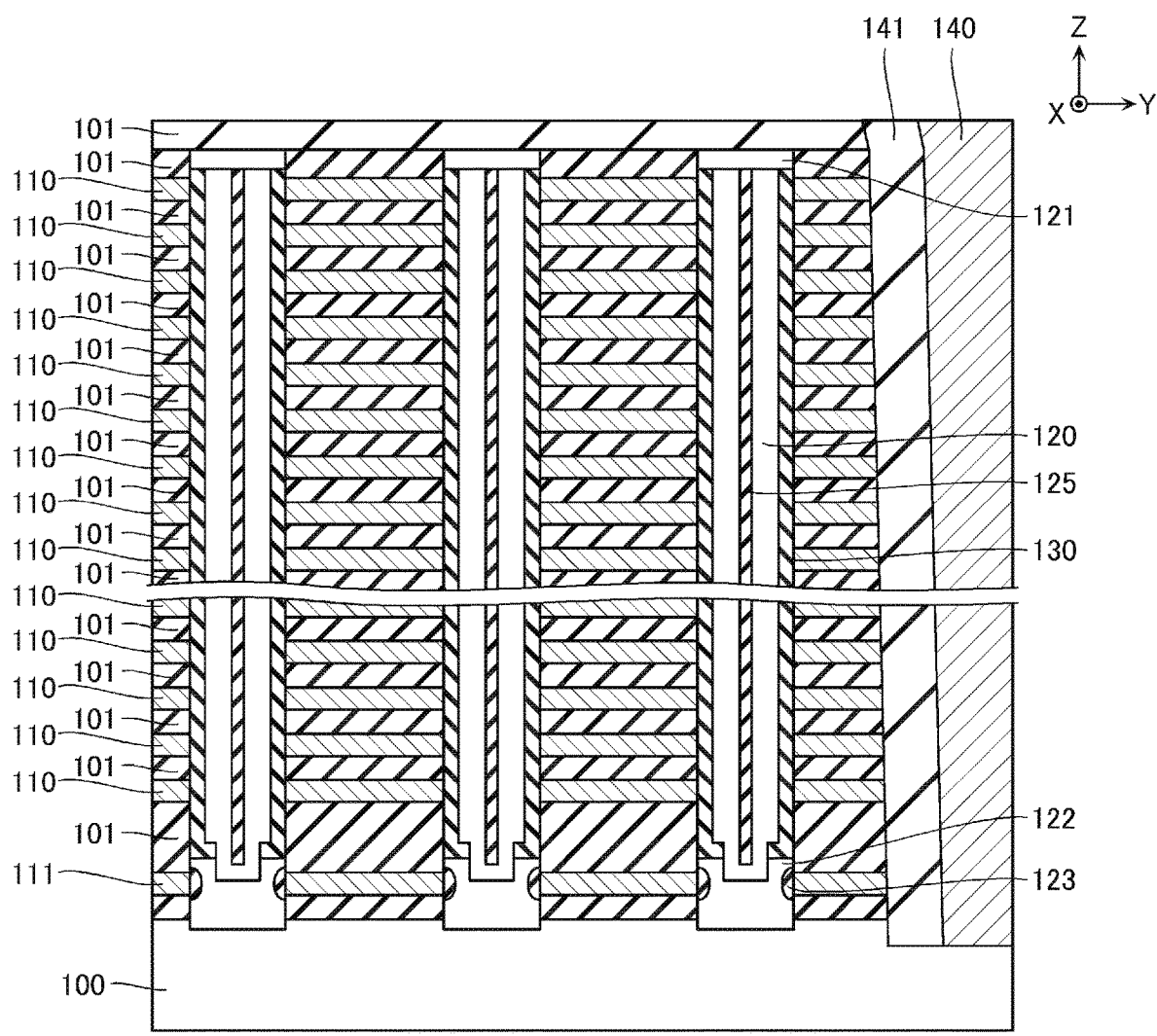
FIG. 48 is a schematic perspective view illustrating the manufacturing method according to at least one embodiment.

Next, for example, as illustrated in FIG. 48, the structure between the finger structures ST is formed in the groove STA. For example, this process may be performed by CVD and RIE.

FIGS. 49 and 50 illustrate a structure in the first hookup region $R_{HU1}$ and the second hookup region $R_{HU2}$ at this time.

Next, for example, as illustrated in FIGS. 51 to 53, the sacrificial layer 106 and the insulating layer 105 are removed. For example, as illustrated in FIG. 52, the sacrifice layer 106 is removed. In this process, for example, the wet etching is performed under such a condition that the etching rate of silicon becomes higher than the etching rate of silicon oxide ($SiO_2$). For example, as illustrated in FIG. 53, a part of the insulating layer 105 is removed. In this process, for example, the wet etching is performed under such a condition that the etching rate of silicon oxide ($SiO_2$) becomes higher than an etching rate of tungsten (W).

Next, for example, as illustrated in FIG. 10C, the contact CC is formed in the contact hole CCA. For example, this process is performed by a method such as CVD and RIE.

Thereafter, a wiring is formed and a wafer is divided by dicing, thereby forming the memory die MD.

Comparative Example

Next, a semiconductor storage device according to a comparative example will be illustrated with reference to FIGS. 54 to 56.

First, a configuration of the semiconductor storage device according to the comparative example will be illustrated with reference to FIG. 54. FIG. 54 is a schematic cross-sectional view illustrating an arrangement of a part of the semiconductor storage device according to the comparative example, and illustrates an arrangement of a portion corresponding to FIG. 10C. As illustrated in FIG. 54, in the first hookup region $R_{HU1}$ and the second hookup region $R_{HU2}$ of the semiconductor storage device according to the comparative example, the through via hole of the conductive layer 110 and the insulating layer 101 is not provided at a location corresponding to the contact CC. The semiconductor storage device according to the comparative example does not include the insulating layers 103, 104, and 105.

Next, a manufacturing method of the semiconductor storage device according to the comparative example will be illustrated with reference to FIG. 55. FIG. 55 is a schematic cross-sectional view illustrating the manufacturing method of the semiconductor storage device according to the comparative example.

The manufacturing method according to the comparative example is performed in the same manner as that of the manufacturing method according to the first embodiment up to the process illustrated with reference to FIG. 22. In the manufacturing method according to the comparative example, the process illustrated with reference to FIGS. 23 to 36 is not performed. In the manufacturing method according to the comparative example, the process illustrated with reference to FIGS. 37 to 48 is performed.

Figure 55:
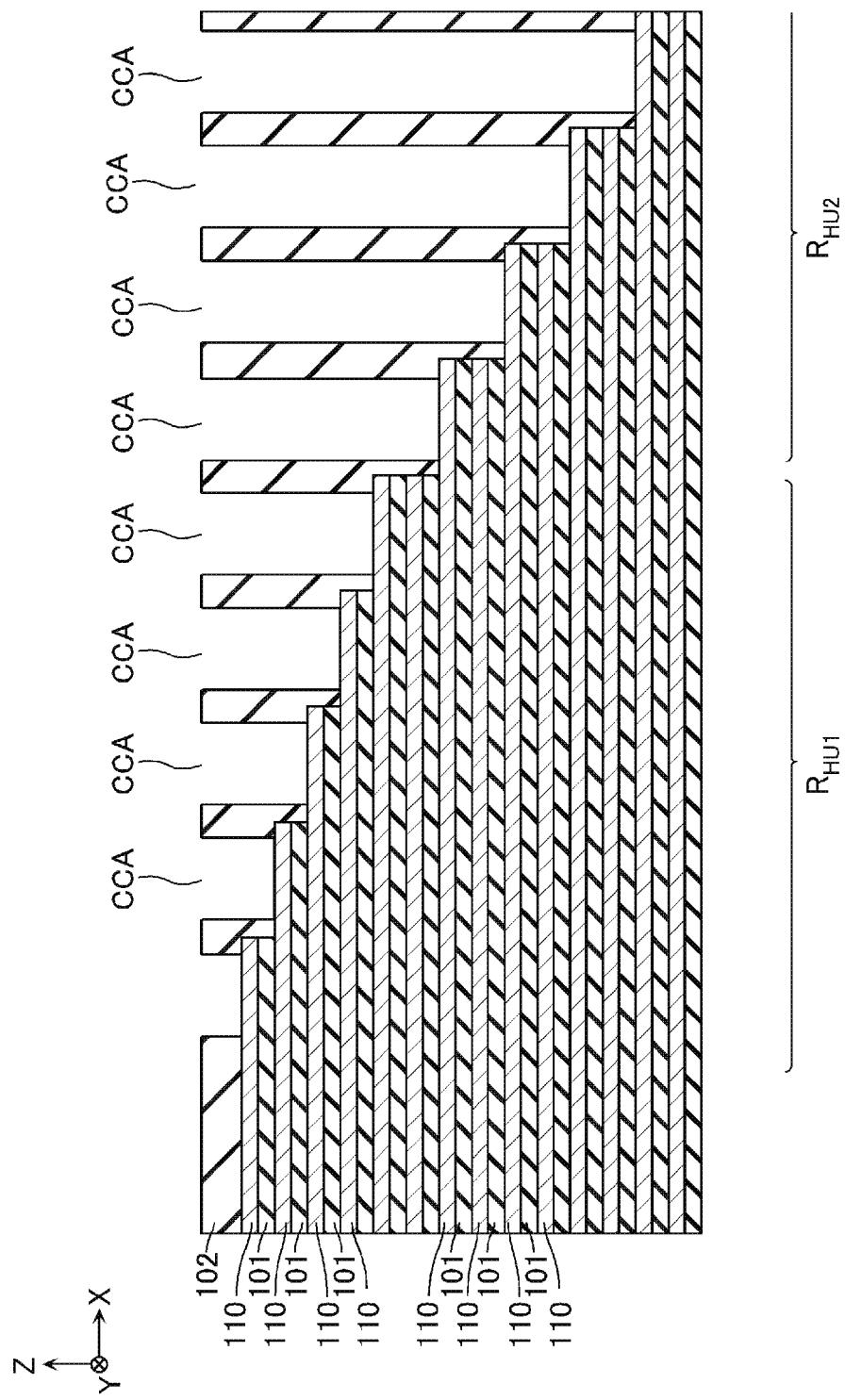
FIG. 55 is a schematic perspective view illustrating a manufacturing method of the semiconductor storage device according to the comparative example.
Figure 56:
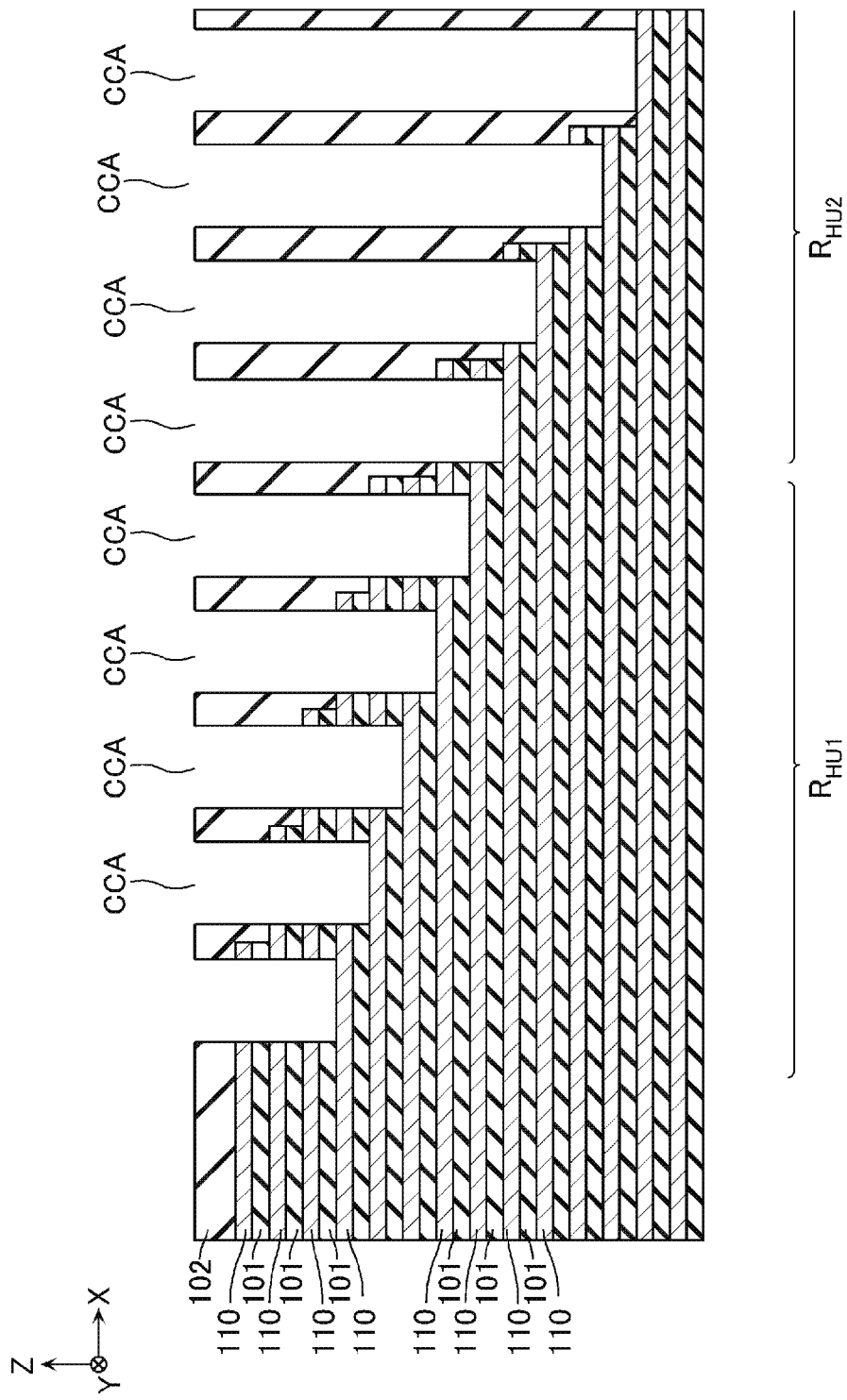
FIG. 56 is a schematic perspective view illustrating the manufacturing method of the semiconductor storage device according to the comparative example.

Next, for example, as illustrated in FIG. 55, a plurality of contact holes CCA are formed at locations corresponding to a plurality of contacts CC.

Figure 54:
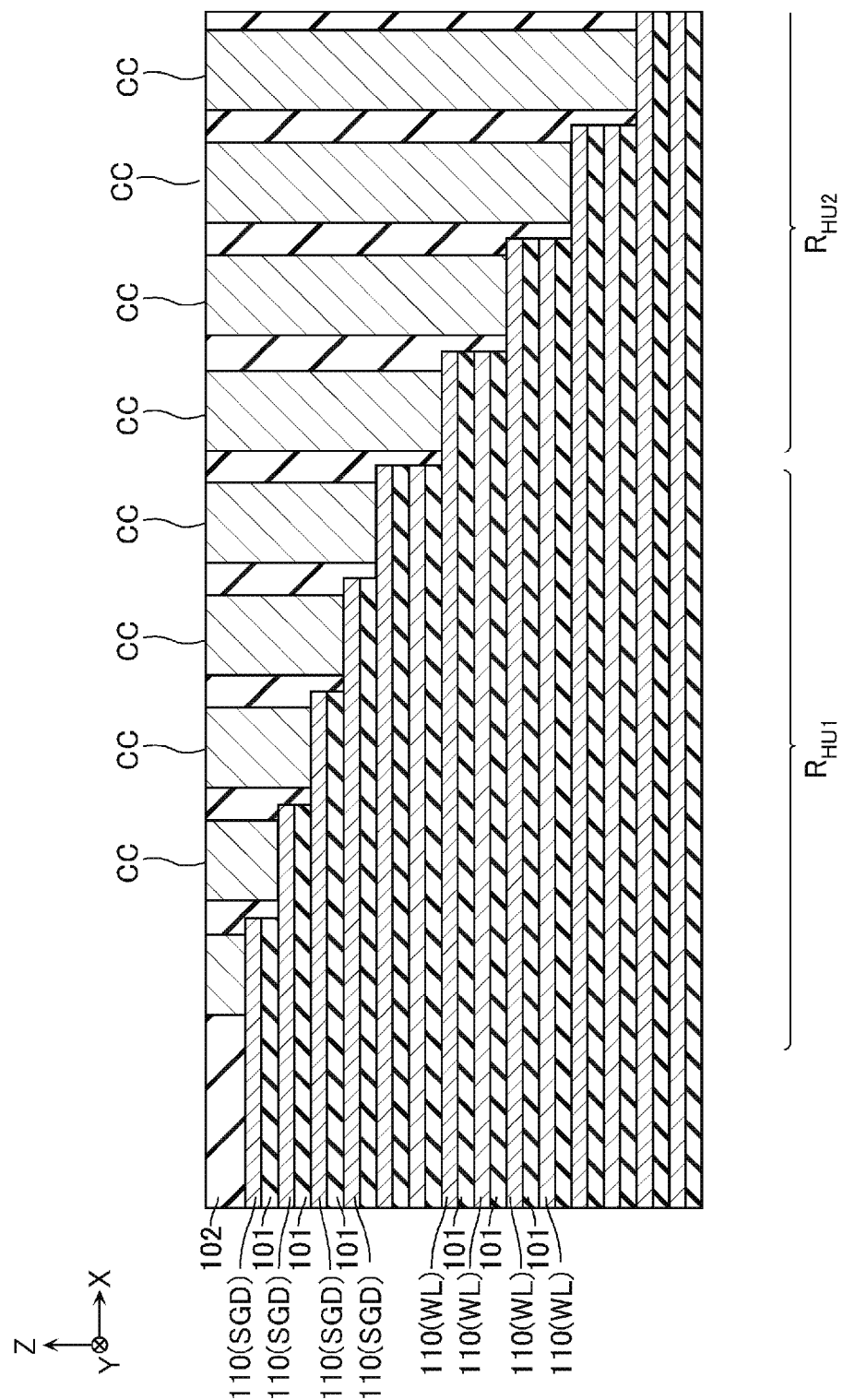
FIG. 54 is a schematic cross-sectional view illustrating a configuration of a semiconductor storage device according to a comparative example.

Next, for example, as illustrated in FIG. 54, the contact CC is formed in the contact hole CCA. For example, this process is performed by a method such as CVD and RIE.

Thereafter, a wiring is formed and a wafer is divided by dicing, thereby forming the memory die MD.

Here, in the process illustrated with reference to FIG. 55, it is required to form the plurality of contact holes CCA whose depths are different in the insulating layer 102. For example, when the formation of the contact hole CCA is started, at a relatively early stage, an upper surface of the conductive layer 110 located relatively upward is exposed to the contact hole CCA. When the formation of the contact hole CCA progresses, an upper surface of the conductive layer 110 located relatively downward is also exposed to the contact hole CCA. However, when the contact hole CCA located relatively upward is exposed to etching gas for a long time, for example, as illustrated in FIG. 56, a through via hole may be also formed in the conductive layer 110. When the contact CC is formed in the contact hole CCA in the above-described state, in some cases, the plurality of conductive layers 110 are short-circuited and thus the semiconductor storage device cannot be appropriately operated.

Effects of First Embodiment

In the manufacturing method according to the first embodiment, for example, as illustrated in FIGS. 24 and 25, it is possible to form the contact hole CCA that penetrates the plurality of sacrificial layers 110A and the plurality of insulating layers 101 arranged in the Z direction, and the insulating layer 102. As illustrated in FIGS. 26 and 27, a part of the insulating layer 102 is removed under the condition that the sacrificial layer 110A is difficult to remove, and the inner diameter of the upper portion of the contact hole CCA (the portion provided at the height location corresponding to the insulating layer 102) is selectively widened. As illustrated in FIGS. 28 to 30, the insulating film is formed under such a condition that the lower portion of the contact hole CCA is embedded and the upper portion of the contact hole CCA is embedded. According to the above-described method, it is possible to desirably manufacture the plurality of contact holes CCA having different depths.

In the manufacturing method according to the first embodiment, for example, as illustrated in FIGS. 28 to 30, the insulating layer 103 such as silicon oxide and the insulating layer 104 such as silicon nitride are formed inside the contact hole CCA. As illustrated in FIG. 32, a part of the insulating layer 104 is removed under such a condition that the upper end of the insulating layer 104 is located above the upper surface of the sacrifice layer 110A. As illustrated in FIG. 33, in this state, a part of the insulating layer 103 is removed, and as illustrated in FIG. 35, the insulating layer 105 is further embedded in the space between the sacrificial layer 110A and the insulating layer 104. According to the above-described method, it is possible not only to secure a distance between the contact CC and the conductive layer 110 provided below the conductive layer 110 to which the contact CC is connected, but also to suppress dielectric breakdown therebetween.

Other Embodiments

Hereinabove, the semiconductor storage device according to the first and second embodiments is described. However, the semiconductor storage device according to the embodiments is an example only, and a specific arrangement and an operation can be appropriately adjusted.

For example, with reference to FIGS. 9 and 10A, the memory cell array MCA according to the first embodiment includes the plurality of conductive layers 110 arranged in the Z direction; and the semiconductor layer 120 and the gate insulating film 130 provided inside the through via hole provided in the plurality of conductive layers 110, and an intersection of the conductive layer 110 and the semiconductor layer 120 functions as one memory cell MC.

When the contact CC according to the first embodiment has a structure including a plurality of conductive layers arranged in the Z direction or a plurality of semiconductor layers arranged in the Z direction, the contact CC according to the first embodiment may be used in combination with the memory cell array MCA having various structures.

Figure 57:
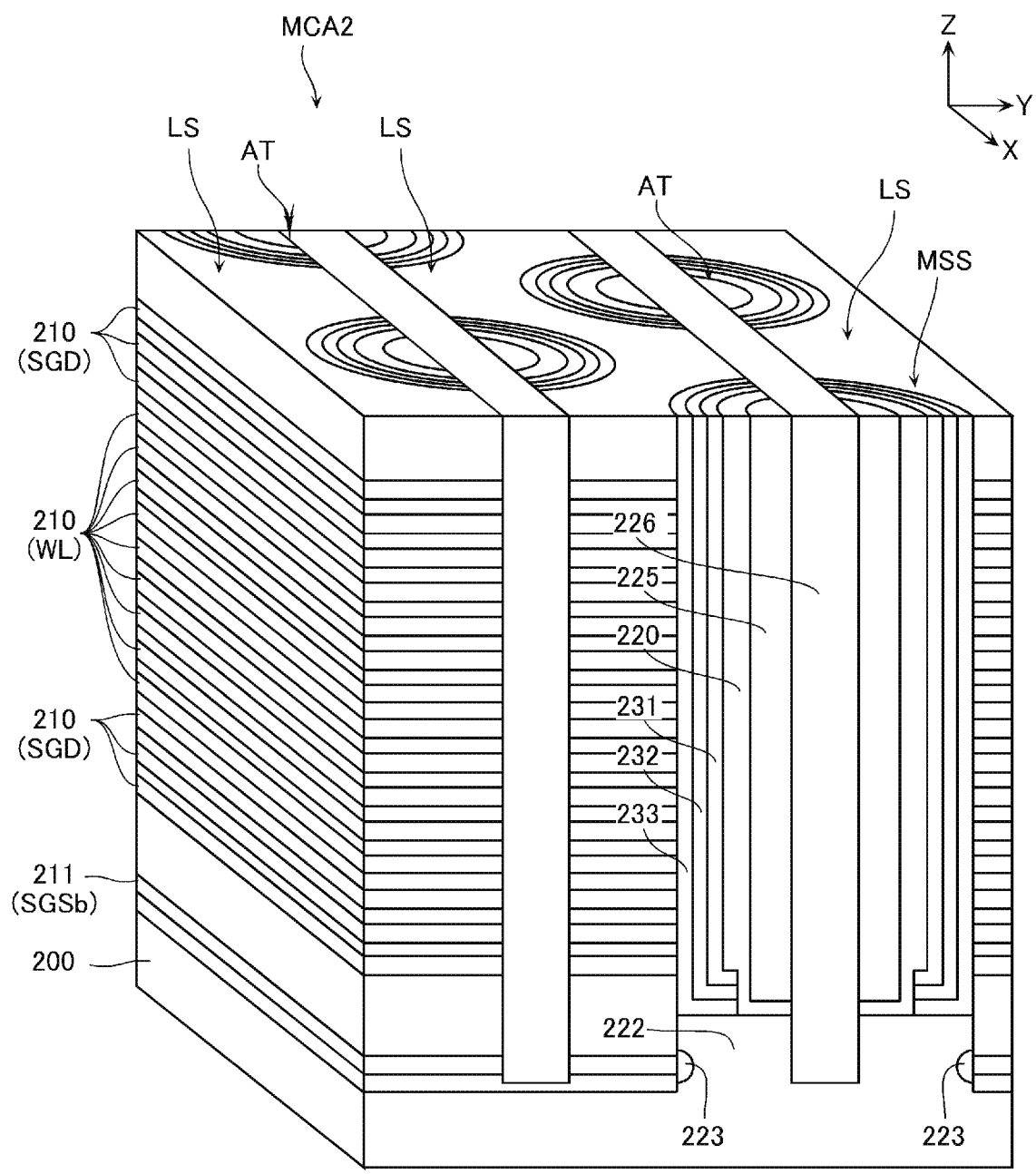
FIG. 57 is a schematic perspective view illustrating a configuration of a memory cell array MCA2 according to at least one embodiment.

For example, a memory cell array MCA2 illustrated in FIG. 57 includes a semiconductor substrate 200; a plurality of stacked structures LS arranged in the Y direction; a trench structure AT provided between the stacked structures LS; and a string structure MSS provided between the stacked structure LS and the trench structure AT. For example, the semiconductor substrate 200 may be configured almost in the same manner as that of the semiconductor substrate 100. The stacked structure LS includes a plurality of conductive layers 210 arranged in the Z direction; and a conductive layer 211 provided below the plurality of conductive layers 210. For example, the conductive layer 210 and the conductive layer 211 may be configured almost in the same manners as those of the conductive layer 110 and the conductive layer 111. For example, the trench structure AT includes an insulating layer such as silicon oxide. The string structure MSS includes a block insulating film 233, a charge storage film 232, a tunnel insulating film 231, a semiconductor layer 220, and an insulating layer 225, which are sequentially provided from the side of the stacked structure LS to the side of the trench structure AT. These configurations extend in the Z direction along the side surface of the stacked structure LS. For example, these configurations may be respectively configured almost in the same manners as those of the block insulating film 133, the charge storage film 132, the tunnel insulating film 131, the semiconductor layer 120, and the insulating layer 125. A semiconductor layer 222 and an insulating layer 223 are provided below the semiconductor layer 220. For example, these configurations may be respectively configured almost in the same manner as those of the semiconductor layer 122 and the insulating layer 123. For example, the contact CC according to the first embodiment may also be used as a contact connected to the conductive layer 210 of the memory cell array MCA2.

Figure 58:
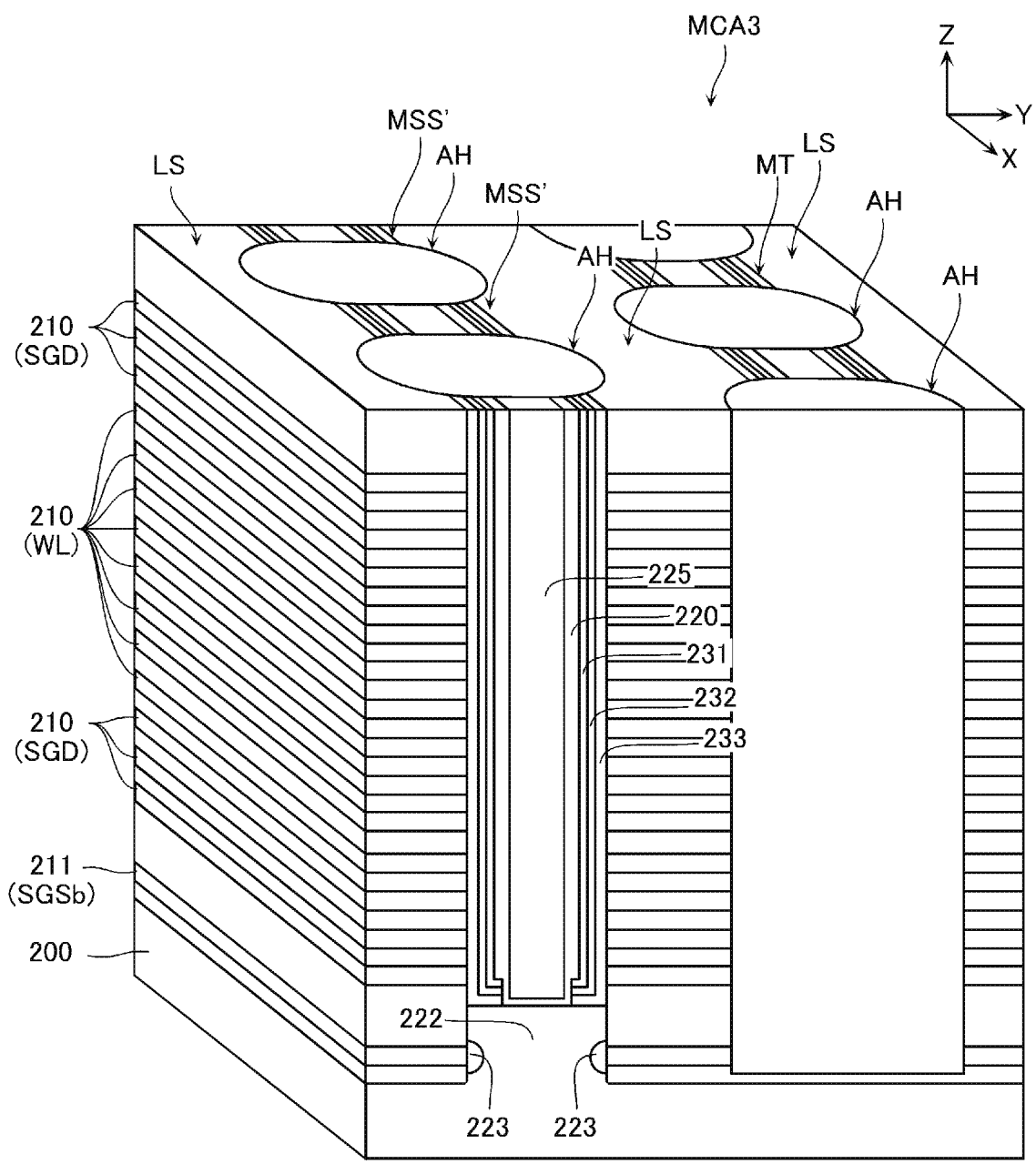
FIG. 58 is a schematic perspective view illustrating a configuration of a memory cell array MCA3 according to at least one embodiment.

For example, a memory cell array MCA3 illustrated in FIG. 58 includes the semiconductor substrate 200; a plurality of stacked structures LS arranged in the Y direction; and a trench structure MT provided between the stacked structures LS. The trench structure MT includes a plurality of string structures MSS' arranged in the X direction; and a hole structure AH provided between the string structures MSS'. The string structure MSS' includes the block insulating film 233, the charge storage film 232, the tunnel insulating film 231, the semiconductor layer 220, and the insulating layer 225, which are sequentially provided from the side of the stacked structure LS. These configurations extend in the Z direction along the side surface of the stacked structure LS. The semiconductor layer 222 and the insulating layer 223 are provided below the semiconductor layer 220. For example, the contact CC according to the first embodiment may also be used as a contact connected to the conductive layer 210 of the memory cell array MCA3.

Figure 59:
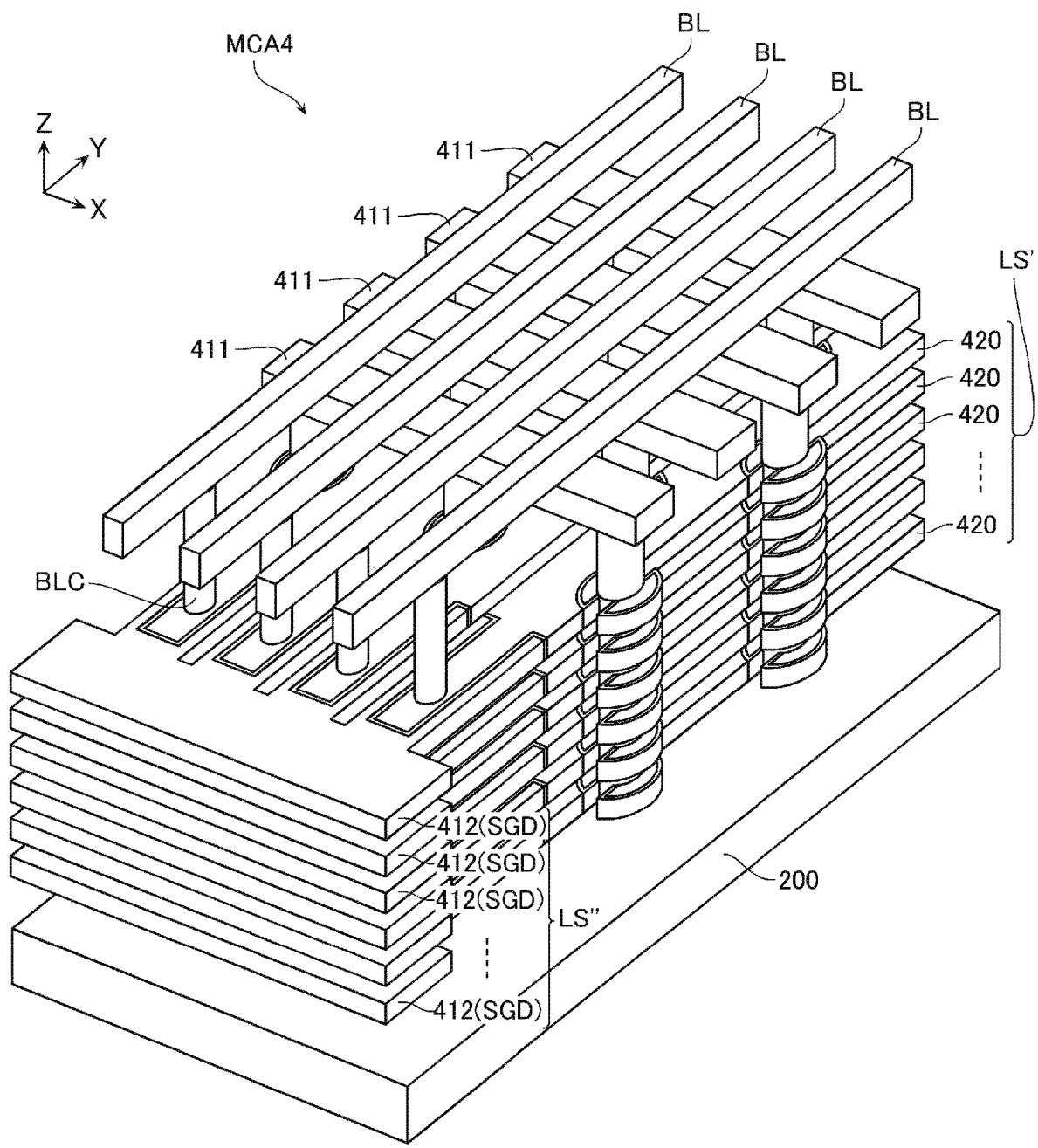
FIG. 59 is a schematic perspective view illustrating a configuration of a memory cell array MCA4 according to at least one embodiment.
Figure 60:
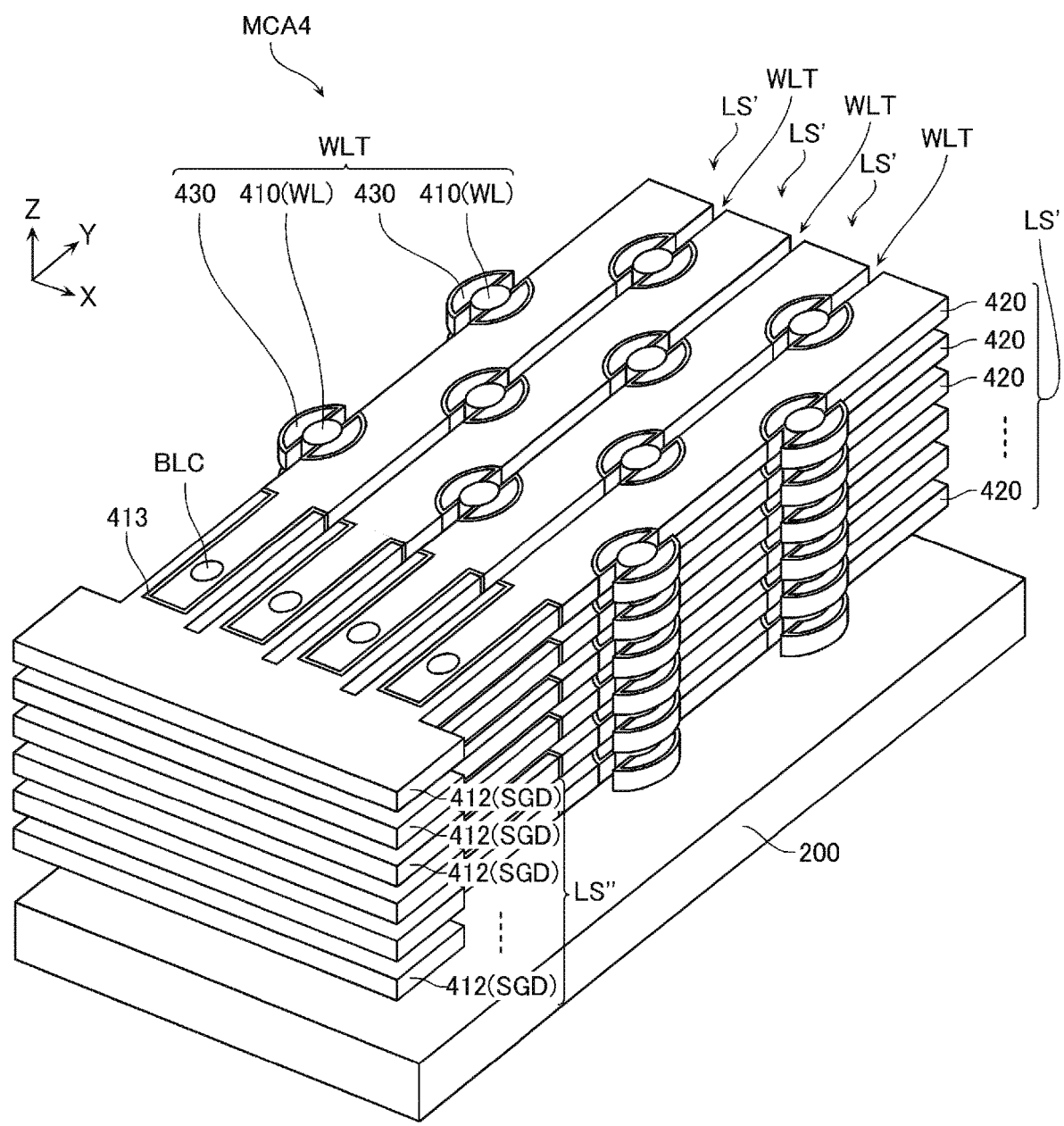
FIG. 60 is a schematic perspective view illustrating the configuration of the memory cell array MCA4 according to at least one embodiment.

For example, a memory cell array MCA4 illustrated in FIGS. 59 and 60 includes the semiconductor substrate 200; a plurality of stacked structures LS' arranged in the X direction; a trench structure WLT provided between the stacked structures LS'; and a stacked structure LS" connected to end portions in the Y direction of the plurality of stacked structures LS' arranged in the X direction.

The stacked structure LS' includes a plurality of semiconductor layers 420 arranged in the Z direction. For example, the semiconductor layer 420 includes polycrystalline silicon, and functions as a channel region of the memory cell MC. One end in the Y direction of the semiconductor layer 420 is connected to the bit line BL via a bit line contact BLC. Although not illustrated, the other end in the Y direction of the semiconductor layer 420 is connected to a source line via a source line contact.

The trench structure WLT includes a plurality of conductive layers 410 arranged in the Y direction; and a gate insulating film 430 provided between the conductive layer 410 and the semiconductor layer 420. For example, the conductive layer 410 includes a stacked film of a barrier conductive film such as titanium nitride (TiN) and a metal film such as tungsten (W), and functions as the word line WL. The plurality of conductive layers 410 arranged in the X direction are connected to each other via a conductive layer 411 extending in the X direction. For example, the gate insulating film 430 may include a tunnel insulating film such as silicon oxide, a charge storage film such as silicon nitride, and a block insulating film such as silicon oxide, which are sequentially provided from the side of the semiconductor layer 420. For example, the gate insulating film 430 may include a floating gate such as polycrystalline silicon instead of the charge storage film. For example, the gate insulating film 430 may include a ferroelectric material such as hafnium oxide (HfO).

The stacked structure LS" includes a plurality of conductive layers 412 arranged in the Z direction. For example, the conductive layer 412 includes a stacked film of a barrier conductive film such as titanium nitride (TiN) and a metal film such as tungsten (W), and functions as the select gate line (SGD and SGS). The conductive layer 412 is opposite to one end in the Y direction of a semiconductor layer 423 via an insulating layer 413 such as silicon oxide.

For example, the contact CC according to the first embodiment may also be used as a contact connected to the semiconductor layer 420 or the conductive layer 412 of the memory cell array MCA4.

Others

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
a substrate having a surface;
a plurality of conductive layers arranged in a first direction, the first direction intersecting the surface of the substrate;
a plurality of memory cells connected to the plurality of conductive layers;
a contact electrode extending in the first direction and connected to one of the plurality of conductive layers;
an insulator extending in the first direction, the insulator connected to an end portion of the contact electrode on one side of the contact electrode in the first direction, and the insulator connected to the plurality of conductive layers;
a plurality of interlayer insulating films disposed between the plurality of conductive layers arranged in the first direction, wherein
the plurality of conductive layers include a second conductive layer and a third conductive layer adjacent to each other in the first direction,
the plurality of interlayer insulating films include a first interlayer insulating film disposed between the second conductive layer and the third conductive layer,
an insulating structure including a first insulating layer, the first insulating layer extending in the first direction and connected to the plurality of conductive layers and the plurality of interlayer insulating films, and
wherein the first insulating layer includes:
a first portion disposed at a location corresponding to the second conductive layer in the first direction, the first portion connected to the second conductive layer;
a second portion disposed at a location corresponding to the third conductive layer in the first direction, the second portion connected to the third conductive layer; and a third portion disposed at a location corresponding to the first interlayer insulating film in the first direction, the third portion connected to the first interlayer insulating film,
wherein an outer diameter of the third portion is larger than outer diameters of the first and second portions.

2. The semiconductor storage device according to claim 1, wherein
the insulating structure includes a second insulating layer extending in the first direction, the second insulating layer connected to the end portion of the contact electrode in the first direction, and
the first insulating layer is disposed between the second insulating layer and the plurality of conductive layers.

3. The semiconductor storage device according to claim 2, wherein
the insulating structure includes a third insulating layer connected to the contact electrode, the first insulating layer, and the second insulating layer.

4. The semiconductor storage device according to claim 2, wherein the second insulating layer includes silicon nitride and the first insulating layer includes silicon dioxide.

5. The semiconductor storage device according to claim 3, further comprising a through via hole extending in the first direction and penetrating the plurality of conductive layers and the plurality of interlayer insulating films.

6. The semiconductor storage device according to claim 5, wherein the first insulating layer is formed on an inner peripheral surface of the through via hole.

7. The semiconductor storage device according to claim 5, wherein an outer peripheral surface of the third insulating layer is connected to an inner peripheral surface of the through via hole.

8. The semiconductor storage device according to claim 6, wherein the second insulating layer is formed on an inner peripheral surface of the first insulating layer.

9. The semiconductor storage device according to claim 8, wherein the third insulating layer is formed on an upper surface of the first insulating layer.

10. The semiconductor storage device according to claim 1, further comprising a through via hole extending in the first direction and penetrating the plurality of conductive layers and the plurality of interlayer insulating films.

11. The semiconductor storage device according to claim 10, wherein an inner diameter of a first portion of the through via hole disposed in the conductive layers is smaller than an inner diameter of a second portion of the through via hole disposed in the interlayer insulating films.

12. The semiconductor storage device according to claim 10, wherein the shape of the first insulating layer is approximately cylindrical.

13. The semiconductor storage device according to claim 10, wherein the first insulating layer includes silicon dioxide.

14. A semiconductor storage device, comprising:
a substrate having a surface;
a plurality of conductive layers arranged in a first direction, the first direction intersecting the surface of the substrate;
a plurality of memory cells connected to the plurality of conductive layers;
a contact electrode extending in the first direction and connected to one of the plurality of conductive layers;
an insulator extending in the first direction, the insulator connected to an end portion of the contact electrode on one side of the contact electrode in the first direction, and the insulator connected to the plurality of conductive layers;

a plurality of interlayer insulating films disposed between the plurality of conductive layers arranged in the first direction, wherein the plurality of conductive layers include a second conductive layer and a third conductive layer adjacent to each other in the first direction, the plurality of interlayer insulating films include a first interlayer insulating film disposed between the second conductive layer and the third conductive layer, an insulating structure including a first insulating layer, the first insulating layer extending in the first direction and connected to the plurality of conductive layers and the plurality of interlayer insulating films, and wherein the first insulating layer includes:

a first portion disposed at a location corresponding to the second conductive layer in the first direction, the first portion connected to the second conductive layer;

a second portion disposed at a location corresponding to the third conductive layer in the first direction, the second portion connected to the third conductive layer;

a third portion disposed at a location corresponding to the first interlayer insulating film in the first direction, the third portion connected to the first interlayer insulating film;

a through via hole extending in the first direction and penetrating the plurality of conductive layers and the plurality of interlayer insulating films, wherein an inner diameter of a first portion of the through via hole disposed in the conductive layers is smaller than an inner diameter of a second portion of the through via hole disposed in the interlayer insulating films.

* * * * *